US012677415B2

(12) United States Patent
Yeom et al.

(10) Patent No.: US 12,677,415 B2
(45) Date of Patent: Jul. 7, 2026

(54) SEMICONDUCTOR MEMORY DEVICE

(71) Applicant: SK hynix Inc., Icheon-si (KR)

(72) Inventors: Hyo Sub Yeom, Icheon-si (KR); Seung Ju Oh, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 967 days.

(21) Appl. No.: 17/552,898

(22) Filed: Dec. 16, 2021

(65) Prior Publication Data

US 2023/0021440 A1    Jan. 26, 2023

(30) Foreign Application Priority Data

Jul. 26, 2021    (KR) ........................ 10-2021-0097873

(51) Int. Cl.
| | |
|---|---|
| *H10B 43/27* | (2023.01) |
| *H10B 41/00* | (2023.01) |
| *H10B 41/10* | (2023.01) |
| *H10B 41/27* | (2023.01) |
| *H10B 41/40* | (2023.01) |
| *H10B 43/00* | (2023.01) |
| *H10B 43/10* | (2023.01) |
| *H10B 43/40* | (2023.01) |

(52) U.S. Cl.
CPC ............. *H10B 43/27* (2023.02); *H10B 41/10* (2023.02); *H10B 41/27* (2023.02); *H10B 41/40* (2023.02); *H10B 43/10* (2023.02); *H10B 43/40* (2023.02); *H10B 41/00* (2023.02); *H10B 43/00* (2023.02)

(58) Field of Classification Search
CPC ........ H10B 43/00–50; H10B 41/00–70; G11C 29/42
See application file for complete search history.

(56) References Cited

U.S. PATENT DOCUMENTS

| | | | | |
|---|---|---|---|---|
| 2013/0153978 A1* | 6/2013 | Lee | ................... | H01L 29/66833 |
| | | | | 257/314 |
| 2014/0054671 A1* | 2/2014 | Kim | ....................... | H10B 43/27 |
| | | | | 438/591 |
| 2014/0291848 A1* | 10/2014 | Lee | ....................... | H01L 23/528 |
| | | | | 257/751 |
| 2015/0145015 A1* | 5/2015 | Shin | ....................... | H10B 43/40 |
| | | | | 257/314 |
| 2015/0162342 A1* | 6/2015 | Lee | ....................... | H10B 43/40 |
| | | | | 438/269 |
| 2016/0260716 A1* | 9/2016 | Lee | ....................... | H10B 41/10 |
| 2017/0025438 A1* | 1/2017 | Lee | ................... | H01L 29/78642 |
| 2017/0179154 A1* | 6/2017 | Furihata | ................. | H10B 41/41 |
| 2017/0309638 A1* | 10/2017 | Nagumo | ............. | H01L 29/4234 |

(Continued)

FOREIGN PATENT DOCUMENTS

KR        1020210002773 A        1/2021

*Primary Examiner* — Chad M Dicke
*Assistant Examiner* — Mario Andres Autore, Jr.
(74) *Attorney, Agent, or Firm* — WILLIAM PARK AND ASSOCIATES LTD.

(57) ABSTRACT

There is provided a semiconductor memory device. The semiconductor memory device includes a metal pattern including a first line part extending in a first direction and a second line part which is connected to the first line part and extends in a second direction to intersect with the first line part, and a source structure which has a trench. The metal pattern is formed in the trench and the source structure is in contact with a sidewall of the metal pattern.

20 Claims, 52 Drawing Sheets

(56) References Cited

U.S. PATENT DOCUMENTS

| | | | | |
|---|---|---|---|---|
| 2018/0358376 A1* | 12/2018 | Hwang | .................. | H10B 43/40 |
| 2019/0326320 A1* | 10/2019 | Choi | .................... | H01L 29/4234 |
| 2019/0333931 A1* | 10/2019 | Jung | ..................... | H10B 41/41 |
| 2020/0168622 A1* | 5/2020 | Fukuzumi | ......... | H01L 21/76802 |
| 2020/0203370 A1* | 6/2020 | Son | ........................ | H10B 51/20 |
| 2020/0342942 A1* | 10/2020 | Joe | ......................... | H10B 41/27 |
| 2020/0350330 A1* | 11/2020 | Ahn | ....................... | H10B 41/27 |
| 2020/0411542 A1* | 12/2020 | Yang | ..................... | H10B 41/50 |
| 2021/0134821 A1* | 5/2021 | Choi | ...................... | H10B 43/50 |
| 2022/0077182 A1* | 3/2022 | Lee | ........................ | H10B 41/27 |
| 2022/0310808 A1* | 9/2022 | Kajino | ............. | H01L 29/42344 |
| 2022/0367506 A1* | 11/2022 | Yeom | .................... | H10B 43/40 |

* cited by examiner

SEMICONDUCTOR MEMORY DEVICE

CROSS-REFERENCE TO RELATED APPLICATION

The present application claims priority under 35 U.S.C. § 119(a) to Korean patent application number 10-2021-0097873 filed on Jul. 26, 2021, in the Korean Intellectual Property Office, the entire disclosure of which is incorporated by reference herein.

BACKGROUND

1. Technical Field

The present disclosure generally relates to a semiconductor memory device and a manufacturing method of the semiconductor memory device, and more particularly, to a three-dimensional semiconductor memory device and a manufacturing method of the three-dimensional semiconductor memory device.

2. Related Art

In order to improve the degree of integration of semiconductor memory devices, a three-dimensional semiconductor memory device including a plurality of three-dimensionally arranged memory cells has been proposed.

In order to improve the degree of integration of the three-dimensional semiconductor memory device, a stacked number of memory cells that are stacked above a substrate may be increased. The reliability of a manufacturing process may be deteriorated as the stacked number of memory cells is increased.

SUMMARY

In accordance with an embodiment of the present disclosure, there is provided a semiconductor memory device including: a semiconductor substrate; a source structure on the semiconductor substrate; a memory cell array disposed on the source structure; and a metal pattern connected to the source structure, wherein the metal pattern includes: a plurality of first line parts buried in the source structure, the plurality of first line parts extending parallel to each other in a first direction; and a second line part extending in a second direction to intersect with the plurality of first line parts, the second line part connecting the plurality of first line parts to each other.

In accordance with an embodiment of the present disclosure, there is provided a semiconductor memory device including: a metal pattern including a first line part that extends in a first direction and a second line part that is connected to the first line part, the second line part extending in a second direction that intersects with the first line part; a source structure with a trench in which the metal pattern is formed, the source structure being in contact with a sidewall of the metal pattern; a slit defined in the first line part of the metal pattern, the slit extending in the first direction and the slit being spaced apart from the second line part of the metal pattern; a plurality of conductive patterns stacked to be spaced apart from each other on the source structure at both sides of the slit; a channel layer penetrating the plurality of conductive patterns, the channel layer being in contact with the source structure; and a memory pattern between each of the conductive patterns and the channel layer.

In accordance with an embodiment of the present disclosure, there is provided a method of manufacturing a semiconductor memory device, the method including: forming a source stack structure on a semiconductor substrate; forming a metal pattern in the source stack structure, the metal pattern including a first line part and a second line part that intersect each other; forming a preliminary gate stack structure that covers the first line part of the metal pattern, the preliminary gate stack structure exposing the second line part of the metal pattern; and forming a slit that penetrates the preliminary gate stack structure and the first line part.

BRIEF DESCRIPTION OF THE DRAWINGS

Example embodiments will now be described more fully hereinafter with reference to the accompanying drawings; however, they may be embodied in different forms and should not be construed as being limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it may be the only element between the two elements, or addition intervening elements may also be present. Like reference numerals refer to like elements throughout the drawings.

Figure 2A:
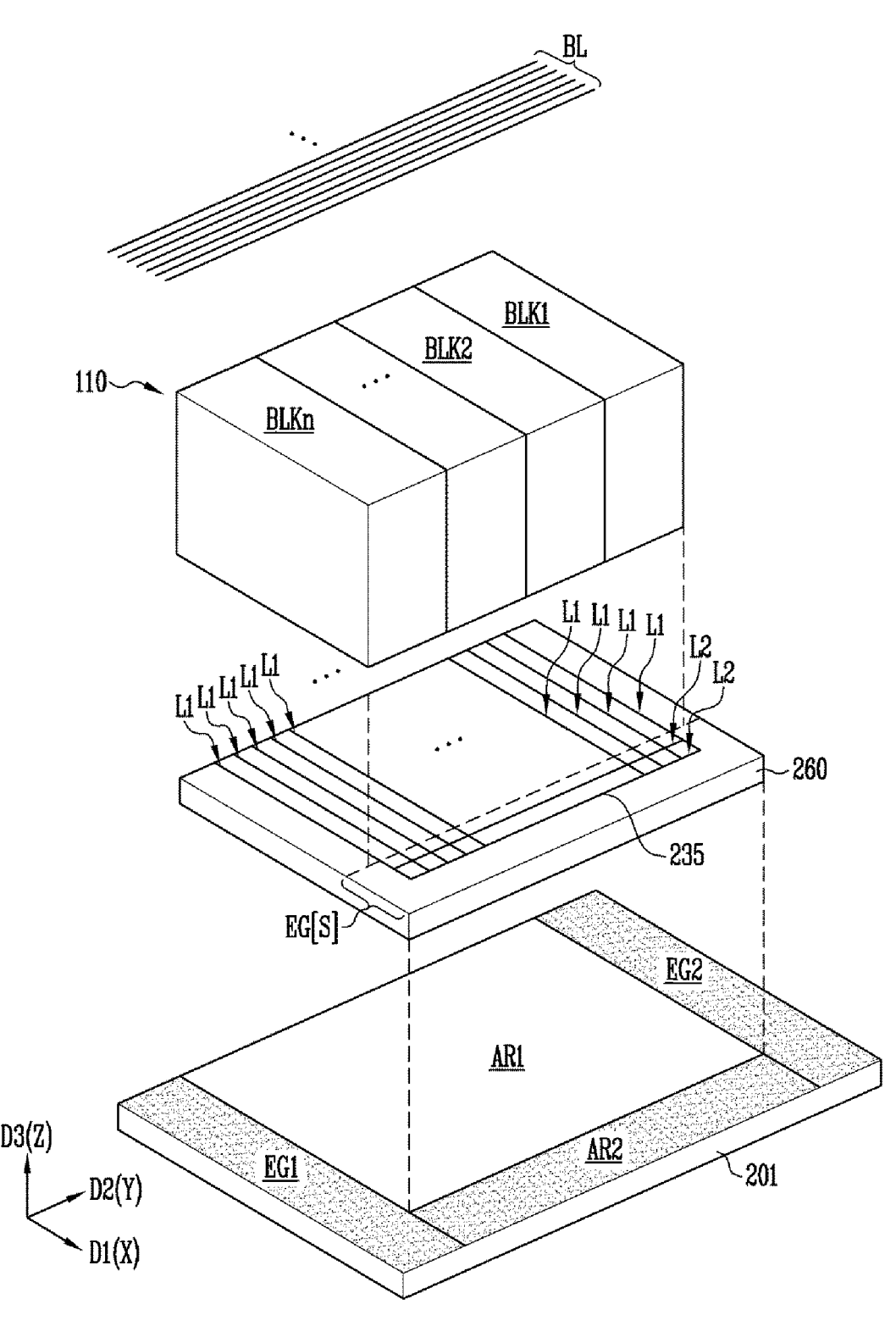
Figure 2B:
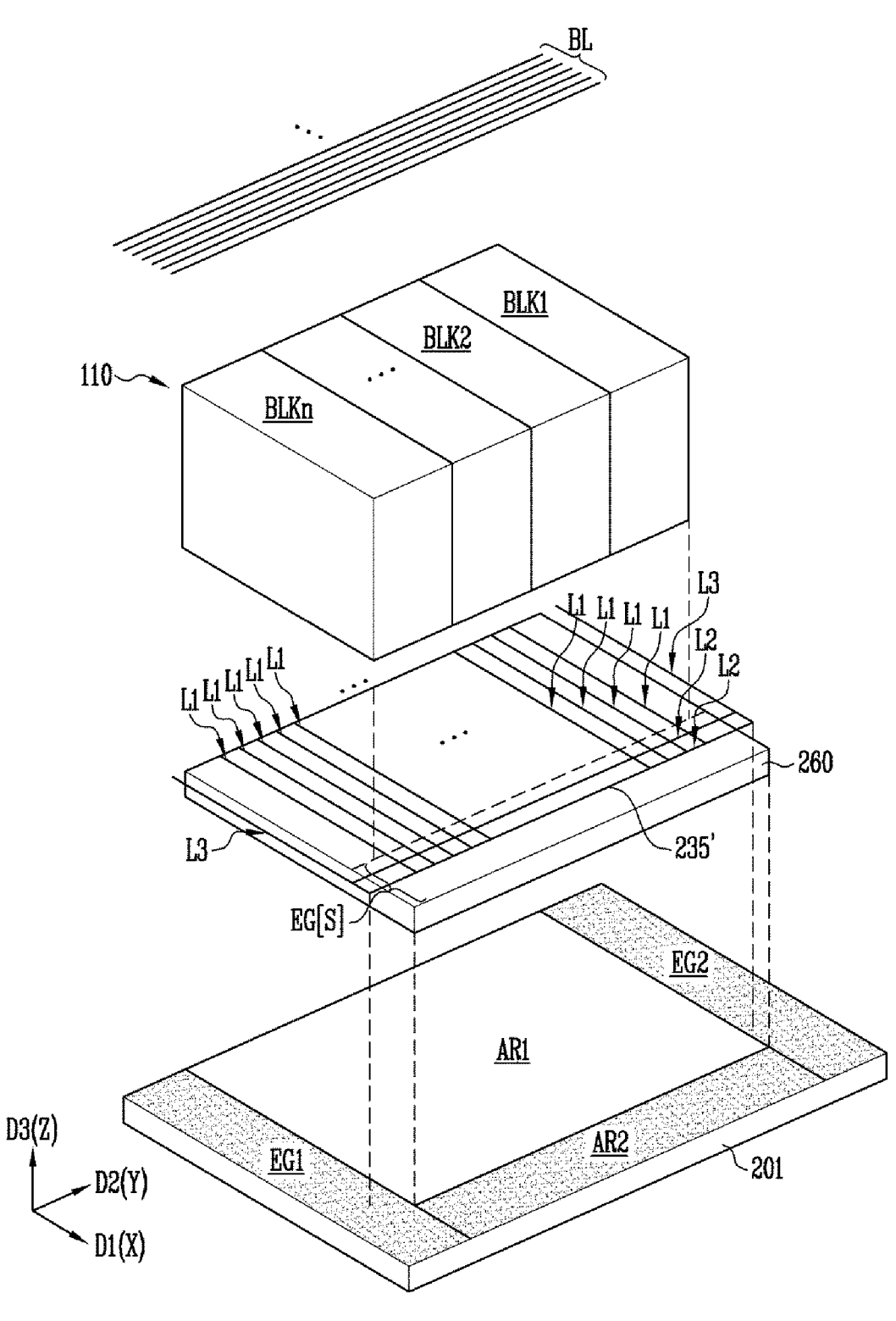

Each of FIGS. 2A and 2B illustrates a schematic vertical arrangement of a semiconductor memory device in accordance with an embodiment of the present disclosure.

Figure 3:
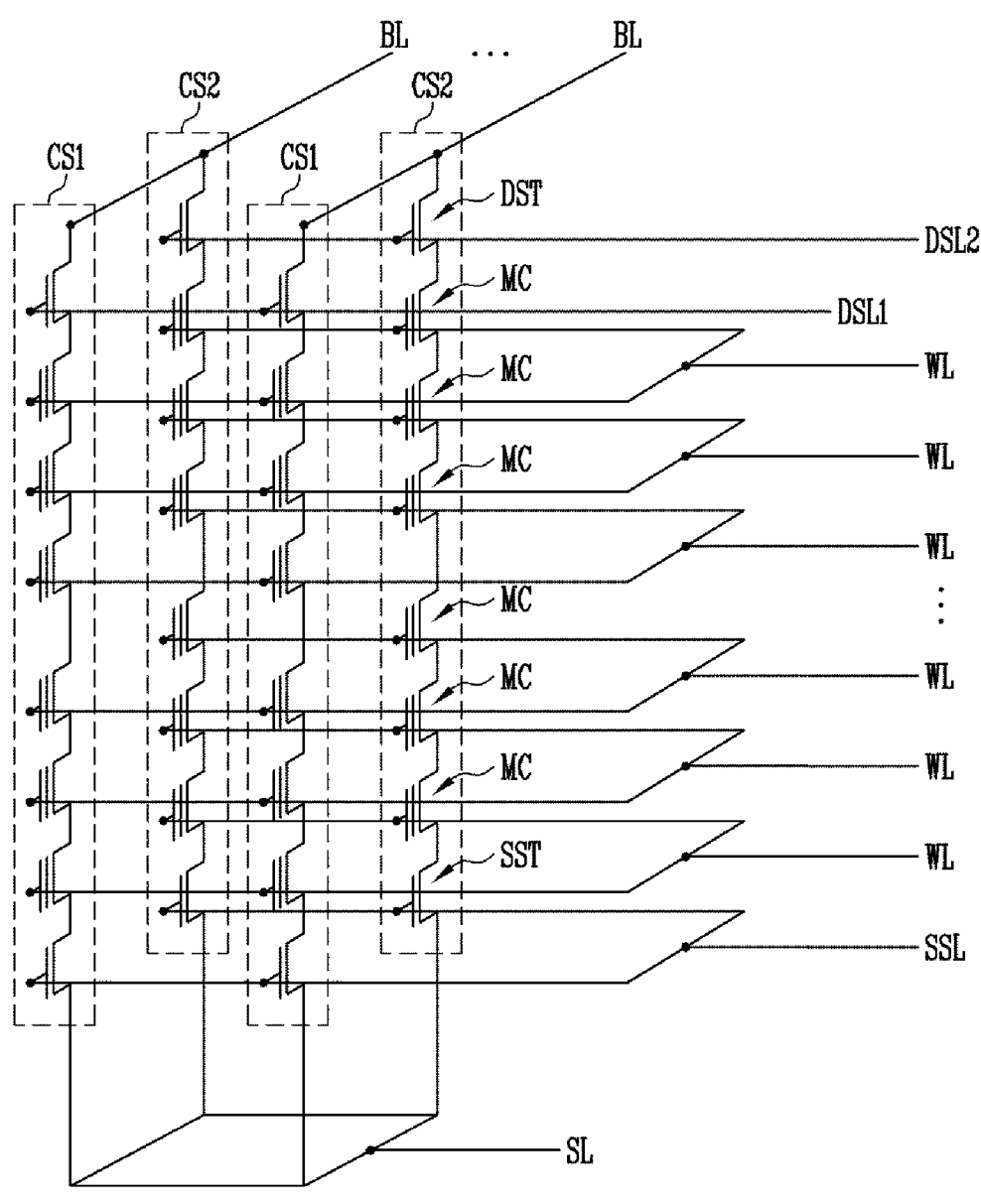

FIG. 3 is a circuit diagram of a memory cell array in accordance with an embodiment of the present disclosure.

Figure 4A:
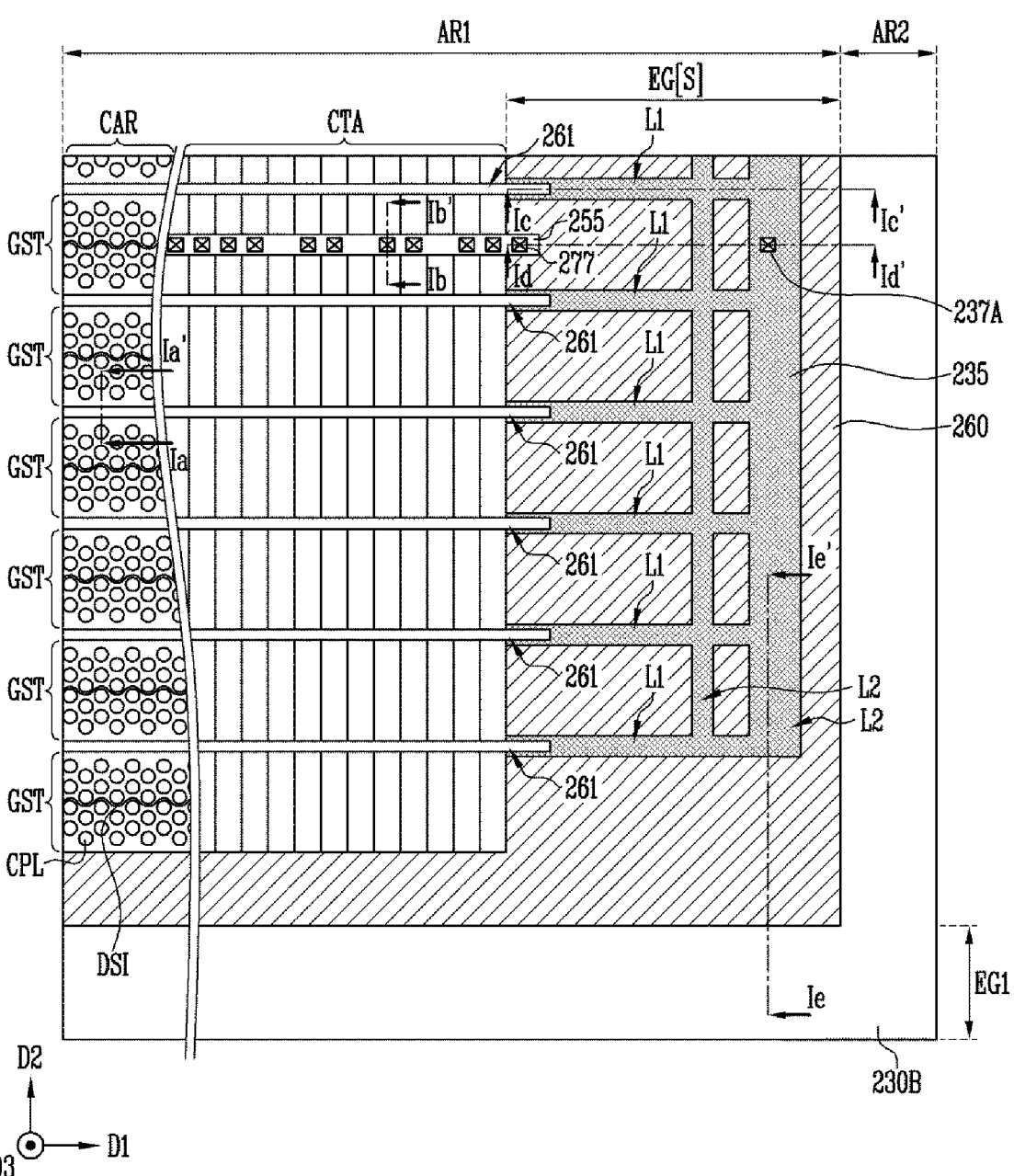
Figure 4B:
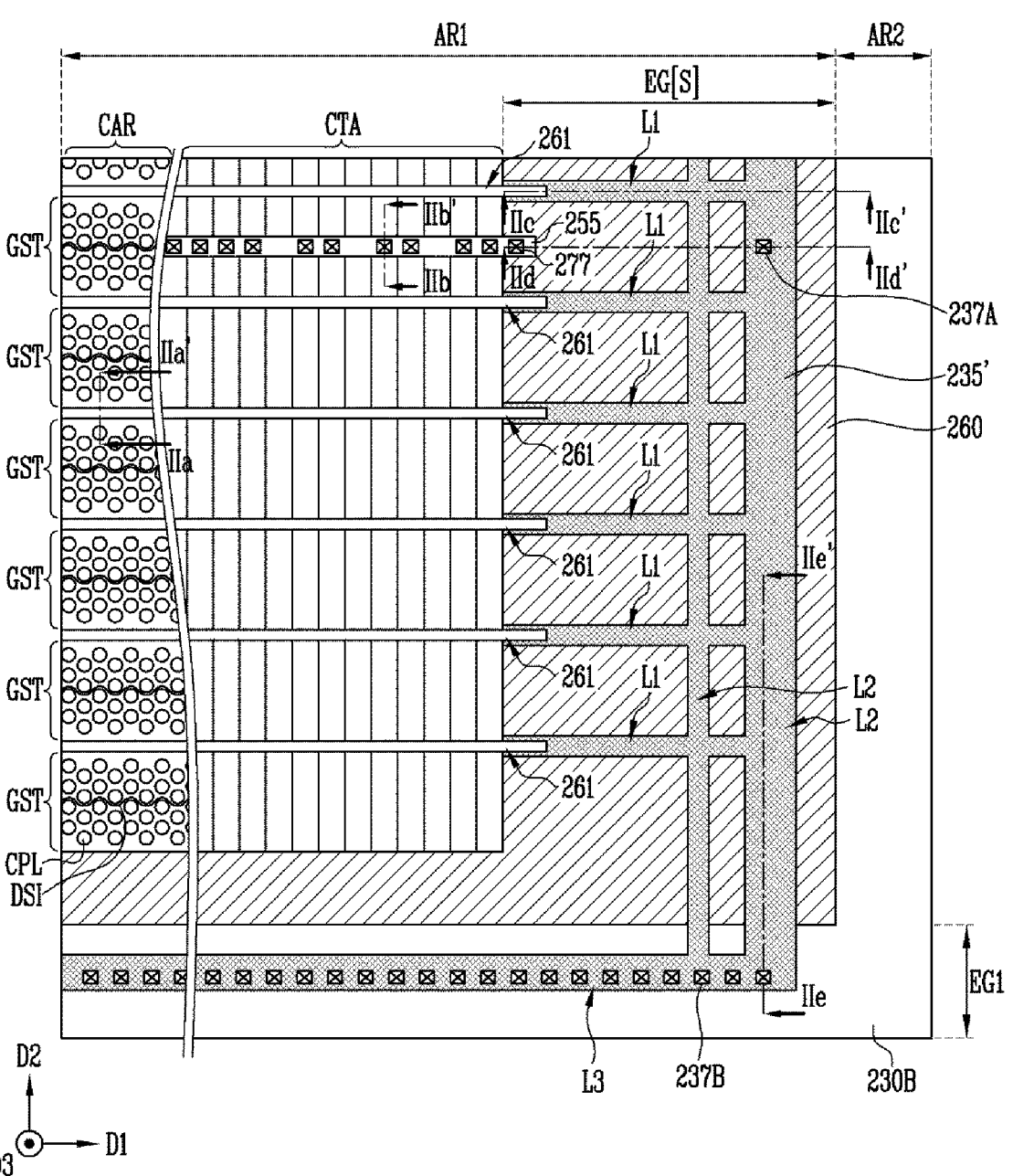

Each of FIGS. 4A and 4B is a plan view of a partial configuration of a semiconductor memory device in accordance with an embodiment of the present disclosure.

FIGS. 5A, 5B, 5C, 5D, and 5E are sectional views of the semiconductor memory device shown in FIG. 4A.

Figure 6:
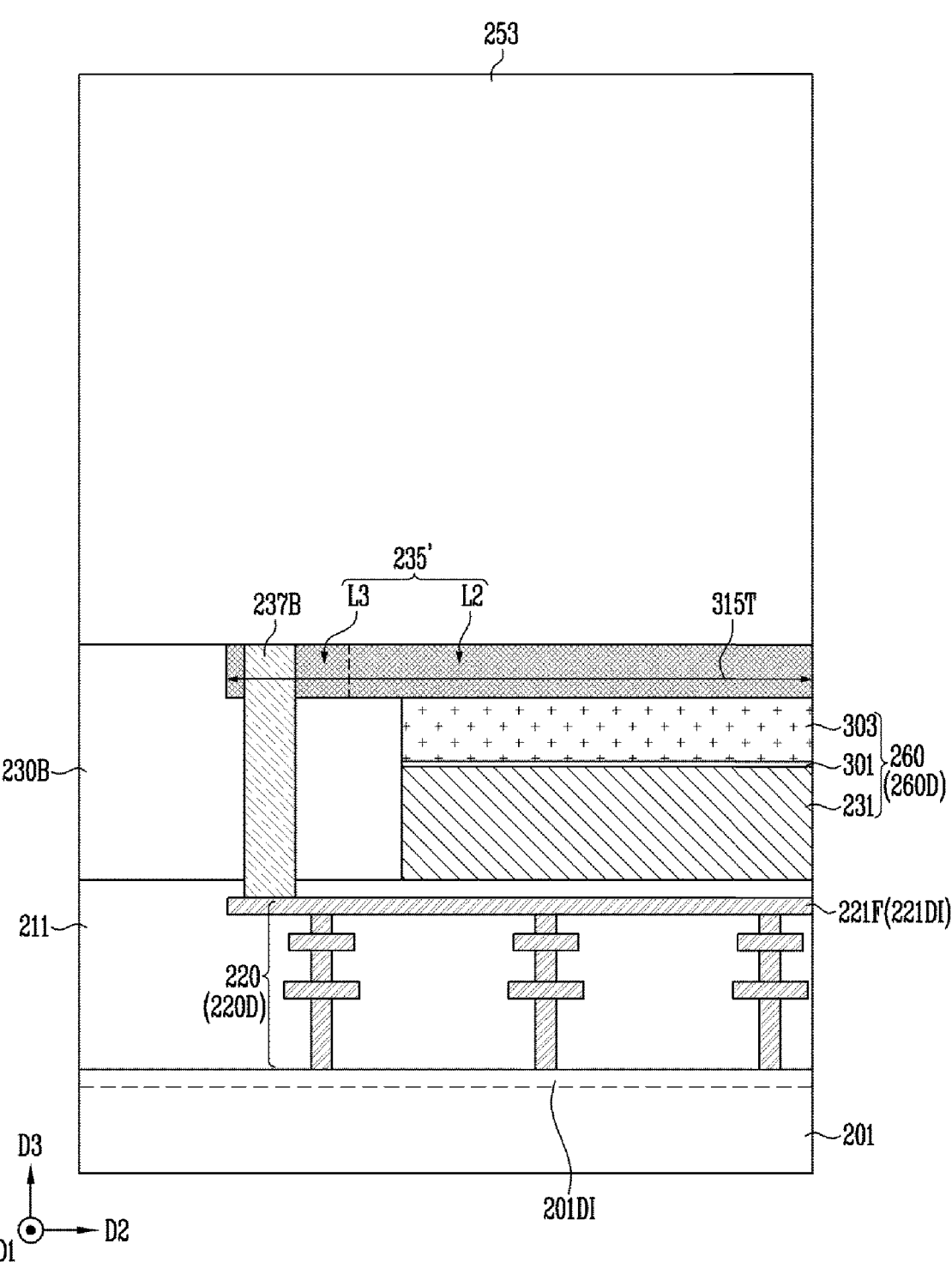
Figure 7A:
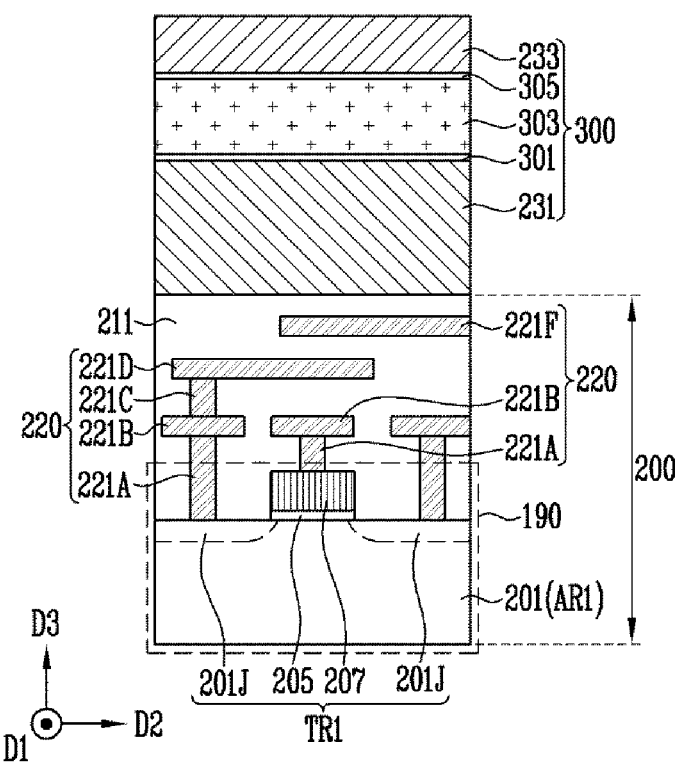
Figure 7B:
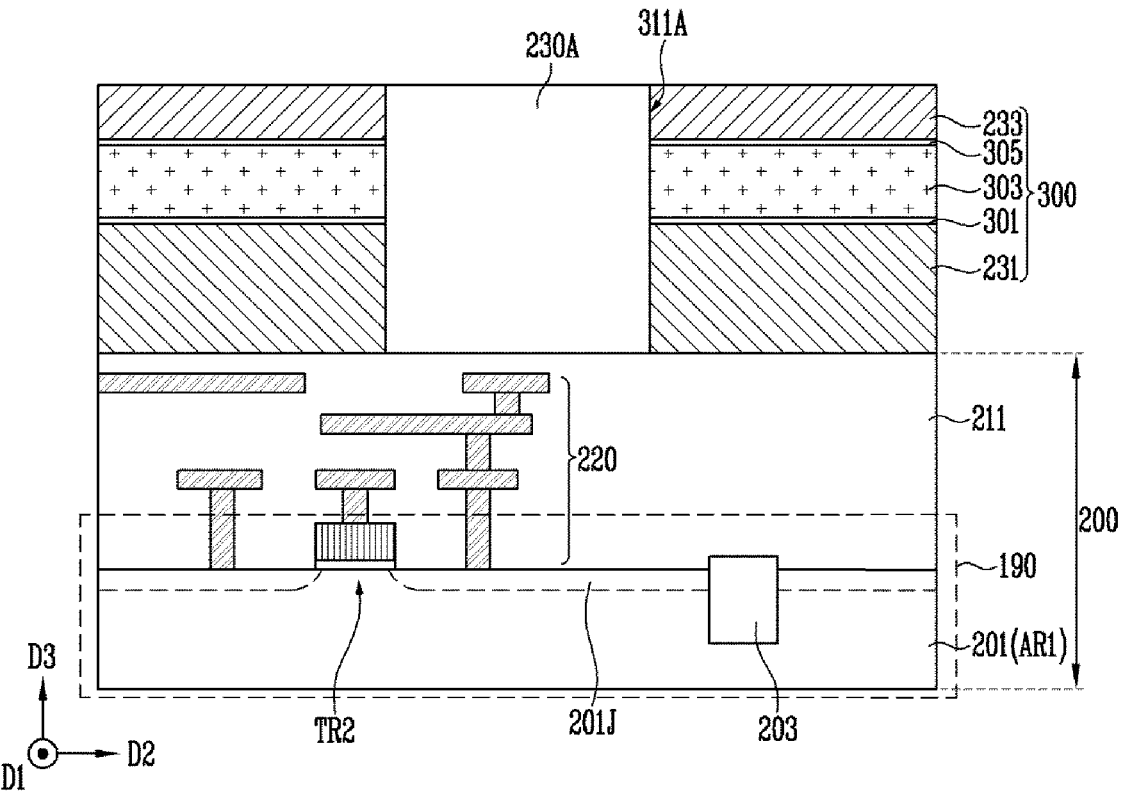
Figure 7C:
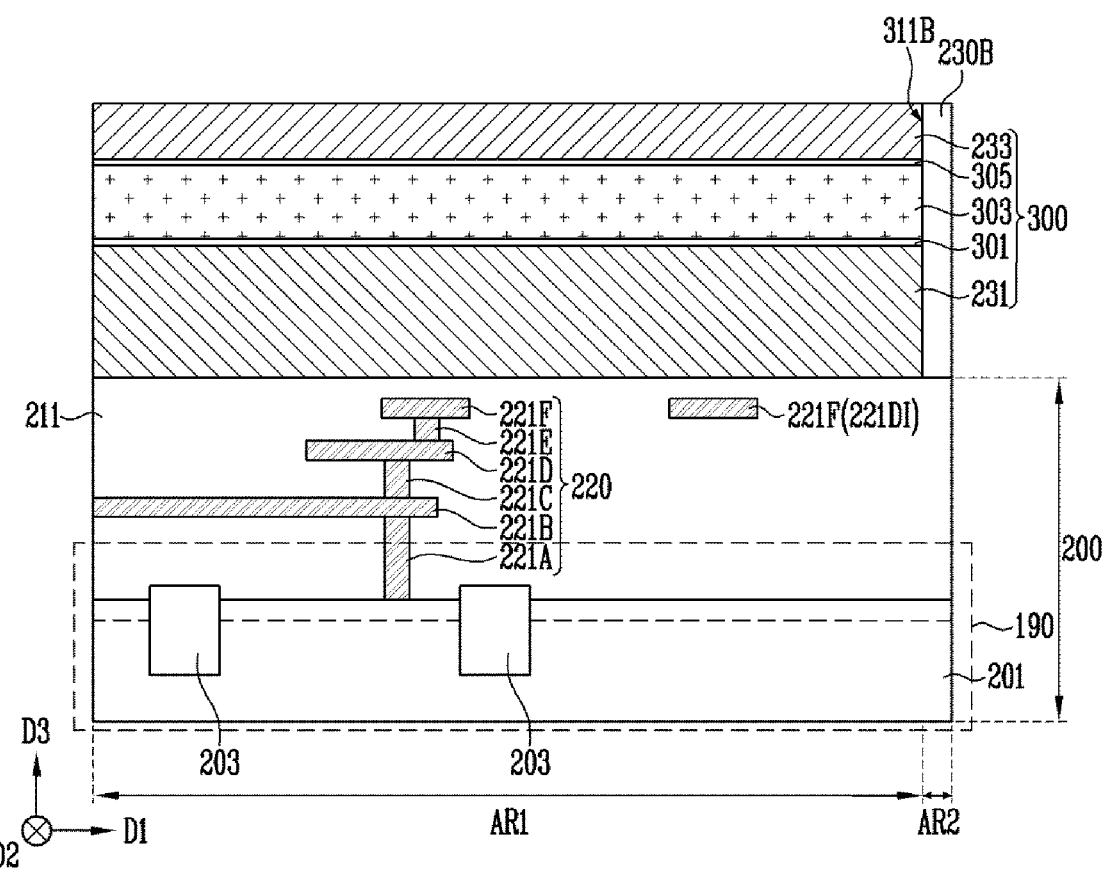
Figure 7D:
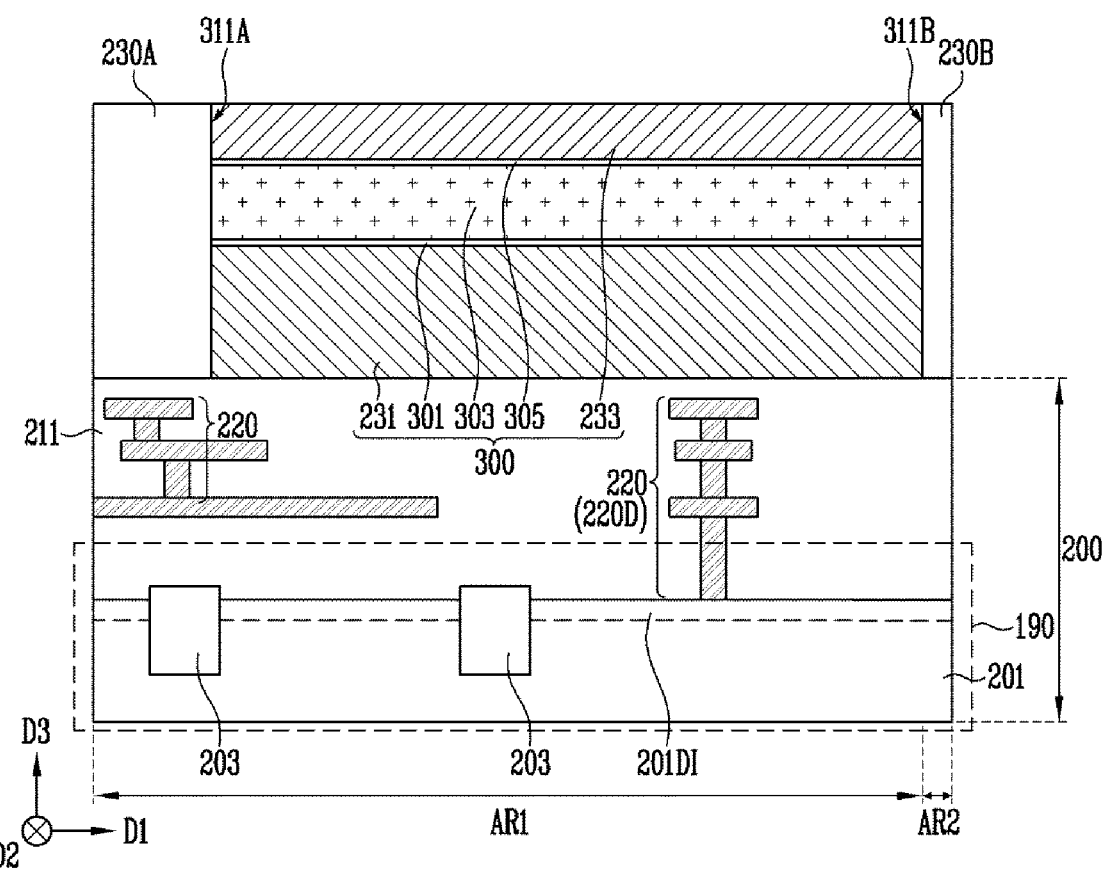
Figure 7E:
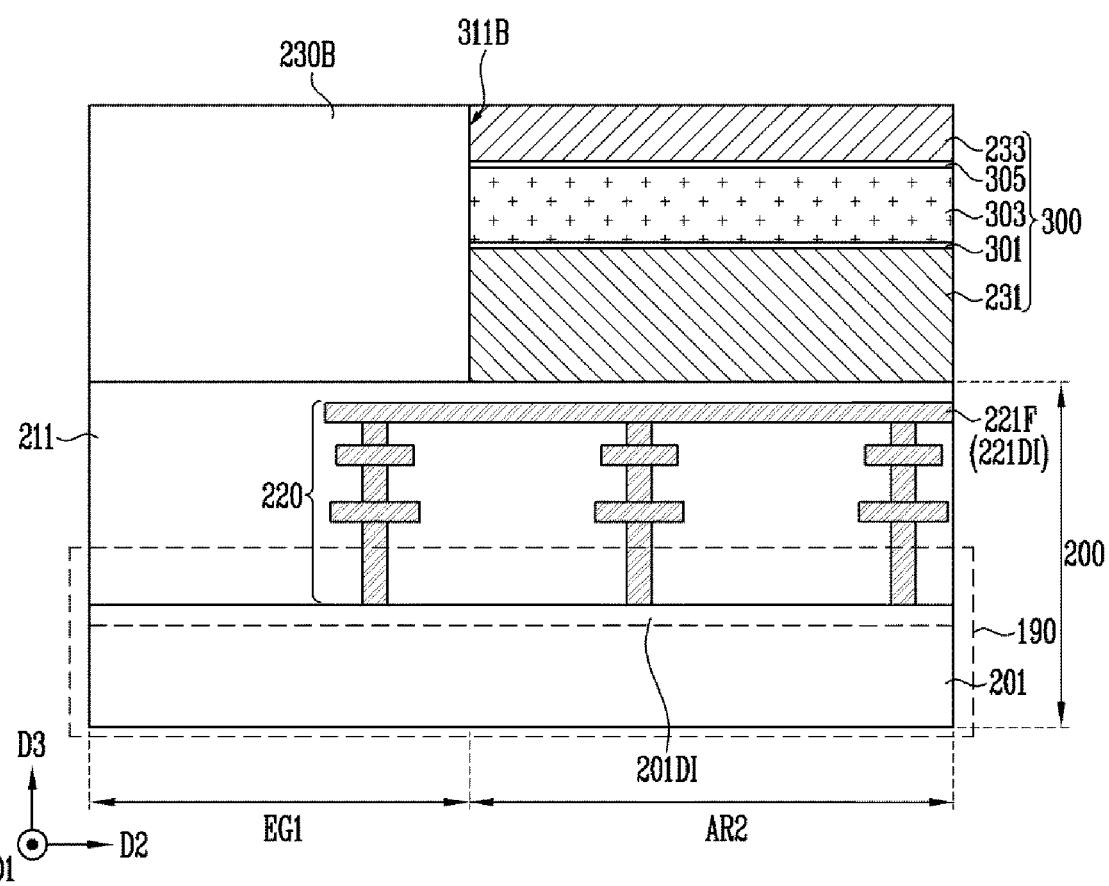
Figure 8A:
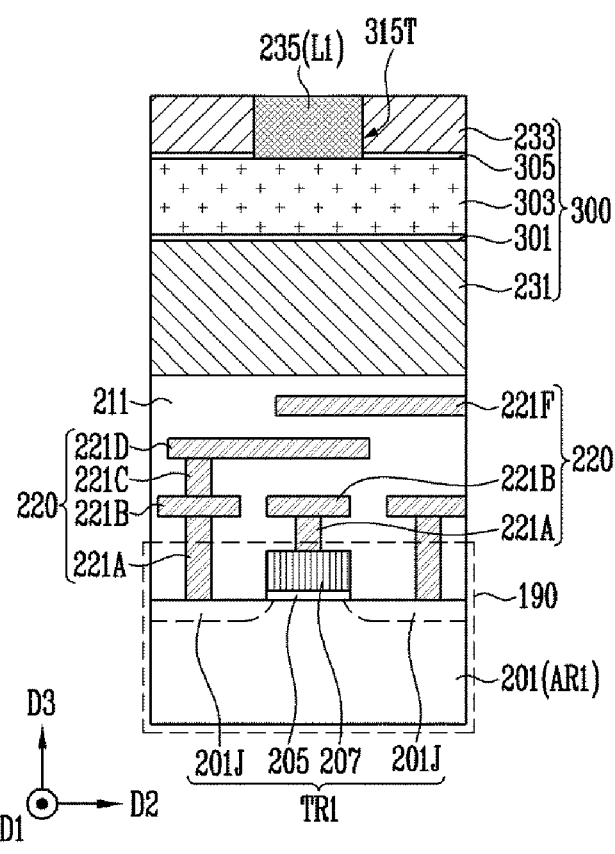
Figure 8B:
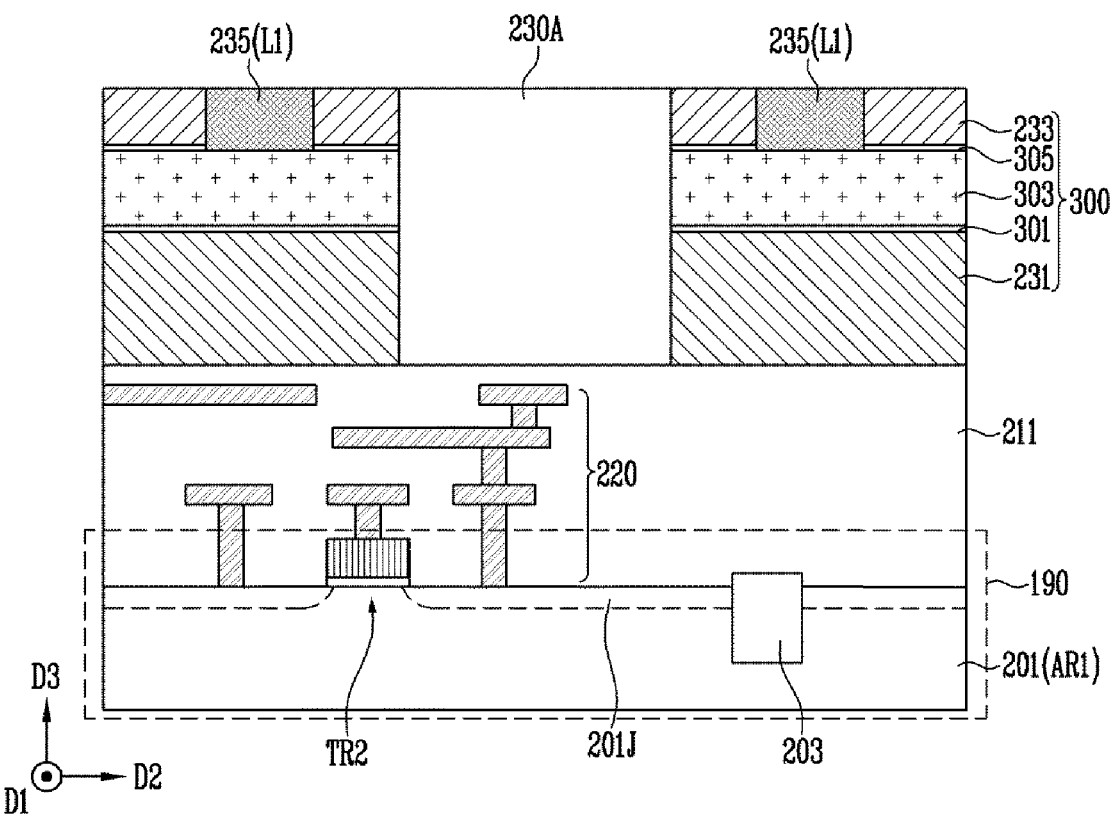
Figure 8C:
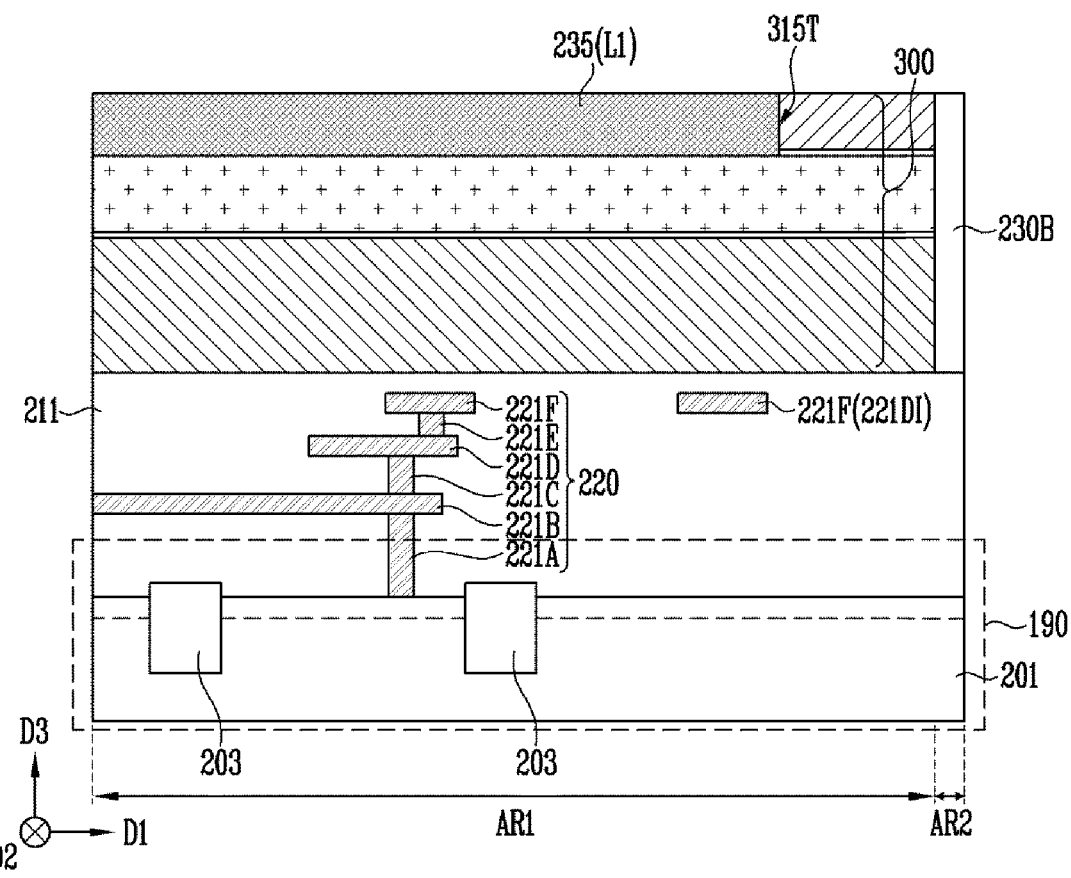
Figure 8D:
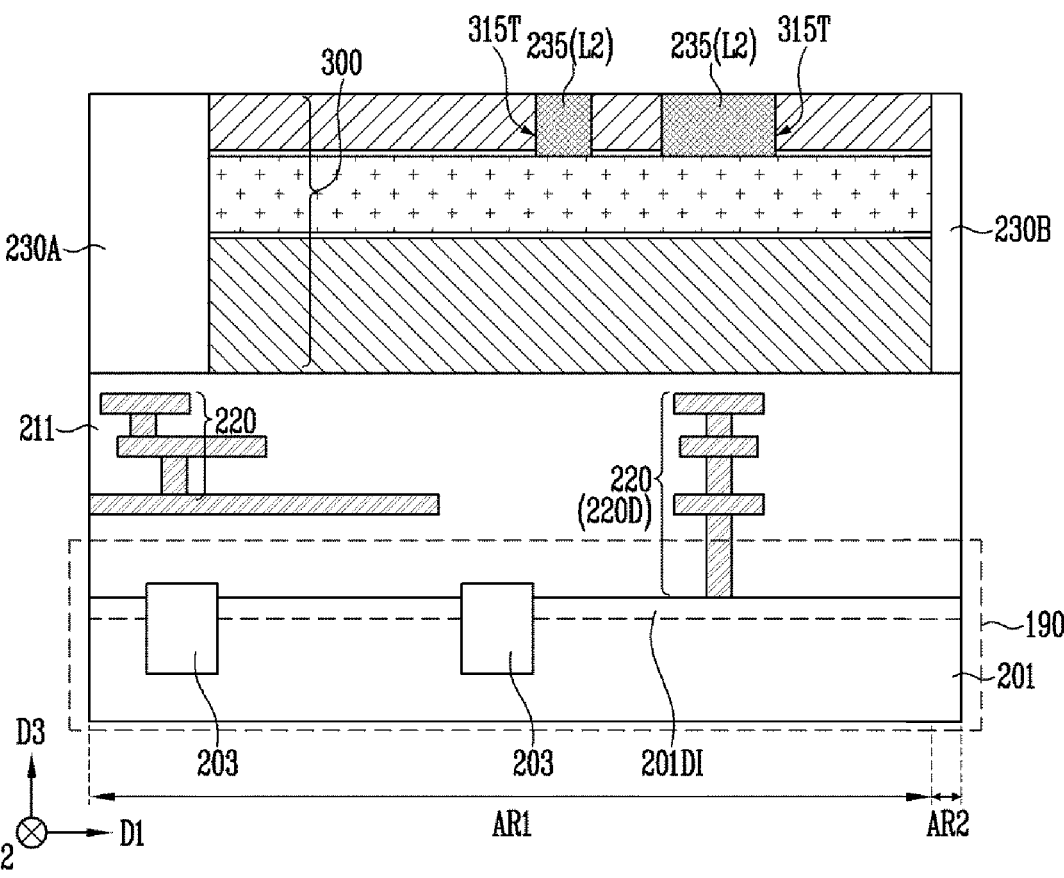
Figure 8E:
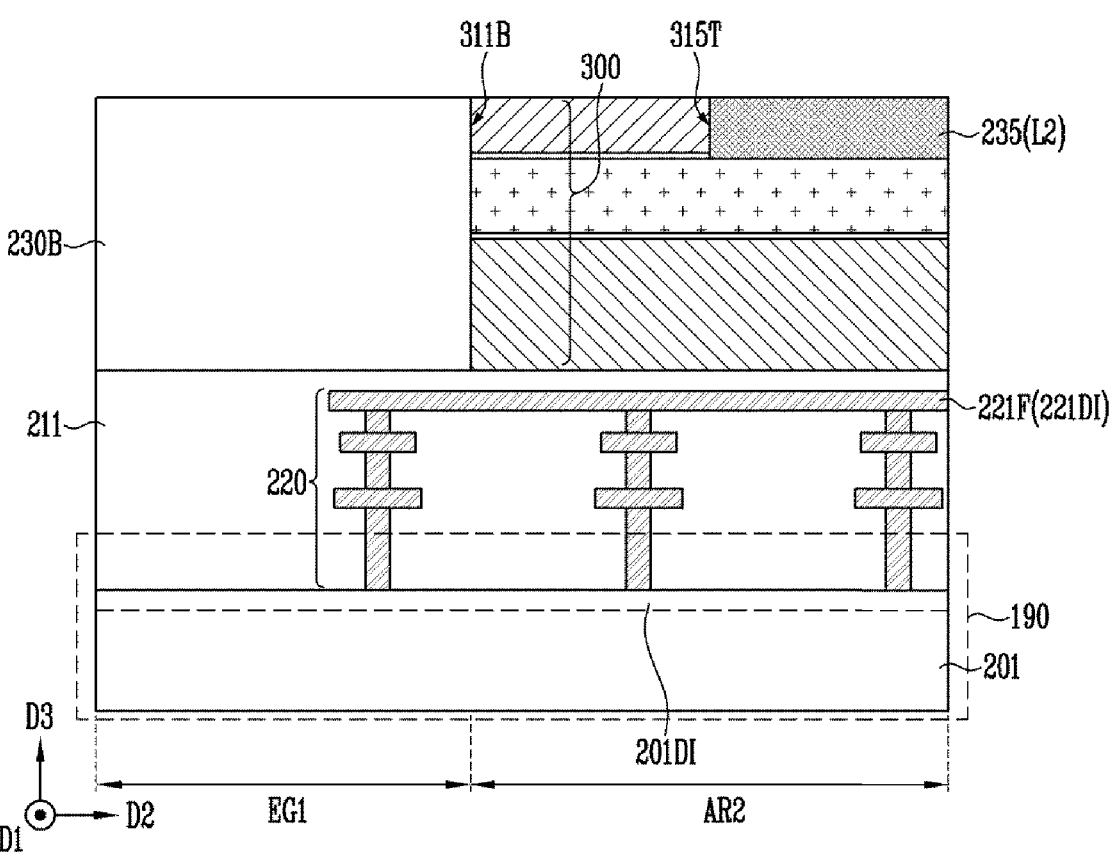

FIG. 6 is a sectional view of the semiconductor memory device taken along line IIe-IIe' shown in FIG. 4B.

FIGS. 7A, 7B, 7C, 7D, 7E, 8A, 8B, 8C, 8D, 8E, 9, 10A, 10B, 11A, 11B, 11C, 11D, 11E, 12, 13A, 13B, 13C, 13D, 14A, 14B, 14C, 14D, 15A, 15B, 15C, 16A, 16B, 16C, 16D, 16E, 17A, 17B, 17C, and 17D are sectional views illustrating a manufacturing method of the semiconductor memory device shown in FIGS. 4A and 5A to 5E.

Figures 18, 19:
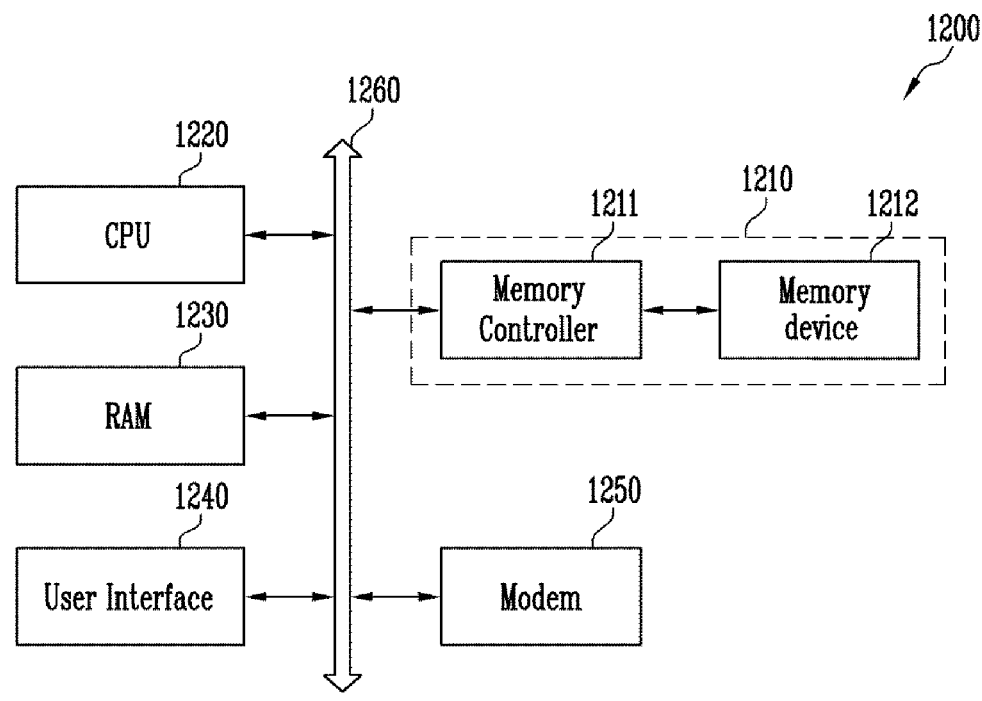

FIG. 18 is a block diagram illustrating a configuration of a memory system in accordance with an embodiment of the present disclosure.

FIG. 19 is a block diagram illustrating a configuration of a computing system in accordance with an embodiment of the present disclosure.

DETAILED DESCRIPTION

Specific structural and functional descriptions disclosed herein are merely illustrative for the purpose of describing embodiments according to the concept of the present disclosure. Embodiments according to the concept of the present disclosure can be implemented in various forms. Thus, the present disclosure should not be construed as being limited to the specific embodiments set forth herein.

Hereinafter, the terms 'first' and 'second' are used to distinguish one component from another component and are not meant to imply a specific number or order of components. The terms may be used to describe various components, but the components are not limited by the terms.

Embodiments provided are directed to a semiconductor memory device and a manufacturing method of the semiconductor memory device capable of improving stability of a manufacturing process.

Figure 1:
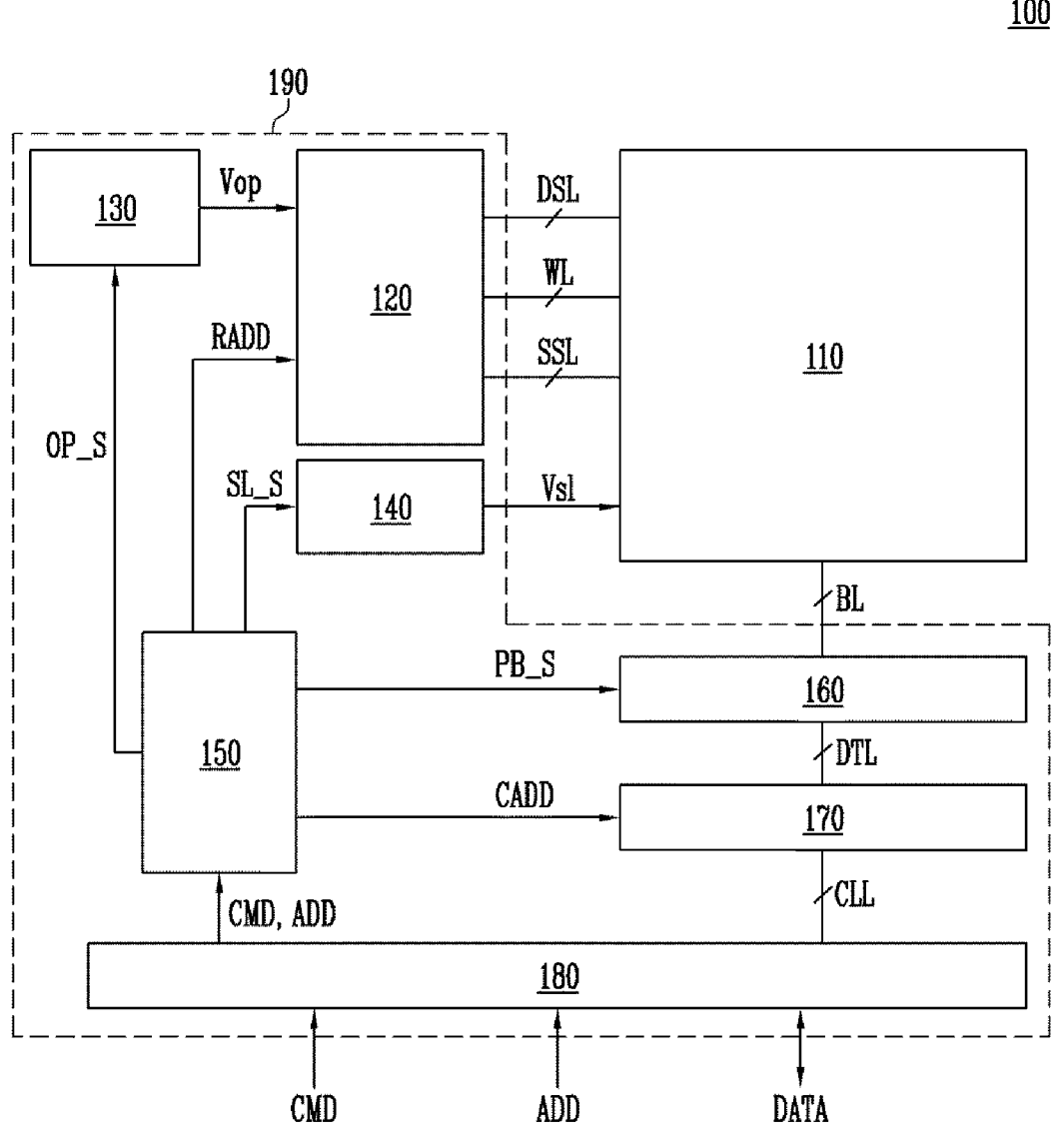
FIG. 1 is a block diagram illustrating a semiconductor memory device in accordance with an embodiment of the present disclosure.

FIG. 1 is a block diagram illustrating a semiconductor memory device in accordance with an embodiment of the present disclosure.

Referring to FIG. 1, the semiconductor memory device 100 may include a peripheral circuit structure 190 and a memory cell array 110.

The peripheral circuit structure 190 may be configured to perform a program operation and a verify operation, which are used to store data in the memory cell array 110, a read operation for outputting data that is stored in the memory cell array 110, and an erase operation for erasing data that is stored in the memory cell array 110. The peripheral circuit structure 190 may include an input/output circuit 180, a control circuit 150, a voltage generating circuit 130, a row decoder 120, a column decoder 170, a page buffer 160, and a source line driver 140.

The memory cell array 110 may include a plurality of memory cells in which data is stored. In an embodiment, the memory cell array 110 may include a three-dimensional memory cell array. Each of the plurality of memory cells may store data of a single bit or two or more bits. The plurality of memory cells may constitute a plurality of memory cell strings. Each memory cell string may include a plurality of memory cells connected in series through a channel layer. The channel layer may be connected to the page buffer 160 through a bit line BL, corresponding thereto, among a plurality of bit lines BL.

The input/output circuit 180 may transfer, to the control logic 150, a command CMD and an address ADD, which are transferred from an external device of the memory device 100 (e.g., a memory controller). The input/output circuit 180 may exchange data DATA with the external device and the column decoder 170.

The control logic 150 may output an operation signal OP_S, a row address RADD, a source line control signal SL_S, a page buffer control signal PB_S, and a column address CADD in response to the command CMD and the address ADD.

The voltage generating circuit 130 may generate various operating voltages Vop for a program operation, a verify operation, a read operation, and an erase operation in response to the operation signal OP_S.

The row decoder 120 may be connected to the memory cell array 110 through a plurality of drain select lines DSL, a plurality of word lines WL, and a plurality of source select line SSL. The row decoder 120 may transfer the plurality of operating voltages Vop to the plurality of drain select lines DSL, the plurality of word lines WL, and the plurality of source select lines SSL in response to the row address RADD.

In response to the column address CADD, the column decoder 170 may transmit data DATA that is input from the input/output circuit 180 to the page buffer 160 or transmit data DATA that is stored in the page buffer 160 to the input/output circuit 180. The column decoder 170 may exchange data DATA with the input/output circuit 180 through a column line CLL. The column decoder 170 may exchange data DATA with the page buffer 160 through a data line DTL.

The page buffer 160 may be connected to the memory cell array 110 through the plurality of bit lines BL. The page buffer 160 may temporarily store data DATA that is received through the plurality of bit lines BL in response to the page buffer control signal PB_S. The page buffer 160 may sense voltages or currents of the plurality of bit lines BL in a read operation.

The source line driver 140 may transmit a source voltage Vsl, supplied therefrom, to the memory cell array 110 in response to the source line control signal SL_S.

Each of FIGS. 2A and 2B illustrates a schematic vertical arrangement of a semiconductor memory device in accordance with an embodiment of the present disclosure.

Referring to FIGS. 2A and 2B, the semiconductor memory device may include a semiconductor substrate 201, a source structure 260, a metal pattern 235 (FIG. 2A) or 235' (FIG. 2B), a memory cell array 110, and a plurality of bit lines BL. The source structure 260 may be arranged on the semiconductor substrate 201. The metal pattern 235 or 235' may also be arranged on the semiconductor substrate 201 and may include a portion that is buried in the source structure 260. The memory cell array may be arranged on the source structure 260 and may include a plurality of memory blocks BLK1 to BLKn. The plurality of bit lines BL may be arranged on the memory cell array 110.

A region of the semiconductor substrate 201, shown in FIGS. 2A and 2B, may be a portion of a chip region. The chip region of the semiconductor substrate 201 may include a first region AR1, a second region AR2, a first chip edge region EG1, and a second chip edge region EG2. The first region AR1 of the semiconductor substrate 201 may overlap with the source structure 260. The second region AR2 of the semiconductor substrate 201 may be adjacent to the first region in the first direction D1 and may extend from the first region AR1 without overlapping with the source structure 260. The first chip edge region EG1 and the second chip edge region EG2 of the semiconductor substrate 201 may be adjacent to the first region AR1 in the second direction D2 and may extend from opposite sides of the first region AR1 without overlapping with the source structure 260. Each of the first chip edge region EG1 and the second chip edge region EG2 may extend in the first direction D1 to be connected to the second region AR2.

The first direction D1 may be defined as a direction in which a plurality of line parts L1 extend, and the second direction D2 may be defined as a direction that intersects with the plurality of first line parts L1. Each of the semiconductor substrate 201 and the source structure 260 may extend in the first direction D1 and the second direction D2. A third direction D3, which will be described later, may be defined as a direction that intersects with a top surface of the semiconductor substrate 201, which faces the memory cell array 110, or a top surface of the source structure 260, which faces the memory cell array 110. In an embodiment, the first direction D1, the second direction D2, and the third direction D3 may respectively correspond to directions in which an X axis, a Y axis, and a Z axis of an XYZ coordinate system face.

Although omitted for convenience of description, the peripheral circuit structure 190, described with reference to FIG. 1, may be disposed in the semiconductor substrate 201, and a plurality of interconnections that are connected to the peripheral circuit structure 190 shown in FIG. 1, may be disposed between the semiconductor substrate 201 and the source structure 260. In addition, a partial region of the source structure 260 may be penetrated by an internal source insulating pattern, and a lower insulating structure may be disposed between the source structure 260 and the semiconductor substrate 201.

Although schematically shown for convenience of description, the source structure 260 may be divided into a source pattern and a dummy pattern. The source structure 260 may include a source edge region EG[S]. The source edge region EG[S] may be defined as a region that overlaps with a portion of the first region AR1. The portion of the first region AR1, which overlaps with the source edge region EG[S], may be defined as an edge region of the first region AR1 that is adjacent to the second region AR2 of the semiconductor substrate 201.

The metal pattern 235 or 235' may be connected to the source structure 260. Although schematically shown for convenience of description, a portion of each of the plurality of first line parts L1 of the metal pattern 235 or 235' may be penetrated by a slit. The plurality of first line parts L1 may extend in the first direction D1 and may be parallel to each other. Each of the plurality of first line parts L1 may extend into the source edge region EG[S] of the source structure 260.

Referring to FIG. 2A, a metal pattern 235, in accordance with an embodiment of the present disclosure, may include a plurality of first line parts L1 with the above-described structure and at least one second line part L2 that extends in the second direction D2, intersecting with the plurality of first line parts L1. Although FIG. 2A illustrates two second line parts L2 that are parallel to each other, the present disclosure is not limited thereto. The second line part L2 may be buried in the source structure 260 in the source edge region EG[S] of the source structure 260. The second line part L2 may extend in the second direction D2, and the plurality of first line parts L1 may be connected to each other through each second line part L2.

Referring to FIG. 2B, a metal pattern 235' in accordance with an embodiment of the present disclosure may include a plurality of first line parts L1 with the above-described structure, at least one second line part L2 that extends in the second direction D2, intersecting the plurality of first line parts L1, and at least one third line part L3 that are spaced apart from the source structure 260 at a level at which the plurality of first line parts L1 are disposed. In an embodiment, the metal pattern 235' may include a third line part L3 that overlaps with at least one of the first chip edge region EG1 and the second chip edge region EG2. Although FIG. 2B illustrates two second line parts L2 that are parallel to each other and two third line parts L3 that are connected thereto, the present disclosure is not limited thereto.

The second line part L2 of the metal pattern 235' may include a portion that is buried in the source structure 260 in the source edge region EG[S] of the source structure 260. The second line part L2 may extend in the second direction D2, and the plurality of first line parts L1 may be connected to each other through the second line part L2. The third line part L3 may extend parallel to the plurality of first line parts L1, without overlapping with the source structure 260. The second line part L2 may include a portion that does not overlap with the source structure 260 to be connected to the third line part L3. The third line part L3 may be connected to the plurality of first line parts L1 through the second line part L2.

Although schematically shown in FIGS. 2A and 2B for convenience of description, each of the memory blocks BLK1 to BLKn may include a gate stack structure with a plurality of conductive patterns that are stacked on the source structure 260 while being spaced apart from each other and a plurality of memory cell strings that are connected to the respective conductive patterns.

Although omitted in FIGS. 2A and 2B for convenience of description, conductive contact structures may be disposed between the plurality of bit lines BL and the plurality of memory blocks BLK1 to BLKn. The conductive contact structures may connect the plurality of memory cell strings to the plurality of bit lines BL.

Hereinafter, the memory cell array 110 will be described with reference to FIG. 3.

FIG. 3 is a circuit diagram of a memory cell array in accordance with an embodiment of the present disclosure.

Referring to FIG. 3, each of the memory blocks BLK1 to BLKn of the memory cell array 110, shown in FIGS. 2A and 2B, may include a plurality of memory cell strings CS1 and CS2. The plurality of memory cell strings CS1 and CS2 may be commonly connected to a source line SL. In an embodiment, a plurality of first memory cell strings CS1 and a plurality of second memory cell strings CS2 may be commonly connected to the source line SL. A pair of first and second memory cell strings CS1 and CS2 may be connected to each bit line BL.

Each first memory cell string CS1 and each second memory cell string CS2 may include a source select transistor SST, a plurality of memory cells MC, and a drain select transistor DST, which are disposed between the source line SL and the bit line BL.

The source select transistor SST may control the electrical connection between the plurality of memory cells MC and the source line SL. One source select transistor SST may be disposed between the source line SL and the plurality of memory cells MC. Although not shown in the drawing, two or more source select transistors that are connected in series may be disposed between the source line SL and the plurality of memory cells MC. The gate of the source select transistor SST may be connected to a source select line SSL. An operation of the source select transistor SST may be controlled by a source gate signal that is applied to the source select line SSL.

The plurality of memory cells MC may be disposed between the source select transistor SST and the drain select transistor DST. The plurality of memory cells MC between the source select transistor SST and the drain select transistor DST may be connected in series. The gates of the plurality of memory cells MC may be respectively connected to a plurality of word lines. An operation of each memory cell MC may be controlled by cell gate signals that is applied to a word line WL corresponding thereto.

The drain select transistor DST may control electrical connection between the plurality of memory cells MC and the bit line BL. A gate of the drain select transistor DST may be connected to a drain select line DSL1 or DSL2. An operation of the drain select transistor DST may be controlled by a drain gate signal applied to the drain select line DSL1 or DSL2.

The plurality of first memory cell strings CS1 may be connected to a first drain select line DSL1. The plurality of second memory cell strings CS2 may be connected to a second drain select line DSL2. Accordingly, one bit line may be selected from the plurality of bit lines BL, and one drain select line may be selected between the first drain select line DSL1 and the second drain select line DSL2 so that one memory cell string may be selected from the plurality of first memory cell strings CS1 and the plurality of second memory cell strings CS2.

The plurality of first memory cell strings CS1 and the plurality of second memory cell strings CS2 may be commonly connected to each word line WL.

The plurality of first memory cell strings CS1 and the plurality of second memory cell strings CS2 may be commonly connected to the source select line SSL. However, the embodiment of the present disclosure is not limited thereto. Although not shown in the drawing, in an embodiment, the memory cell array may include a first source select line and a second source select line, which are isolated from each other. The first source select line may be connected to the plurality of first memory cell strings, and the second source select line may be connected to the plurality of second memory cell strings.

The configuration of each memory block is not limited to what is shown in FIG. 3 and may be variously changed.

Each of FIGS. 4A and 4B is a plan view of a partial configuration of a semiconductor memory device in accordance with an embodiment of the present disclosure. FIG. 4A is a plan view of a partial configuration of the semiconductor memory device shown in FIG. 2A, and FIG. 4B is a plan view of a partial configuration of the semiconductor memory device shown in FIG. 2B. Hereinafter, overlapping descriptions of components identical to those shown in FIGS. 2A and 2B will be omitted.

Referring to FIGS. 4A and 4B, a source structure 260 may overlap with the first region AR1 of the semiconductor substrate 201, shown in FIGS. 2A and 2B. A boundary of the source structure 260 may be controlled such that the source structure 260 does not overlap with the second region AR2 and each chip edge region (e.g., EG1) of the semiconductor substrate 201, shown in FIGS. 2A and 2B. The second region AR2 and the chip edge region EG1 may overlap with an outer source insulating pattern 230B, disposed at a level at which the source structure 260 is disposed.

Referring to FIG. 4A, a metal pattern 235, in accordance with an embodiment of the present disclosure, may include a plurality of first line parts L1 and at least one second line part L2 as described with reference to FIG. 2A. Referring to FIG. 4B, a metal pattern 235', in accordance with an embodiment of the present disclosure, may include a plurality of first line parts L1, at least one second line part L2, and at least one third line part L3 as described with reference to FIG. 2B. The third line part L3 may be buried in the outer source insulating pattern 230B.

For convenience of description of the layout of the metal pattern 235 or 235', the illustration of some components of the semiconductor memory device on a source edge region EG[S] and the outer source insulating pattern 230B has been omitted in FIGS. 4A and 4B. However, the omitted components are illustrated in FIGS. 5A to 5E.

Referring to FIGS. 4A and 4B, the at least one second line part L2 may be penetrated by a first discharge contact 237A. The first discharge contact 237A may extend to penetrate the source structure 260. Referring to FIG. 4B, the at least one third line part L3 may be penetrated by a second discharge contact 237B. The second discharge contact 237B may extend to penetrate the outer source insulating pattern 230B.

Figure 5A:
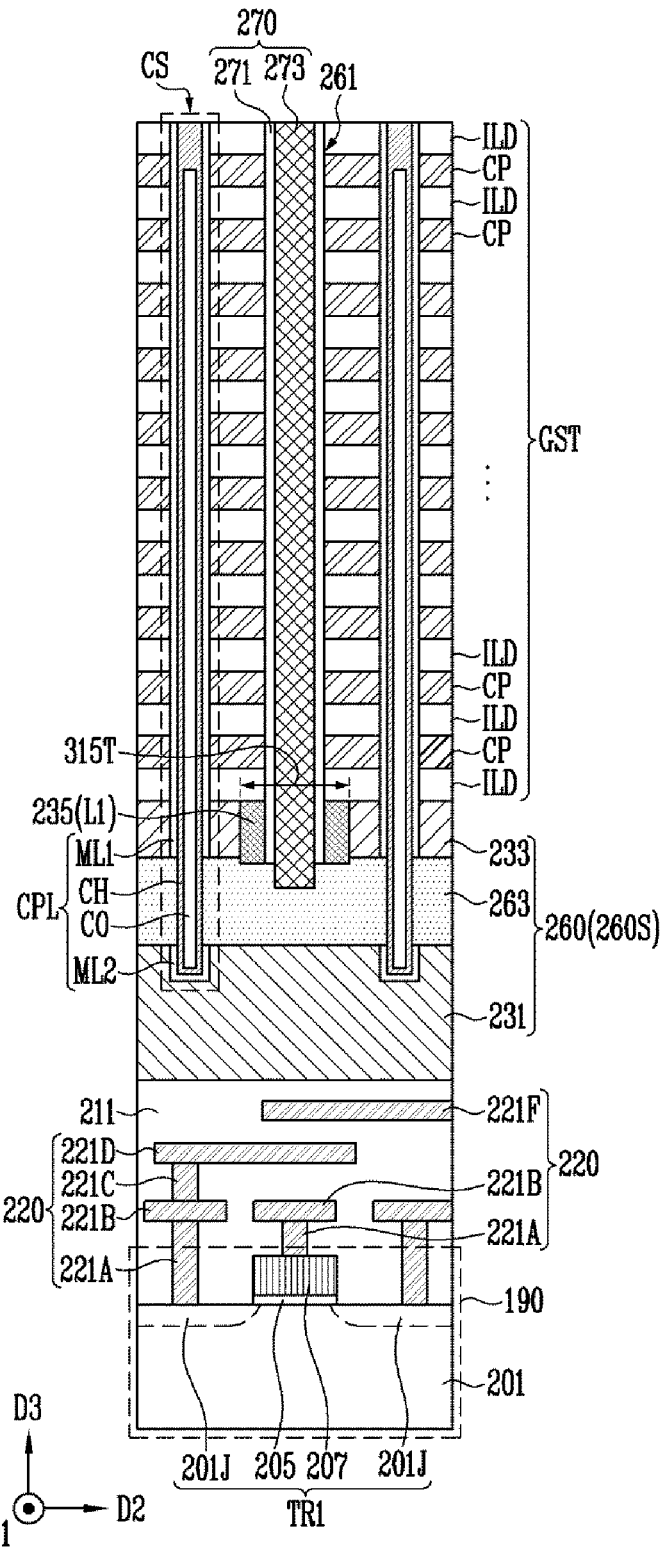
Figure 5B:
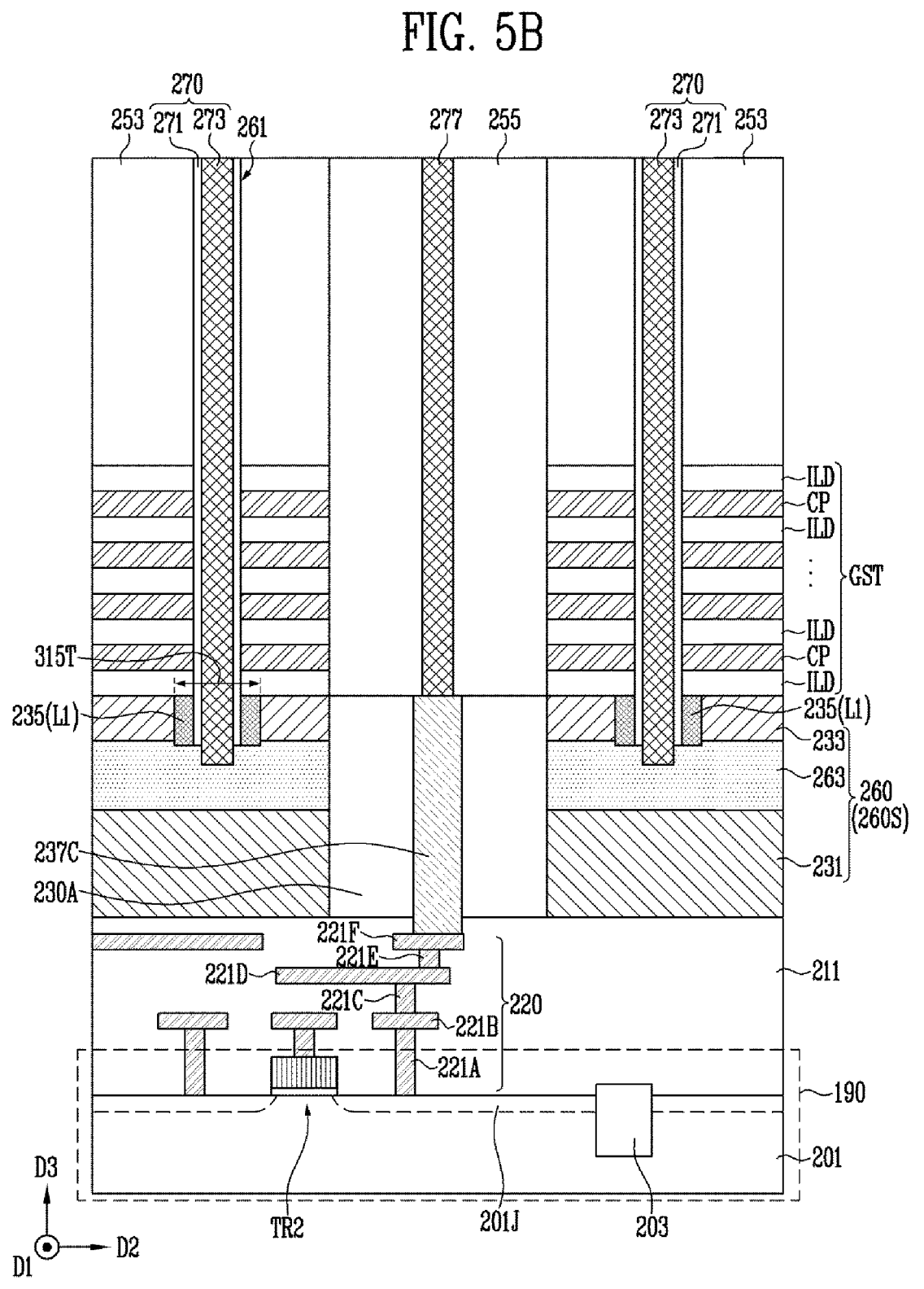

Referring to FIGS. 4A and 4B, the plurality of first line parts L1 of the metal pattern 235 or 235' may include portions that are penetrated by a plurality of slits 261. For convenience of description of the plurality of slits 261, the illustration of a plurality of vertical structures that are respectively disposed in the plurality of slits 261 has been omitted in FIGS. 4A and 4B. However, the plurality of vertical structures are shown in FIGS. 5A and 5B.

The plurality of slits 261 and the plurality of first line parts L1 may extend away from the source edge region EG[S] (e.g., the opposite direction of the first direction D1). Each first line part L1 may extend farther in the first direction D1 than each slit 261. The plurality of slits 261 may be respectively defined in the plurality of first line parts L1.

The gate stack structure GST and the plurality of cell plugs CPL, which constitute the memory cell array 110 that is shown in FIGS. 2A and 2B, may be disposed at both sides of the respective slits 261 that are adjacent to each other in the second direction D2. The boundary of the gate stack structure GST may be controlled such that the gate stack structure GST does not overlap with the second region AR2, the chip edge region EG1 of the semiconductor substrate, and the source edge region EG[S] of the source structure 260. The slit 261 may extend along a sidewall of the gate stack structure GST.

The gate stack structure GST may include a cell array region CAR and a contact region CTA that extends from the cell array region CAR. The plurality of cell plugs CPL may penetrate the cell array region CAR of the gate stack structure GST. The contact region CTA of the gate stack structure GST may be formed in a stepped structure. The contact region CTA of the gate stack structure GST may be located between the cell array region CAR and the source edge region EG[S].

The semiconductor memory device may include an internal insulating layer 255 that penetrates at least one gate stack structure GST and an upper contact 277 that penetrates the internal insulating layer 255. The internal insulating layer 255 may penetrate the contact region CTA of the gate stack structure GST. The upper contact 277 may be formed of a conductive material and may be used as a path through which a signal from the peripheral circuit structure 190, shown in FIG. 1, is received.

The gate stack structure GST may include a plurality of conductive patterns that are connected to the plurality of cell strings CS1 and CS2, shown in FIG. 3. The plurality of conductive patterns of the gate stack structure GST may be insulated from the upper contact 277 by the internal insulating layer 255. Conductive patterns that are disposed in a layer that is farthest from the source structure 260, among the plurality of conductive patterns of the gate stack structure GST, may be isolated from each other based on a drain isolation slit DSI in addition to the slit 261. The drain isolation slit DSI may penetrate an upper portion of the gate stack structure GST.

The arrangement of the plurality of cell plugs CPL and the arrangement of the drain isolation slit DSI are not limited to those shown in FIGS. 4A and 4B and may be variously changed.

Figure 5C:
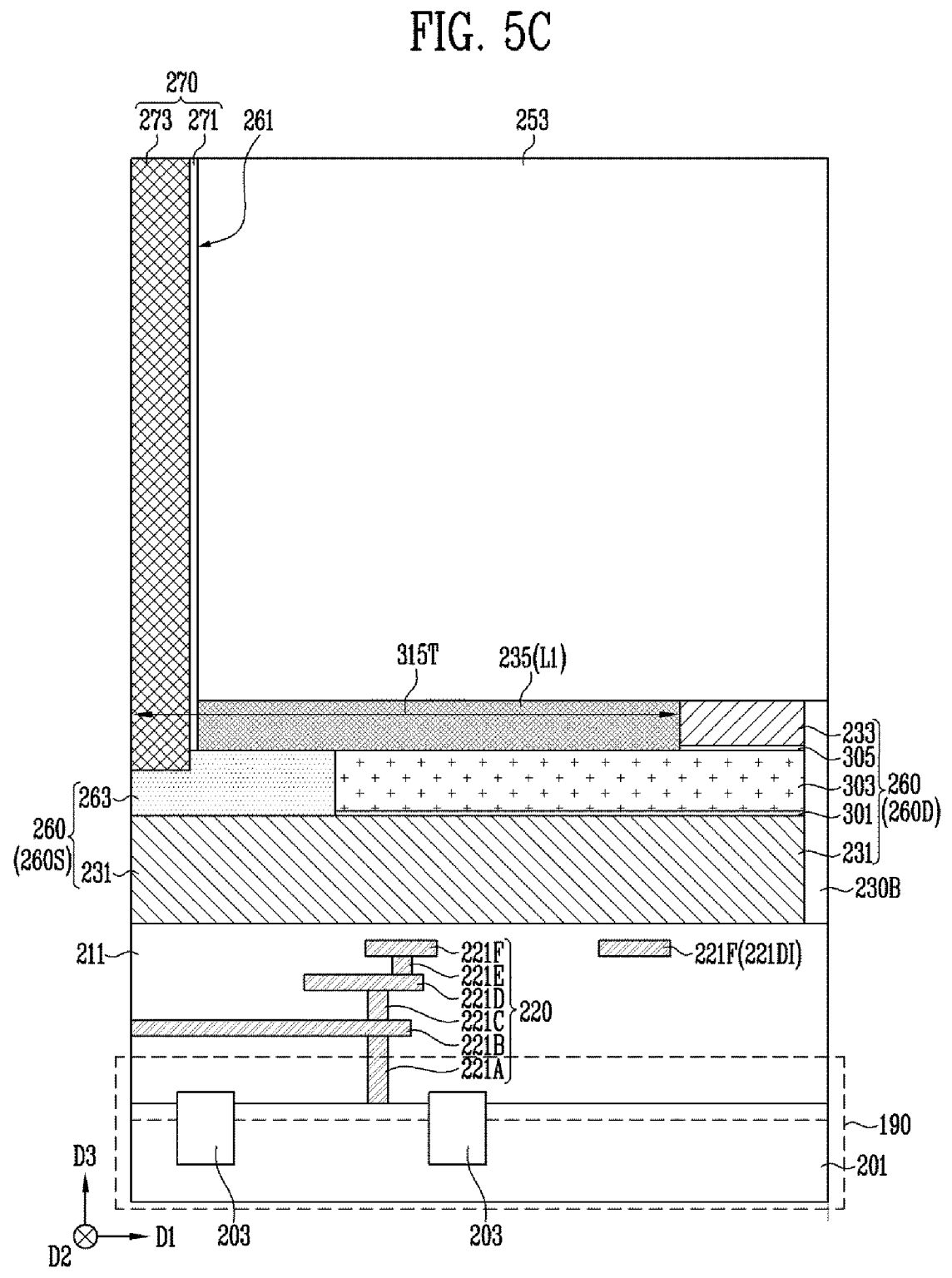
Figure 5D:
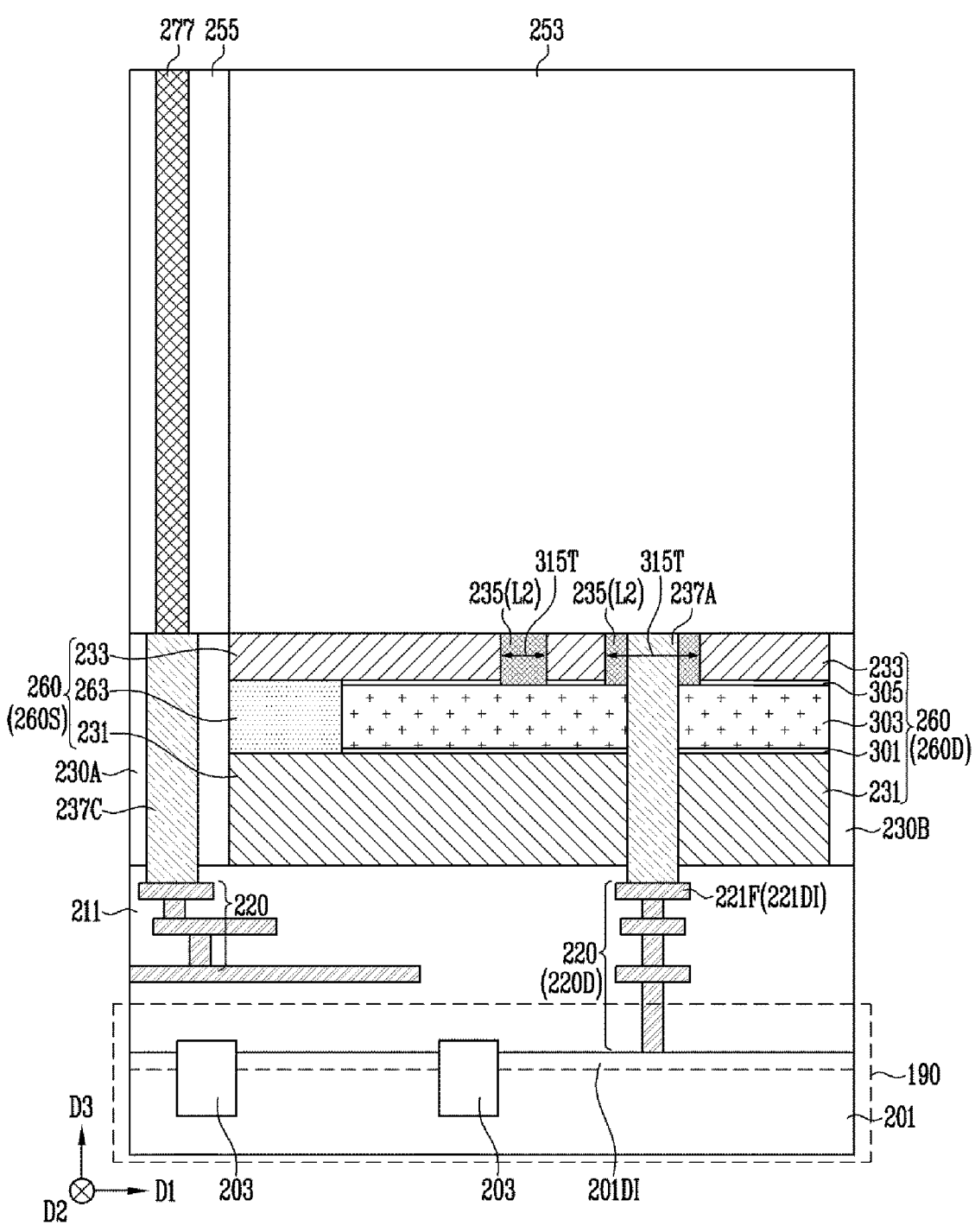
Figure 5E:
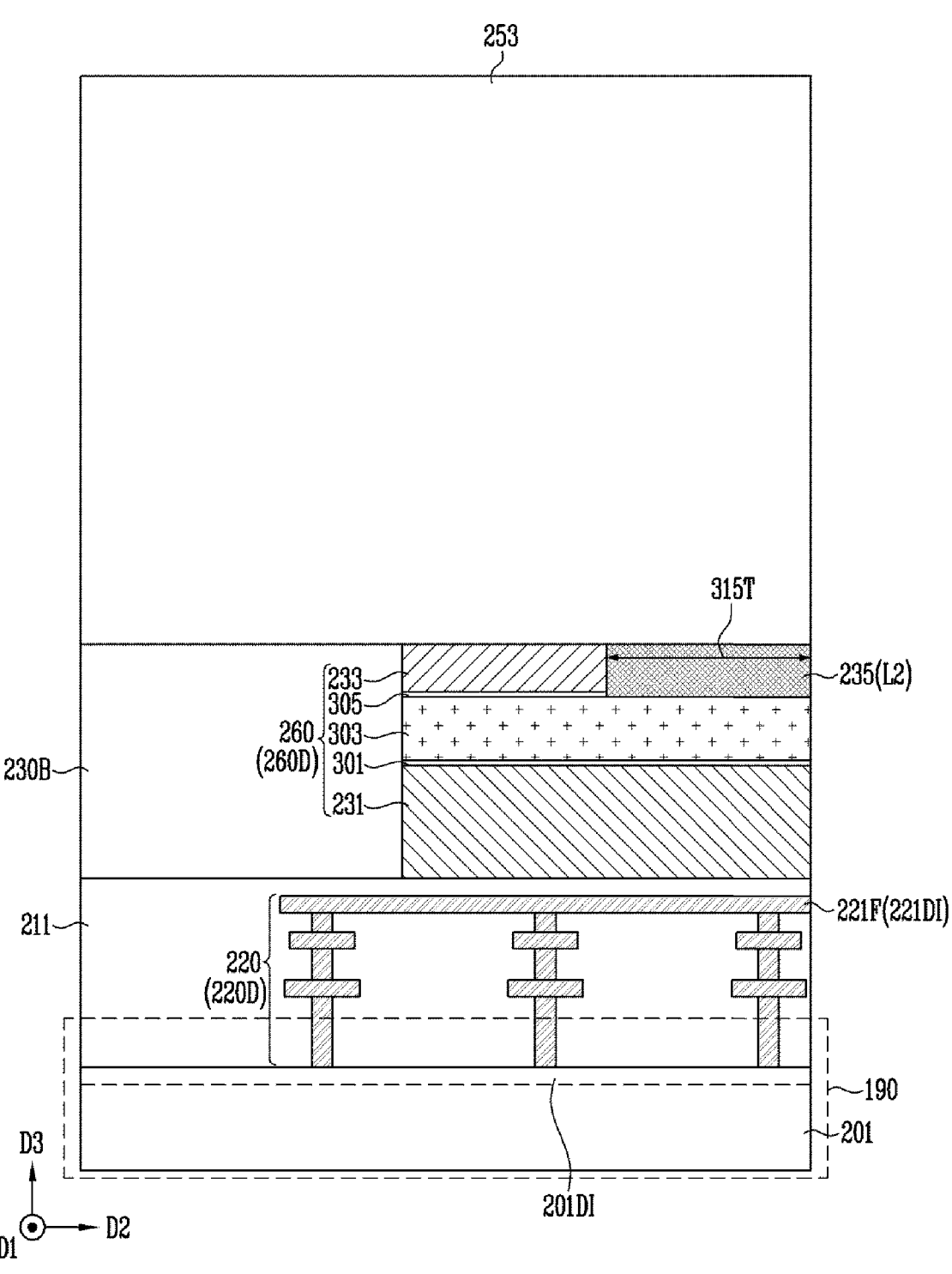

FIGS. 5A, 5B, 5C, 5D, and 5E are sectional views of the semiconductor memory device, shown in FIG. 4A. FIG. 5A is a sectional view taken along line Ia-Ia', shown in FIG. 4A, FIG. 5B is a sectional view taken along line Ib-Ib', shown in FIG. 4A, FIG. 5C is a sectional view taken along line Ic-Ic', shown in FIG. 4A, FIG. 5D is a sectional view taken along line Id-Id', shown in FIG. 4A, and FIG. 5E is a sectional view taken along line Ie-Ie', shown in FIG. 4A Referring to FIGS. 4A and 5A to 5E, a peripheral circuit structure 190 may be formed in the semiconductor substrate 201. The peripheral circuit structure 190 may include structures for the row decoder 120, the column decoder 170, the page buffer 160, and the source line driver 140, which are shown in FIG. 1. In an embodiment, the peripheral circuit structure 190 may include a first transistor TR1 of the page buffer 160, shown in FIG. 1, and a second transistor TR2 of the row decoder 120, shown in FIG. 1. Each of the first transistor TR1 and the second transistor TR2 may include a gate insulating layer 205 on the semiconductor substrate 201, a gate electrode 207 on the gate insulating layer 205, and junctions 201J that are defined in the semiconductor substrate 201 at both sides of the gate electrode 207. Each junction 201J may be a portion of a plurality of impurity regions that are defined in the semiconductor substrate 201.

The semiconductor substrate 201 may include a plurality of active regions that are divided by a plurality of isolation layers 203. Impurity regions may be formed in the active regions. Each impurity region may be defined as a region into which a conductivity type impurity of at least one of an n type and a p type is implanted. The impurity regions may include a discharge impurity region 201DI and the junctions 201J of the first transistor T1 and the second transistor T2. The discharge impurity region 201DI may be formed in a partial region of the semiconductor substrate 201, which overlaps with the second line part L2 of the metal pattern 235, and may be formed in the chip edge region EG1 of the semiconductor substrate 201. The discharge impurity region 201DI may include an impurity with a conductivity type that is different from that of the source structure 260. In an embodiment, the source structure 260 may include an n-type impurity, and the discharge impurity region 201DI may include a p-type impurity.

The peripheral circuit structure 190 and the semiconductor substrate 201 may be covered by a lower insulating structure 211. The lower insulating structure 211 may include two or more insulating layers. The discharge impurity region 201DI, the first transistor TR1, and the second transistor TR2 may be respectively connected to a plurality of interconnections 220. Each interconnection 220 may be defined by a connection structure between a plurality of conductive patterns 221A, 221B, 221C, 221D, 221E, and 221F that are buried in the lower insulating layer 211. Hereinafter, an interconnection 220, among the plurality of interconnections 220, connected to the discharge impurity region 201DI is designated as a discharge interconnection 220D, and a line-shaped conductive pattern (e.g., 221F), among the conductive patterns 221A, 221B, 221C, 221D, 221E, and 221F, is designated as a discharge line 221DI. The discharge impurity region 201DI may be connected to a first discharge contact 237A via the discharge interconnection 220D with the discharge line 221DI.

The source structure 260 may have a trench 315T in which the metal pattern 235 is formed. The source structure 260 may be disposed between a gate stack structure GST and the lower insulating structure 211. The source structure 260 may include a first doped 10) semiconductor layer 231, a second doped semiconductor layer 263, a sacrificial layer 303, and an upper semiconductor layer 233. Each of the first doped semiconductor layer 231, the second doped semiconductor layer 263, and the upper semiconductor layer 233 may include an n-type impurity. In an embodiment, each of the first doped semiconductor layer 231, the second doped semiconductor layer 263, and the upper semiconductor layer 233 may include n-type doped silicon. The sacrificial layer 303 may include an undoped semiconductor layer. In an embodiment, the sacrificial layer 303 may include undoped silicon.

The first doped semiconductor layer 231 may overlap with the first region AR1 of the semiconductor substrate 201 and may open the second region AR2 and the chip edge region EG1 of the semiconductor substrate 201.

The second doped semiconductor layer 263 and the sacrificial layer 303 may be disposed on the first doped semiconductor layer 231. The sacrificial layer 303 may be disposed on an edge of the first doped semiconductor layer 231. The edge of the first doped semiconductor layer 231 may be adjacent to the second region AR2 and the chip edge region EG1 of the semiconductor substrate 201. The second doped semiconductor layer 263 may extend between the first doped semiconductor layer 231 and the gate stack structure of the memory cell array from a sidewall of the sacrificial layer 303.

The source structure 260 may further include a first protective layer 301 and a second protective layer 305. The first protective layer 301 may be disposed between the first doped semiconductor layer 231 and the sacrificial layer 303, and the second protective layer 305 may be disposed between the sacrificial layer 303 and the upper semiconductor layer 233. The second doped semiconductor layer 263 may extend along a sidewall of each of the first protective layer 301 and the second protective layer 305.

The upper semiconductor layer 233 may be disposed on the second doped semiconductor layer 263, and extend to overlap with the sacrificial layer 303.

The source structure 260 may include a source pattern 260S and a dummy pattern 260D that is connected to the source pattern 260S. The source pattern 260S may be configured with a partial region of the first doped semiconductor layer 231, which overlaps with the second doped semiconductor layer 263, the second doped semiconductor layer 263, and a partial region of the upper semiconductor layer 233 that overlaps with the second doped semiconductor layer 263. The dummy pattern 260D may include the other portion of the first doped semiconductor layer 231 that overlaps with the sacrificial layer 303, the sacrificial layer 303, and the other portion of the upper semiconductor layer 233 that overlaps with the sacrificial layer 303. The dummy pattern 260D may further include the first protective layer 301 and the second protective layer 305.

The source pattern 260S may be disposed between the gate stack structure GST and the lower insulating structure 211. The second doped semiconductor layer 263 of the source pattern 260S may extend along each slit 261. A portion of the source pattern 260S may constitute a portion of the source edge region EG[S] of the source structure 260. The other portion of the source edge region EG[S] may be configured as the dummy pattern 260D.

The boundary between the source pattern 260S and the dummy pattern 260D may be defined along a boundary between the second doped semiconductor layer 263 and the sacrificial layer 303. The boundary between the source pattern 260S and the dummy pattern 260D may be disposed between an end of the slit 261, which faces the source edge region EG[S], and the second line part L2 of the metal pattern 235, which is adjacent thereto.

The upper semiconductor layer 233 of the source structure 260 may be penetrated by the trench 315T. The trench 315T may penetrate a partial region of the upper semiconductor layer 233 of the source pattern 260S and may extend to penetrate a partial region of the upper semiconductor layer 233 of the dummy pattern 260D. A partial region of the trench 315T, which is defined in the dummy pattern 260D, may penetrate the second protective layer 305. The trench 315T may overlap with the second doped semiconductor layer 263 of the source pattern 260S. The trench 315T may extend to overlap with the sacrificial layer 303 of the dummy pattern 260D.

The plurality of first line parts L1 and the second line part L2 of the metal pattern 235 may be formed in the trench 315T. The metal pattern 235 may have a sidewall in contact with the upper semiconductor layer 233 of the source structure 260. The upper semiconductor layer 233 may surround a sidewall of each of the plurality of first line parts L1 and the second line part L2. Each of the first line parts L1 may overlap with the second doped semiconductor layer 263 of the source pattern 260S and may extend to overlap with the sacrificial layer 303 of the dummy pattern 260D. The second line part L2 may have a bottom surface in contact with the sacrificial layer 303.

The source pattern 260S of the source structure 260 may be penetrated by an internal source insulating pattern 230A. The internal source insulating pattern 230A may overlap with the internal insulating layer 255. The internal source insulating pattern 230A may be penetrated by a lower contact 237C. The lower contact 237C may be formed of a conductive material and may be used as a path through which a signal from the peripheral circuit structure 190 is transmitted. In an embodiment, the lower contact 237C may be connected to the junction 201J of the second transistor TR2 via the interconnection 220.

At least one second line part L2 of the metal pattern 235 may be penetrated by the first discharge contact 237A and may be in contact with the first discharge contact 237A. The first discharge contact 237A may penetrate the source structure 260. In an embodiment, the first discharge contact 237A may penetrate the dummy pattern 260D of the source structure 260. The first discharge contact 237A may extend to be in contact with the discharge interconnection 220D. In an embodiment, the first discharge contact 237A may extend to be in contact with the discharge line 221DI of the discharge interconnection 220D. The first discharge contact 237A may be connected to the discharge impurity region 201DI via the discharge interconnection 220D. The source structure 260 may be connected to the discharge impurity region 201DI via the second line part L2 of the metal pattern 235, the first discharge contact 237A, and the discharge interconnection 220D. The first discharge contact 237A may be spaced apart from the second doped semiconductor layer 263 of the source structure 260. Accordingly, while a process of forming the second doped semiconductor layer 263 is performed, a phenomenon in which the first discharge contact 237A is damaged may be reduced.

The metal pattern 235 may include a metal with a work function that is higher than that of the source structure 260. In an embodiment, the metal pattern 235 may include tungsten. Charges that are generated while the semiconductor memory device is manufactured may be discharged to the discharge impurity region 201DI of the semiconductor substrate 201 via the metal pattern 235 with a work function that is higher than those of the first doped semiconductor layer 231 and the upper semiconductor layer 233.

The memory cell array may include a plurality of conductive patterns CP and a plurality of cell plugs CPL. The plurality of conductive patterns CP may be disposed on the source pattern 260S of the source structure 260 to be spaced apart from each other in the second direction D2 and the third direction D3. Each cell plug CPL may penetrate the plurality of conductive patterns CP. The source edge region EG[S] of the source structure 260 might not overlap with the plurality of conductive patterns CP, but may be opened. The plurality of conductive patterns CP may be used as the first drain select line DSL1, the second drain select line DSL2, the plurality of word lines WL, and the source select line SSL, which are shown in FIG. 3. In an embodiment, at least one layer that is adjacent to the source structure 260, among the plurality of conductive patterns CP, may be used as the source select line SSL shown in FIG. 3. Conductive patterns, among the plurality of conductive pattern CP, disposed in at least one layer that is disposed farthest from the source structure 260 may be used as the first drain select line DSL1 and the second drain select line DSL2, which are shown in FIG. 3. Conductive patterns that are disposed between the source select line SSL and each of the first drain select line DSL1 and the second drain select line DSL2 may be used as the word lines WL, shown in FIG. 3. The first drain select line DSL1 and the second drain select line DSL2 may be isolated from each other by the drain isolation slit DSI.

The plurality of conductive patterns CP and a plurality of interlayer insulating layers ILD may be alternately disposed in the third direction D3. The plurality of conductive patterns CP and the plurality of interlayer insulating layers ILD, which are alternately disposed in the third direction D3, may constitute the gate stack structure GST. The plurality of conductive patterns CP and the plurality of interlayer insulating layers ILD may form a stepped structure in the contact region CTA of the gate stack structure GST.

The source edge region EG[S] of the source structure 260 may be covered by an upper insulating layer 253. The upper insulating layer 253 may extend onto the outer source insulating pattern 230B. The upper insulating layer 253 may extend onto the contact region CTA of the gate stack structure GST. The stepped structure that is defined by the plurality of conductive patterns CP and the plurality of interlayer insulating layer ILD may be covered by the upper insulating layer 253.

The plurality of conductive patterns CP may be spaced apart from each other in the second direction D2 by a plurality of vertical structures 270. The plurality of vertical structures 270 may be disposed on the source structure 260 and may extend in the third direction D3 to be respectively formed within the plurality of slits 261. According to this structure, it may be considered that the plurality of conductive patterns CP that constitute the gate stack structure GST are disposed on the source structure 260 at both sides of the vertical structure 270, which faces the second direction D2 and the opposite direction of the second direction D2, or both sides of the slit 261, which faces the second direction D2 and the opposite direction of the second direction D2.

A plurality of memory cell strings CS may be defined by the plurality of conductive patterns CP and the plurality of cell plugs CPL. Each cell plug CPL may include a channel layer CH, a core insulating layer CO, a first memory pattern ML1, and a second memory pattern ML2.

The channel layer CH1 may penetrate the plurality of interlayer insulating layers ILD and the plurality of conductive patterns CP, which are stacked in the third direction D3. The channel layer CH may extend into the source structure 260 to be in contact with the source structure 260. In an embodiment, the channel layer CH may penetrate the upper semiconductor layer 233 of the source structure 260, and extend into the first doped semiconductor layer 231. The second doped semiconductor layer 263 of the source structure 260 may be in contact with a sidewall of the channel layer CH and may surround the sidewall of the channel layer CH. The channel layer CH may be used as a channel region of the memory cell string CS. The channel layer CH may be comprised of a semiconductor layer. The channel layer CH may extend along a sidewall, a bottom surface, and a top surface of the core insulating layer CO. A doped region may be defined at an end portion of the channel layer CH that is formed on the core insulating layer CO. The doped region of the channel layer CH may include an n-type impurity.

The first memory pattern ML1 may be disposed between each of the conductive patterns CP and the channel layer CH. In an embodiment, the first memory pattern ML1 may be disposed between the gate stack structure GST and the channel layer CH and may extend between the upper semiconductor layer 233 of the source structure 260 and the channel layer CH. The second memory pattern ML2 may be disposed between the first doped semiconductor layer 231 of the source structure 260 and the channel layer CH. Although not shown in detail in the drawings, each of the first memory pattern ML1 and the second memory pattern ML2 may include a first blocking insulating layer that extends along a surface of the channel layer CH, a data storage layer between the first blocking insulating layer and the channel layer CH, and a tunnel insulating layer between the data storage layer and the channel layer CH. The tunnel insulating layer may include an insulating material through which charges can tunnel. In an embodiment, the tunnel insulating layer may include a silicon oxide layer. The data storage layer may include an insulating material in which charges can be trapped. In an embodiment, the data storage layer may include a nitride layer. The first blocking insulating layer may include a silicon oxide layer. Although not shown in the drawings, a second blocking insulating layer may be additionally disposed between the first blocking insulating layer and each conductive pattern CP. The second blocking insulating layer may include oxide with a dielectric constant that is higher than that of the first blocking insulating layer. In an embodiment, the second blocking insulating layer may include metal oxide, such as an aluminum oxide layer. The second blocking insulating layer may extend between the conductive pattern CP and the interlayer insulating layer ILD, which are adjacent to each other in the third direction D3.

According to the above-described structure, the memory cell MC shown in FIG. 3 may be defined at an intersection portion of the conductive pattern CP that is used as the word line and the channel layer CH. In addition, the drain select transistor DST, shown in FIG. 3, may be defined at an intersection portion of the conductive pattern CP that is used as the first drain select line or the second drain select line and the channel layer CH. In addition, the source select transistor SST, shown in FIG. 3, may be defined at an intersection portion of the conductive pattern CP that is used as the source select line and the channel layer CH. The source select transistor SST, the memory cell MC, and the drain select transistor DST may be connected in series by the channel layer CH and may constitute the memory cell string CS.

The plurality of vertical structures 270 may extend parallel to each other, and extend in the first direction D1. The plurality of vertical structures 270 and the plurality of slits 261 may penetrate the upper insulating layer 253 and may extend on the same level on which the plurality of first line parts L1 are disposed. At least one of the plurality of first line parts L1 may extend along a sidewall of at least one of the plurality of vertical structures 270. In an embodiment, the plurality of first line parts L1 may extend along the sidewalls of the plurality of vertical structures 270. The plurality of first line parts L1 may protrude farther than the plurality of slits 261 and the plurality of vertical structures 270 in the first direction D1.

Each vertical structure 270 may include a spacer insulating layer 271 and a conductive source contact 273. The spacer insulating layer 271 may extend along a sidewall of the slit 261. The conductive source contact 273 may be insulated from the plurality of conductive patterns CP by the spacer insulating layer 271. The conductive source contact 273 may be connected to the source pattern 260S of the source structure 260. In an embodiment, the conductive source contact 273 may extend to be in contact with the second doped semiconductor layer 263. However, the configuration of the vertical structure 270 is not limited thereto and may be variously changed. For example, the vertical structure 270 may be configured with an insulating material that completely fills the slit 261.

The internal insulating layer 255 may be disposed on the internal source insulating pattern 230A, and penetrate at least one gate stack structure GST. The internal insulating layer 255 may penetrate the contact region CTA of the gate stack structure GST. The internal insulating layer 255 may include an end that extends to penetrate the upper insulating layer 253. The upper contact 277 may penetrate the internal insulating layer 255 to be in contact with the lower contact 237C. The upper contact 277 may be connected to the peripheral circuit structure 190 via the lower contact 237C and the interconnection 220.

In accordance with the embodiment of the present disclosure, the plurality of first line parts L1 may be connected to the second line part L2 that intersects with the plurality of first line parts L1, and thus charges that are generated during a process of manufacturing the semiconductor memory device may be dispersed in the second line part L2. Accordingly, a process defect may be reduced, which occurs when the charges that are generated during the process of manufacturing the semiconductor memory device are concentrated on an end of the first line part L1.

The width of the first line part L1 in the second direction D2 may be controlled narrow so as to narrow the distance between the cell plugs CPL adjacent to each other in the second direction D2. Because the second line part L2 is defined at the outside of the cell array region CAR in which the cell plugs CPL are disposed, the second line part L2 may be formed to be wider than the first line part L1 without limitation caused by the distance between the cell plugs CPL. Accordingly, the dispersion efficiency of charges that are generated during the process of manufacturing the semiconductor memory device may be improved through the second line part L2 that is formed relatively wide.

FIG. 6 is a sectional view of the semiconductor memory device taken along line IIe-IIe' shown in FIG. 4B. A sectional view taken along line IIa-IIa' shown in FIG. 4B, a sectional view taken along line IIb-IIb' shown in FIG. 4B, a sectional view taken along line IIc-IIc' shown in FIG. 4B, and a sectional view taken along line IId-IId' shown in FIG. 4B are respectively identical to those shown in FIGS. 5A to 5D.

Referring to FIGS. 4B and 6, the discharge impurity region 201DI that is formed in the chip edge region EG1 of the semiconductor substrate 201 may be connected to the discharge interconnection 220D with the discharge line 221DI. The discharge line 221DI may be a line-shaped conductive pattern (e.g., 221F), among the plurality of conductive patterns, constituting the interconnection 220 as described with reference to FIGS. 5A to 5E.

The outer source insulating pattern 230B and the upper insulating layer 253 may extend to overlap with the chip edge region EG1. The trench 315T, in which the metal pattern 235' is formed, may extend into the outer source insulating pattern 230B. The third line part L3 of the metal pattern 235' may be formed in the trench 315T and the first line part L1, and the second line part L2 of the metal pattern 235' may be formed in the trench 315T.

The second line part L2 may be formed in a partial region of the trench 315T that is defined in the dummy pattern 260D. In addition, the second line part L2 may extend into the outer source insulating pattern 230B toward the third line part L3. As described with reference to FIGS. 5A to 5E, the dummy pattern 260D may include the first doped semiconductor layer 231, the first protective layer 301, and the sacrificial layer 303. As shown in FIGS. 5C and 5D, the dummy pattern 260D may include the second protective layer 305 and the upper semiconductor layer 233. Because the upper semiconductor layer 233 and the second protective layer 305 are penetrated by the trench 315T, the upper semiconductor layer 233 and the second protective layer 305 are not shown in FIG. 6.

The third line part L3 of the metal pattern 235' may be penetrated by the second discharge contact 237B and may be in contact with the second discharge contact 237B. The second discharge contact 237B may penetrate the outer source insulating pattern 230B. The second discharge contact 237B may extend to be in contact with the discharge interconnection 220D. In an embodiment, the second discharge contact 237B may extend to be in contact with the discharge line 221DI of the discharge interconnection 220D. The second discharge contact 237B may be connected to the discharge impurity region 201DI via the discharge interconnection 220D. The source structure 260 may be connected to the discharge impurity region 201DI via the second line part L2 of the metal pattern 235', the second discharge contact 237B, and the discharge interconnection 220D.

In accordance with the embodiment of the present disclosure, as described with reference to FIGS. 5A to 5E, the second line part L2 may improve the dispersion efficiency of charges generated during the process of manufacturing the semiconductor memory device. The dispersion efficiency of charges may be further improved by the third line part L3. The second line part L2 and the third line part L3 may be widely formed without limitation caused by the width of the slit 261. Accordingly, the widths of the second line part L2 and the third line part L3 may be formed wider than that of the first line part L1, so that the dispersion efficiency of charges may be improved.

Hereinafter, a manufacturing method of a semiconductor memory device in accordance with an embodiment of the present disclosure will be described.

FIGS. 7A, 7B, 7C, 7D, 7E, 8A, 8B, 8C, 8D, 8E, 9, 10A, 10B, 11A, 11B, 11C, 11D, 11E, 12, 13A, 13B, 13C, 13D, 14A, 14B, 14C, 14D, 15A, 15B, 15C, 16A, 16B, 16C, 16D, 16E, 17A, 17B, 17C, and 17D are sectional views illustrating a manufacturing method of the semiconductor memory device shown in FIGS. 4A and 5A to 5E. Hereinafter, overlapping descriptions of components identical to those shown in FIGS. 4A and 5A to 5E will be omitted.

FIGS. 7A, 7B, 7C, 7D, and 7E are process sectional views illustrating a process of forming a source stack structure and a process of forming source insulating patterns. The process sectional views shown in FIGS. 7A to 7E may respectively correspond to the sectional views taken along the lines Ia-Ia', Ib-Ib', Ic-Ic', Id-Id', and Ie-Ie', shown in FIG. 4A.

Referring to FIGS. 7A to 7E, a source stack structure 300 may be formed on a lower structure 200. The lower structure 200 may include a peripheral circuit structure 190, a lower insulating structure 211 that covers the peripheral circuit structure 190, and a plurality of interconnections 220 that are buried in the lower insulating structure 211.

The peripheral circuit structure 190 may include a semiconductor substrate 201, and a first transistor TR1, a second transistor TR2, and a discharge impurity region 201DI, which are formed in the semiconductor substrate 201. The semiconductor substrate 201 may include a first region AR1, a second region AR2, and a chip edge region (e.g., EG1) as described with reference to FIG. 4A. Each of the first transistor TR1 and the second transistor TR2 may include a gate insulating layer 205, a gate electrode 207, and junctions 201J as described with reference to FIGS. 5A to 5E. The junctions 201J and the discharge impurity region 201DI may be formed in the semiconductor substrate 201.

A plurality of isolation layers 203 may be buried in the semiconductor substrate 201. The isolation layer 203 may allow adjacent junctions 201J to be insulated from each other or may allow at least one junction 201J and the discharge impurity region 201DI that are adjacent thereto to be insulated from each other.

The lower insulating structure 211 may be formed to cover the first transistor TR1, the second transistor TR2, and the semiconductor substrate 201. Each interconnection 220 may include a plurality of conductive patterns 221A, 221B, 221C, 221D, 221E, and 221F, which are buried in the lower insulating structure 211 and are connected to each other, as described with reference to FIGS. 5A to 5E. The plurality of interconnections 220 may include a discharge interconnection 220D connected to the discharge impurity region 201D1. Conductive patterns that constitute the discharge interconnection 220D may include a discharge line 221DI.

The process of forming the source stack structure 300 may include a process of sequentially stacking, on the lower structure 200, a first doped semiconductor layer 231, a first protective layer 301, a sacrificial layer 303, a second protective layer 305, and an upper semiconductor layer 233, and a process of forming a first opening 311A and a second opening 311B.

The sacrificial layer 303 may include an undoped semiconductor layer. For example, the sacrificial layer 303 may include undoped silicon. The first doped semiconductor layer 231 and the upper semiconductor layer 233 may include an impurity of a conductivity type that is different from that of the discharge impurity region 201DI. In an embodiment, the discharge impurity region 201DI may include a p-type impurity, and the first doped semiconductor layer 231 and the upper semiconductor layer 233 may include an n-type impurity. The first protective layer 301 and the second protective layer 305 may include a material with an etching selectivity that is different from that of the sacrificial layer 303. In an embodiment, the first protective layer 301 and the second protective layer 305 may include an oxide layer.

The first opening 311A and the second opening 311B may be formed by etching the upper semiconductor layer 233, the second protective layer 305, the sacrificial layer 303, the first protective layer 301, and the first doped semiconductor layer 231 such that the lower insulating structure 211 is exposed. The first opening 311A may overlap with at least one of the interconnections 220 that overlap with the first region AR1 of the semiconductor substrate 201. In an embodiment, the first opening 311A may overlap with the interconnection 220 that is connected to the junction 201J of the second transistor TR2. The second opening 311B may overlap with the chip edge region EG1 and the second region AR2 of the semiconductor substrate 201.

The source stack structure 300 may be defined by the first doped semiconductor layer 231, the first protective layer 301, the sacrificial layer 303, the second protective layer 305, and the upper semiconductor layer 233 that are remaining after the first opening 311A and the second opening 311B are formed.

As described above, the source stack structure 300 may be formed to open at least one of the interconnections 220 that overlap with the first region AR1 of the semiconductor substrate 201 and the chip edge region EG1 and the second region AR2 of the semiconductor substrate 201.

Subsequently, source insulating patterns 230A and 230B may be formed in the first opening 311A and the second opening 311B, respectively. The source insulating patterns 230A and 230B may include an internal source insulating pattern 230A that is formed in the first opening 311A and an outer source insulating pattern 230B that is formed in the second opening 311B.

FIGS. 8A, 8B, 8C, 8D, and 8E are process sectional views illustrating a process of forming a metal pattern. The process sectional views, shown in FIGS. 8A to 8E, may respectively correspond to those taken along the lines Ia-Ia', Ib-Ib', Ic-Ic', Id-Id', and Ie-Ie', shown in FIG. 4A Referring to FIGS. 8A to 8E, a trench 315T may be formed by etching the upper semiconductor layer 233 of the source stack structure 300. The trench 315T may penetrate the upper semiconductor layer 233, and extend to penetrate the second protective layer 305.

Subsequently, a metal pattern 235 may be formed in the trench 315T. The metal pattern 235 may include a metal with a work function that is higher than that of the upper semiconductor layer 233. In an embodiment, the metal pattern 235 may include tungsten. Before the metal pattern 235 including the tungsten is formed, a metal barrier layer, such as a titanium nitride layer, may be further formed.

Figure 9:
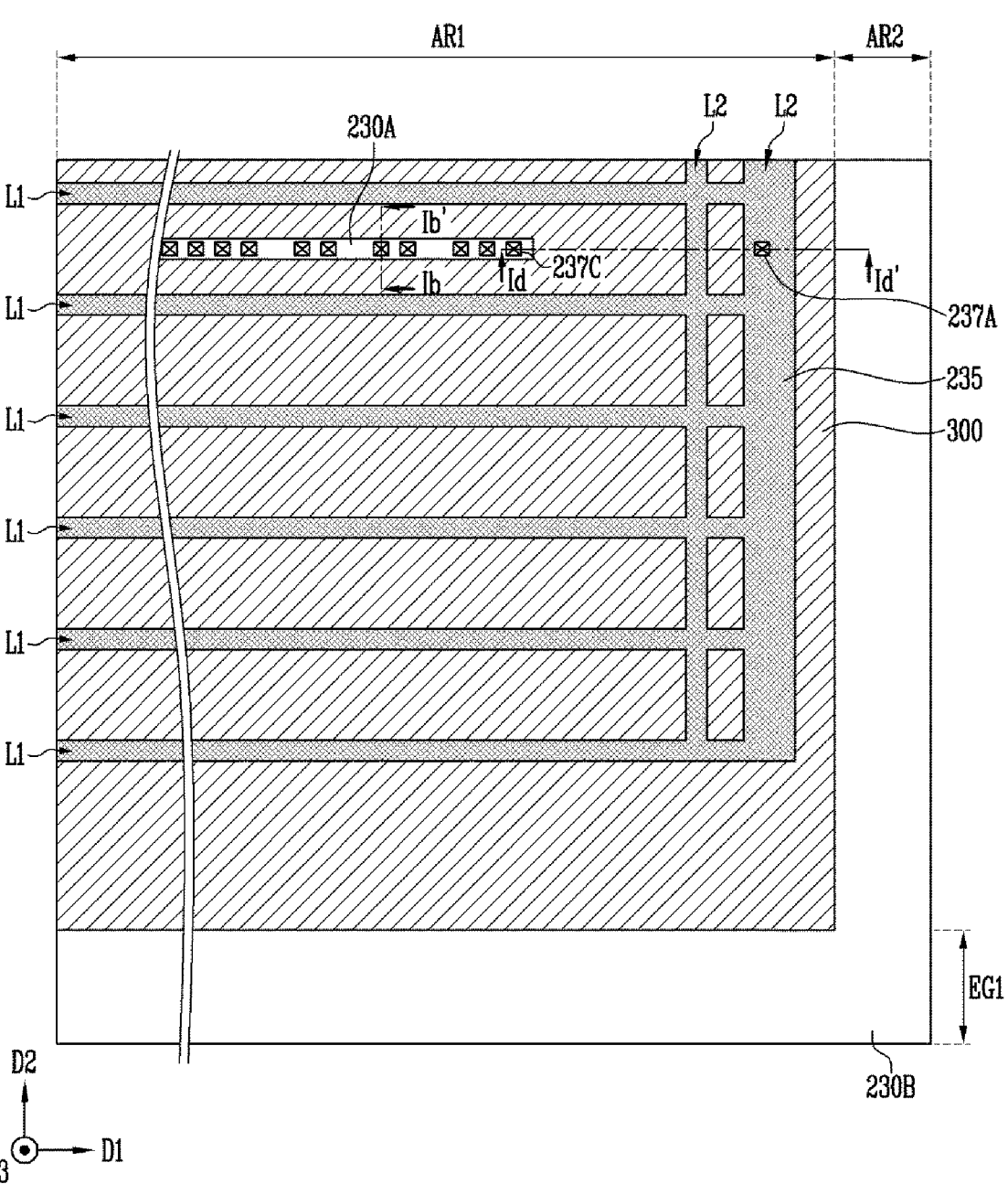
Figure 10A:
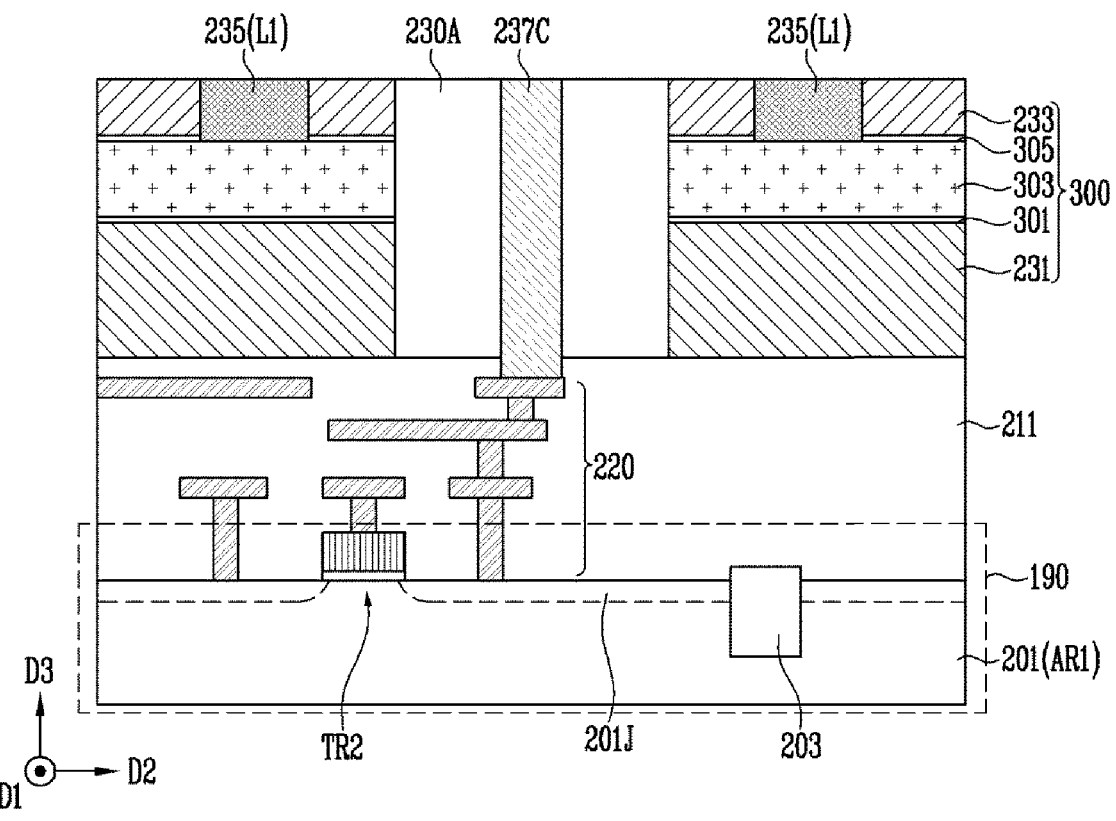
Figure 10B:
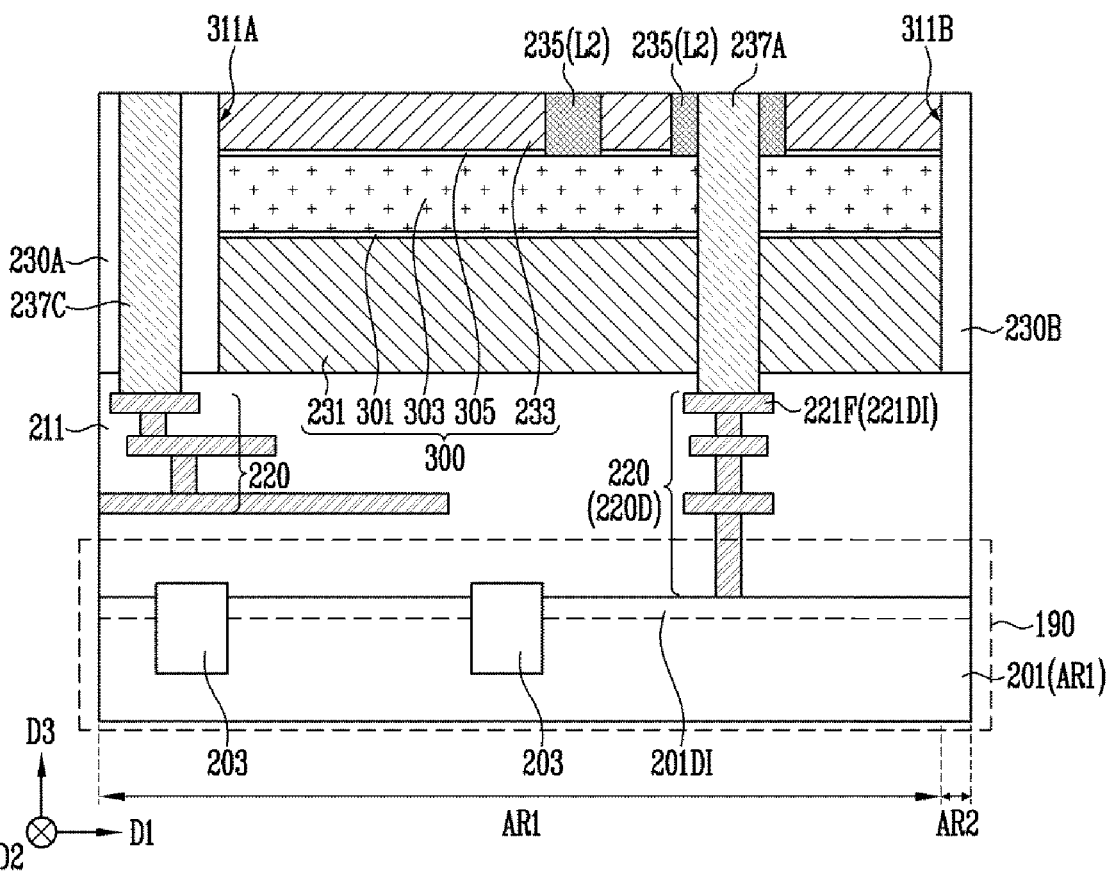
Figure 11A:
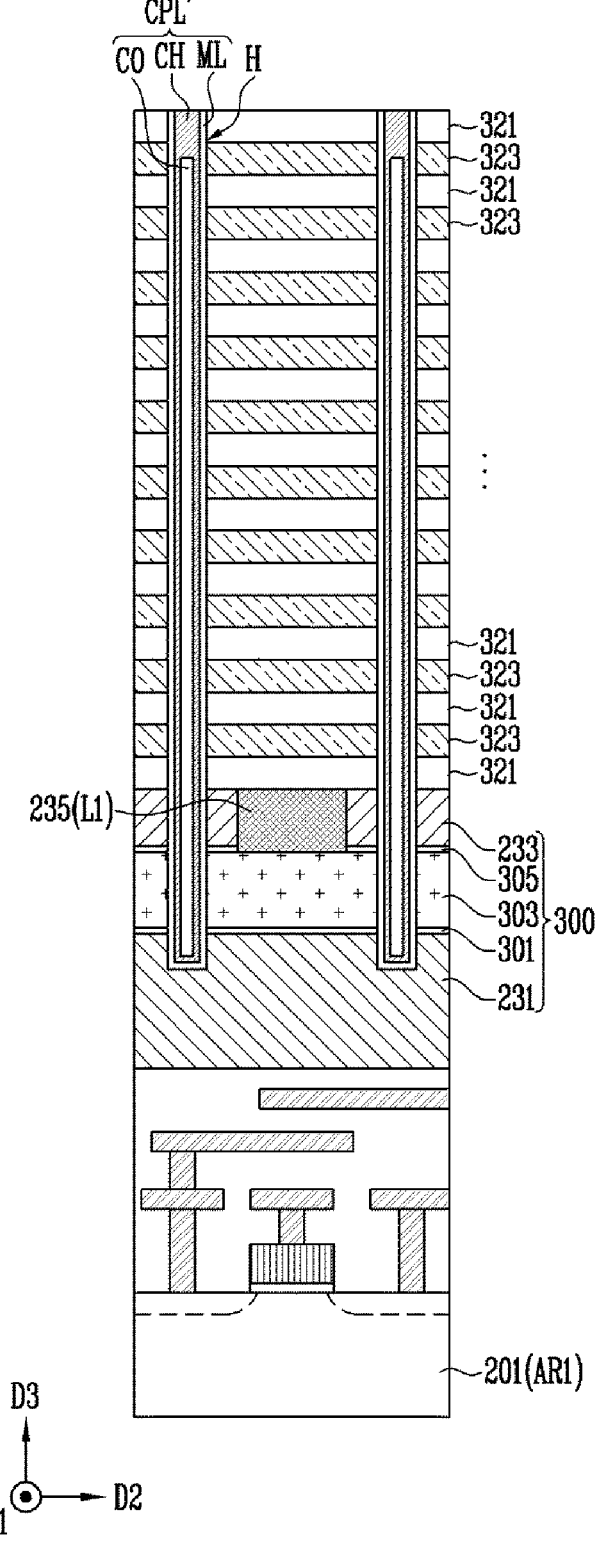
Figure 11B:
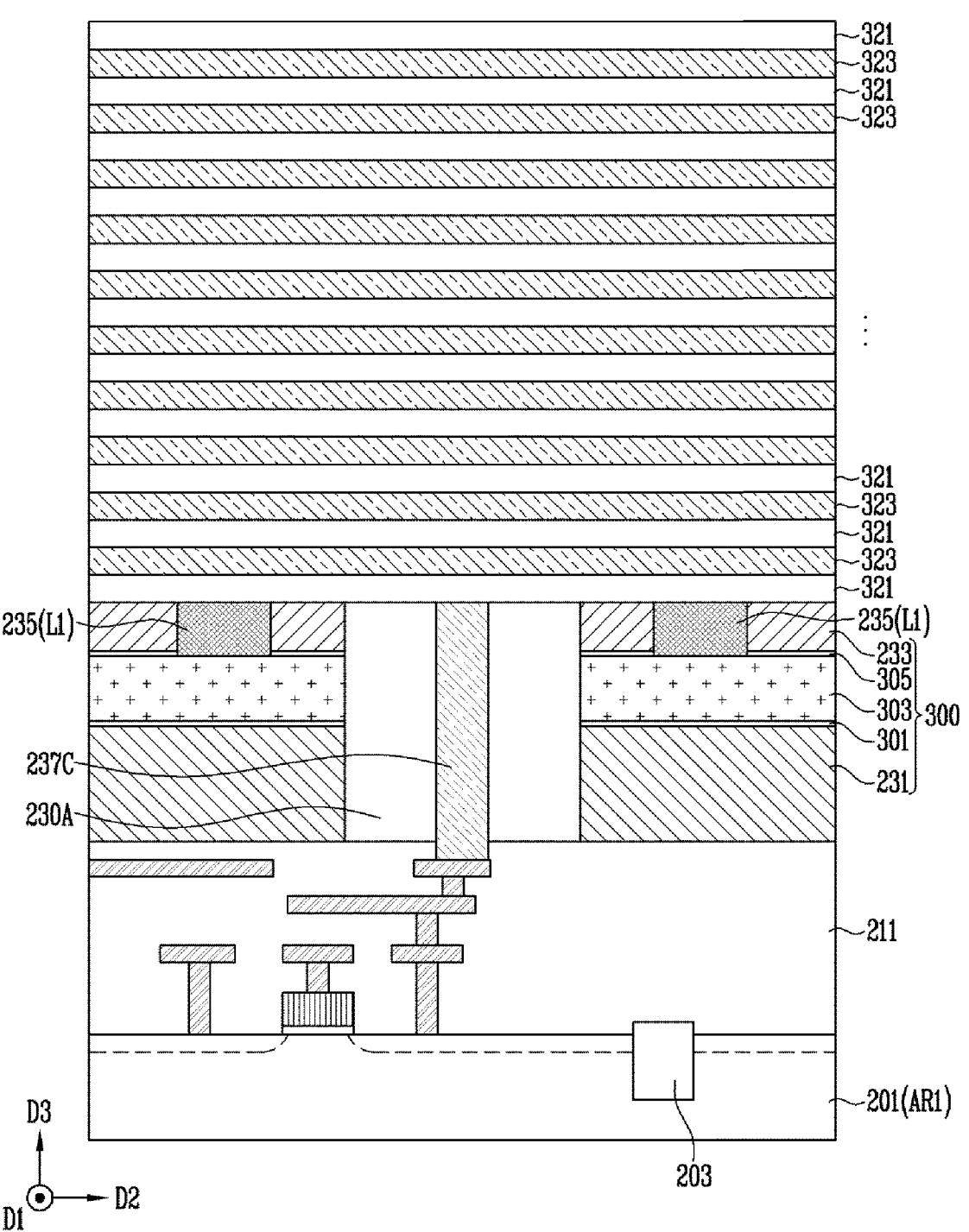
Figure 11C:
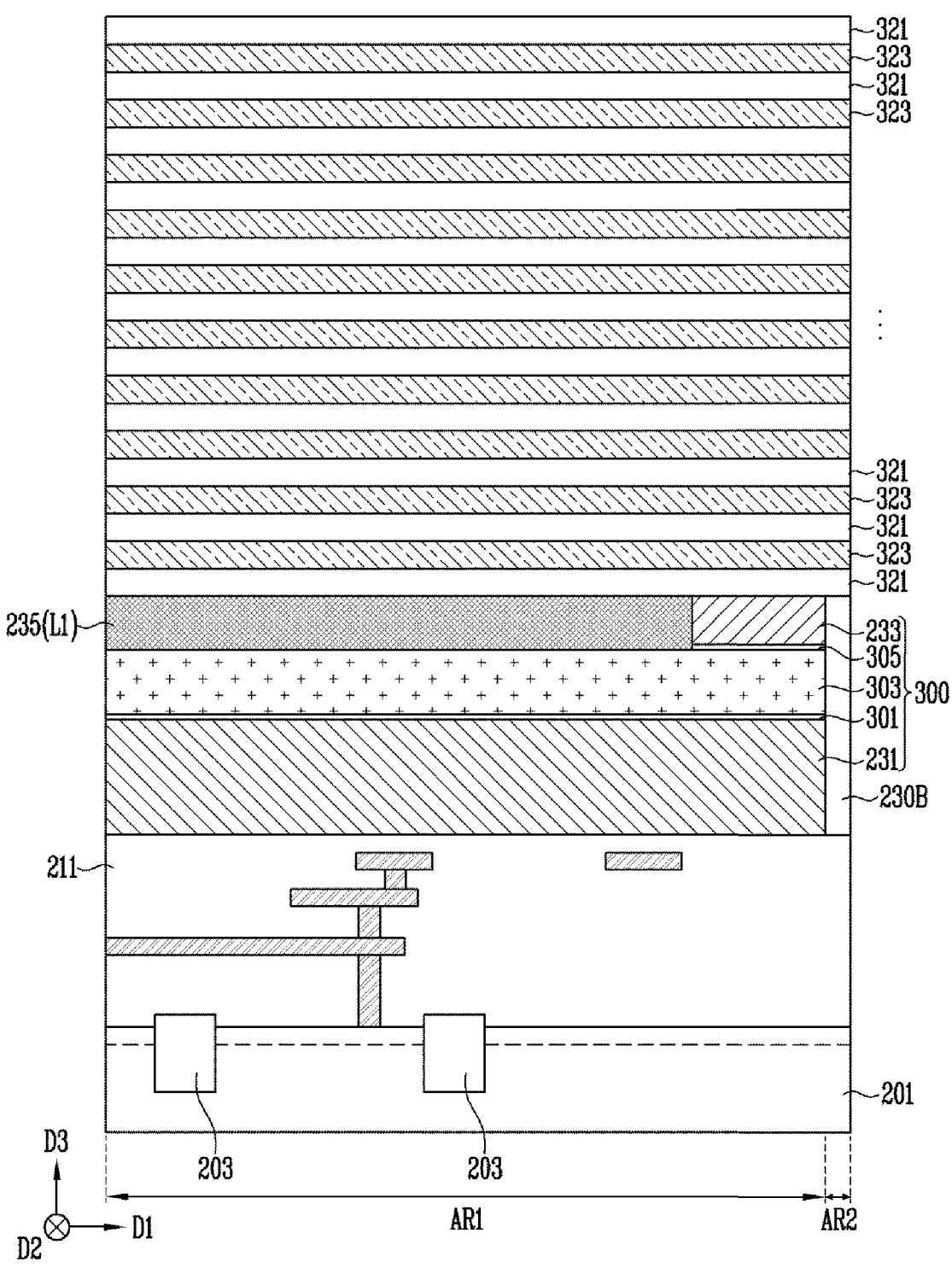
Figure 11D:
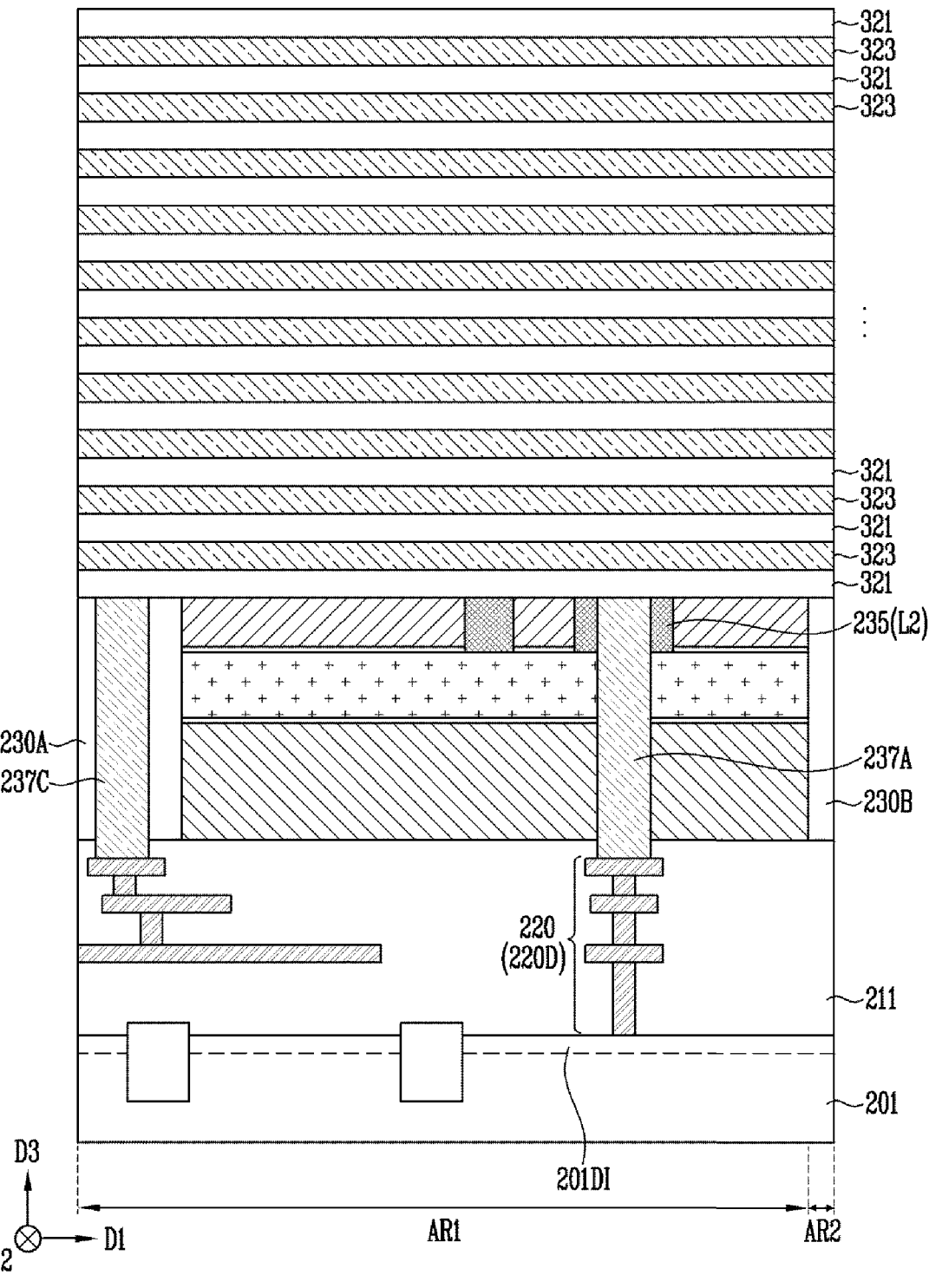
Figure 11E:
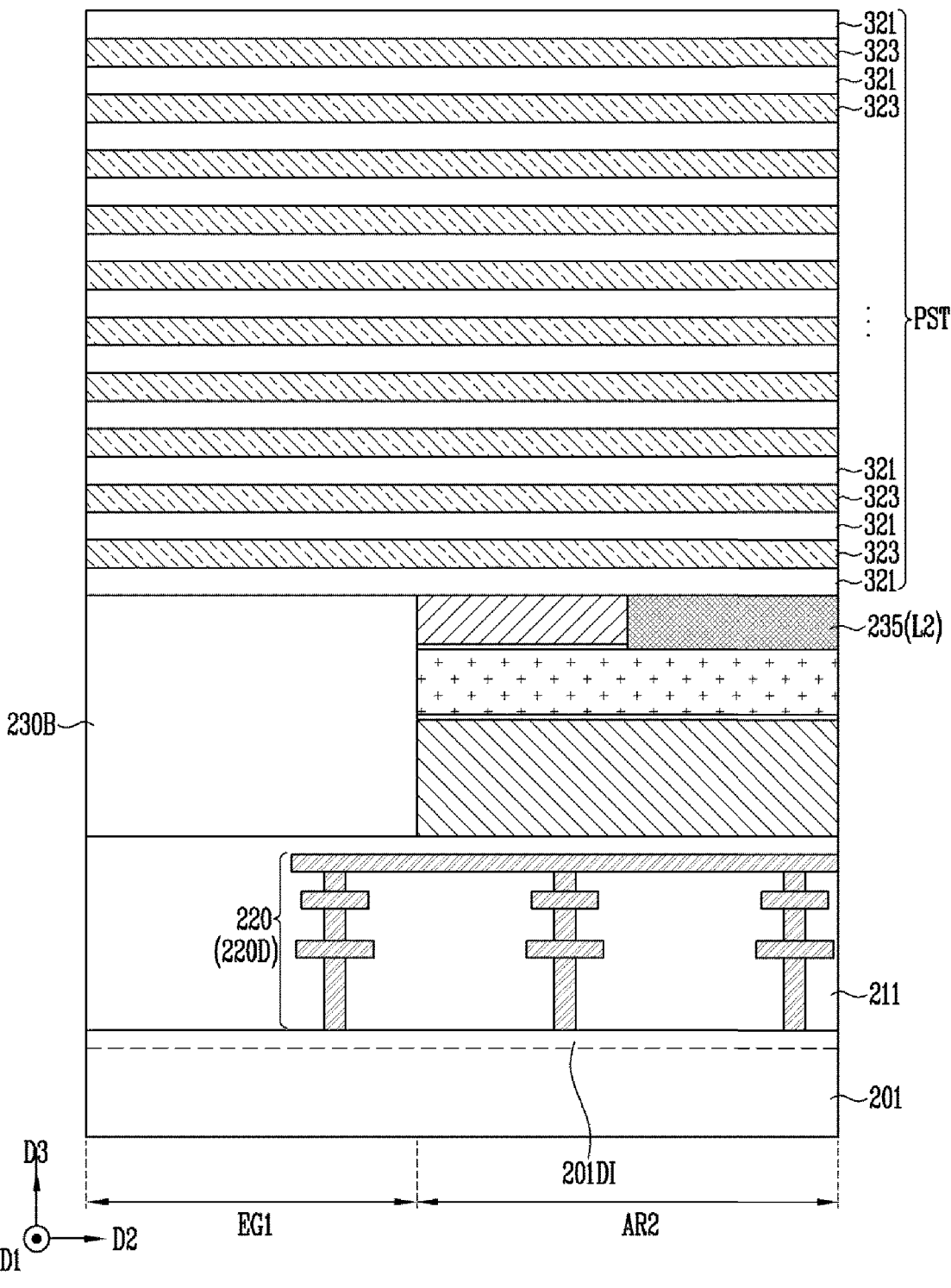

FIG. 9 is a plan view illustrating a process of forming a lower contact and a first discharge contact. FIGS. 10A and 10B are process sectional views taken along lines Ib-Ib' and Id-Id' shown in FIG. 9.

Referring to FIGS. 9, 10A, and 10B, contact holes that penetrate the internal source insulating pattern 230A and a second line part L2 of the metal pattern 235 may be formed through an etching process by using, as an etching barrier, a mask pattern (not shown) with holes that open the internal source insulating pattern 230A and the second line part L2 of the metal pattern 235. A contact hole that penetrates the source insulating pattern 230A may extend into the lower insulating structure 211 to expose the interconnection 220. A contact hole that penetrates the second line part L2 may extend to penetrate the sacrificial layer 303, the first protective layer 301, and the first doped semiconductor layer 231 of the source stack structure 300. Also, the contact hole that penetrates the second line part L2 may extend into the lower insulating structure 211 to expose the discharge line 221DI of the discharge interconnection 220D.

Subsequently, a lower contact 237C and a first discharge contact 237A may be formed by forming a conductive material in the contact holes. The lower contact 237C may penetrate the source insulating pattern 230A and may extend into the lower insulating structure 211 to be in contact with the interconnection 220. The first discharge contact 237A may penetrate the sacrificial layer 303, the first protective layer 301, and the first doped semiconductor layer 231 of the source stack structure 300 and the second line part L2, and the first discharge contact 237A may extend into the lower insulating structure 211 to be in contact with the discharge line 221DI.

FIGS. 11A, 11B, 11C, 11D, and 11E are process sectional views illustrating a process of stacking a plurality of first material layers and a plurality of second material layers and a process of forming a preliminary cell plug. The process sectional views, shown in FIGS. 11A to 11E, may respectively correspond to the sectional views taken along the lines Ia-Ia', Ib-Ib', Ic-Ic', Id-Id', and Ie-Ie', shown in FIG. 4A.

Referring to FIGS. 11A to 11E, a plurality of first material layers 321 and a plurality of second material layers 323 may be alternately stacked on the source stack structure 300. The plurality of first material layers 321 and the plurality of second material layers 323 may extend to cover the metal pattern 235, the lower contact 237C, the first discharge contact 237A, the internal source insulating pattern 230A, and the outer source insulating pattern 230B.

Each first material layer 321 may be provided as the interlayer insulating layer ILD, shown in FIGS. 5A to 5E. Each second material layer 323 may include a material with an etching selectivity with respect to the first material layer 321. In an embodiment, the first material layer 321 may include oxide, such as a silicon oxide layer, and the second material layer 323 may include a nitride layer, such as a silicon nitride layer. An etch selectivity of the metal pattern 235 with respect to each of the first material layer 321 and the second material layer 323 may be higher than that of the source stack structure 300 with respect to each of the first material layer 321 and the second material layer 323.

A preliminary cell plug CPL' may be respectively disposed at both sides of a first line part L1 of the metal pattern 235, which face the second direction D2 that intersects with the first line part L1 and the direction opposite to the second direction D2. The process of forming the preliminary cell plug CPL' may include a process of forming a channel hole H that penetrates the plurality of first material layers 321 and the plurality of second material layers 323 at both sides of the first line part L1, a process of forming a memory layer ML along a surface of the channel hole H, a process of forming a semiconductor layer along a surface of the memory layer ML, and a process of forming a core insulating layer CO and a doped semiconductor layer in a central region of the channel hole H that is opened by the semiconductor layer. The semiconductor layer and the doped semiconductor layer in the channel hole H may constitute a channel layer CH. The memory layer ML may include a blocking insulating layer, a data storage layer, and a tunnel insulating layer, like the first memory pattern ML1 and the second memory pattern ML2, which are described with reference to FIGS. 5A to 5E.

The above-described channel hole H may penetrate the upper semiconductor layer 233, the second protective layer 305, the sacrificial layer 303, and the first protective layer 301 of the source stack structure 300, and the above-described channel hole H may extend into the first doped semiconductor layer 231. The channel layer CH and the memory layer ML of the preliminary cell plug CPL' may penetrate the upper semiconductor layer 233, the second protective layer 305, the sacrificial layer 303, and the first protective layer 301 along the channel hole H, and the channel layer CH and the memory layer ML of the preliminary cell plug CPL' may extend into the first doped semiconductor layer 231.

In order to increase the degree of integration of the semiconductor memory device, the stacked number of first and second material layers 321 and 323 may be increased. As the stacked number of first and second material layers 321 and 323 is increased, high power may be applied to a semiconductor manufacturing apparatus during an etching process of the first and second material layers 321 and 323 for forming the channel hole H. Charges may accumulate in the source stack structure 300 based on the high power that is applied to the semiconductor manufacturing apparatus. While the first and second material layers 321 and 323 are etched, a ground voltage may be applied to the discharge impurity region 201DI of the semiconductor substrate 201 from a supporter (not shown) of the semiconductor manufacturing apparatus. Accordingly, the charges that are accumulated in the source stack structure 300 may be discharged through the discharge impurity region 201D1 via the metal pattern 235 with a work function that is higher than that of the source stack structure 300. Thus, in the present disclosure, an arc phenomenon may be reduced. In accordance with the embodiment of the present disclosure, the discharge path of charges may be dispersed through the second line part L2 of the metal pattern 235 so that the discharge speed and the discharge efficiency may be improved.

Figure 12:
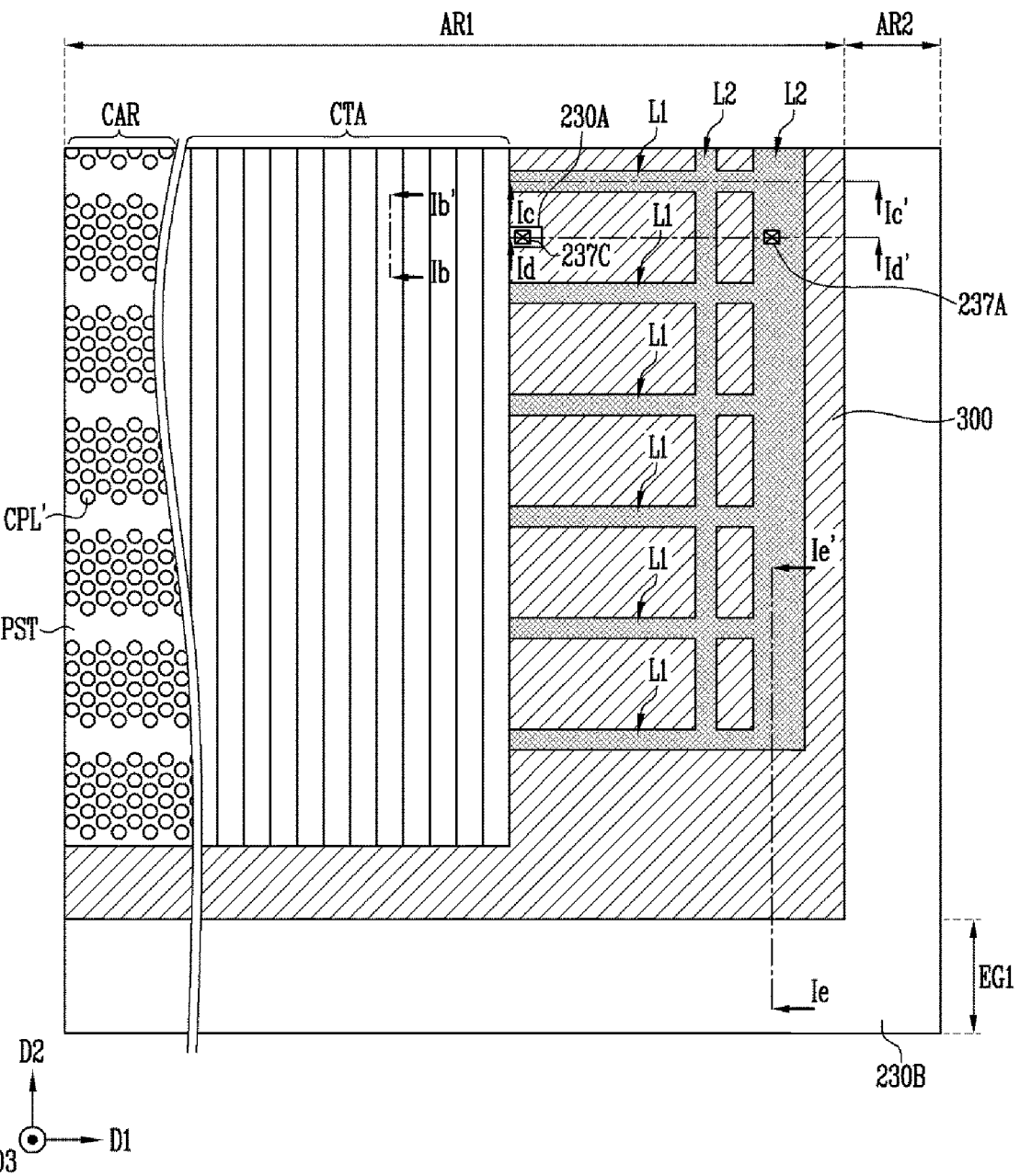
Figure 13A:
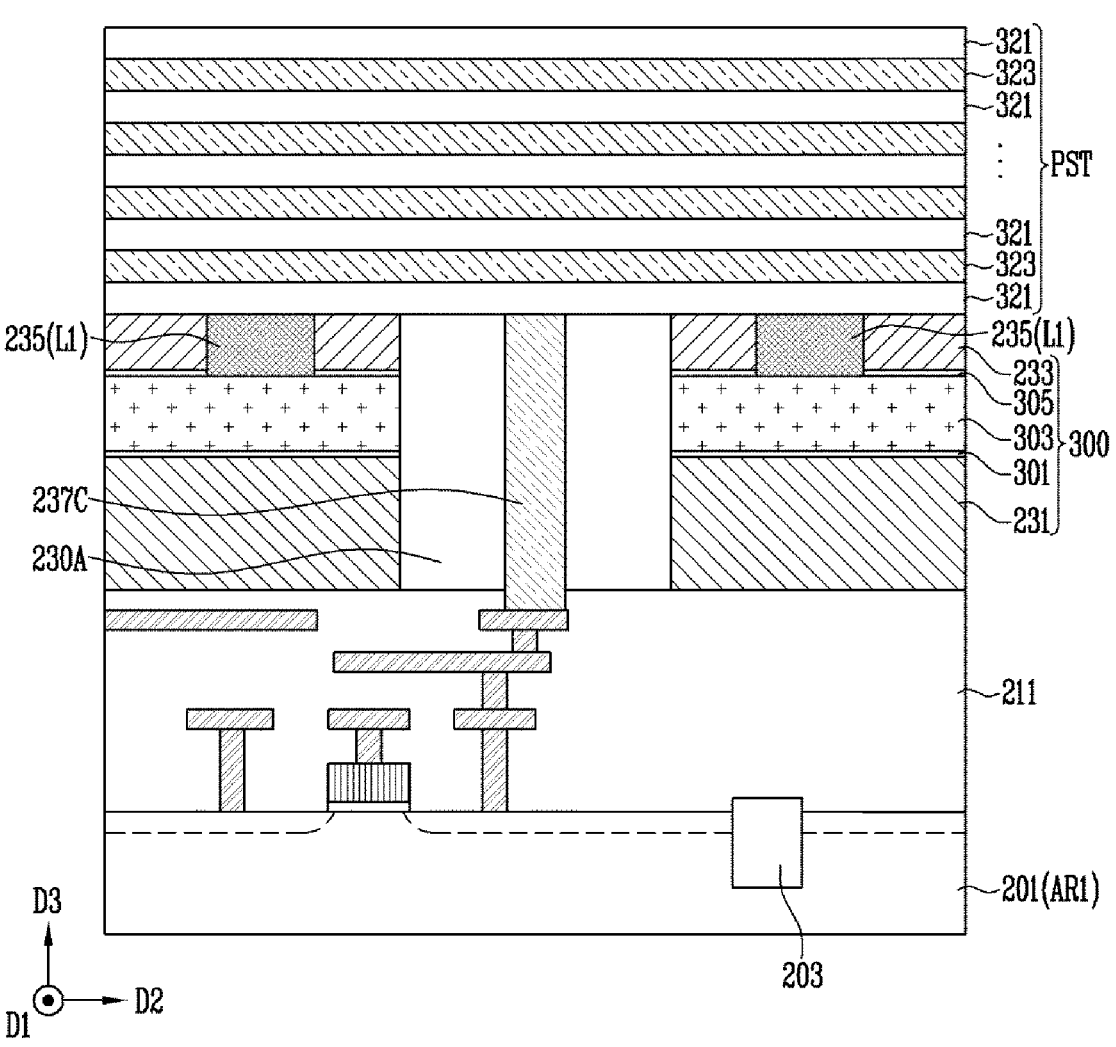
Figure 13B:
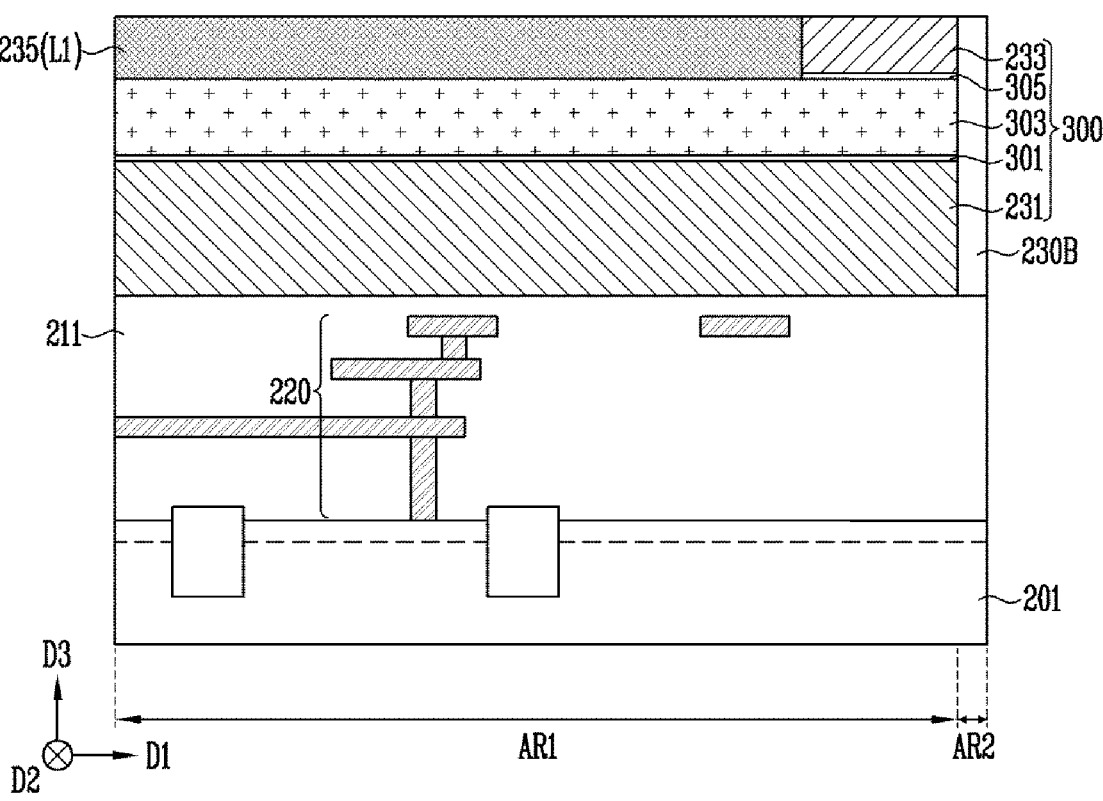
Figure 13C:
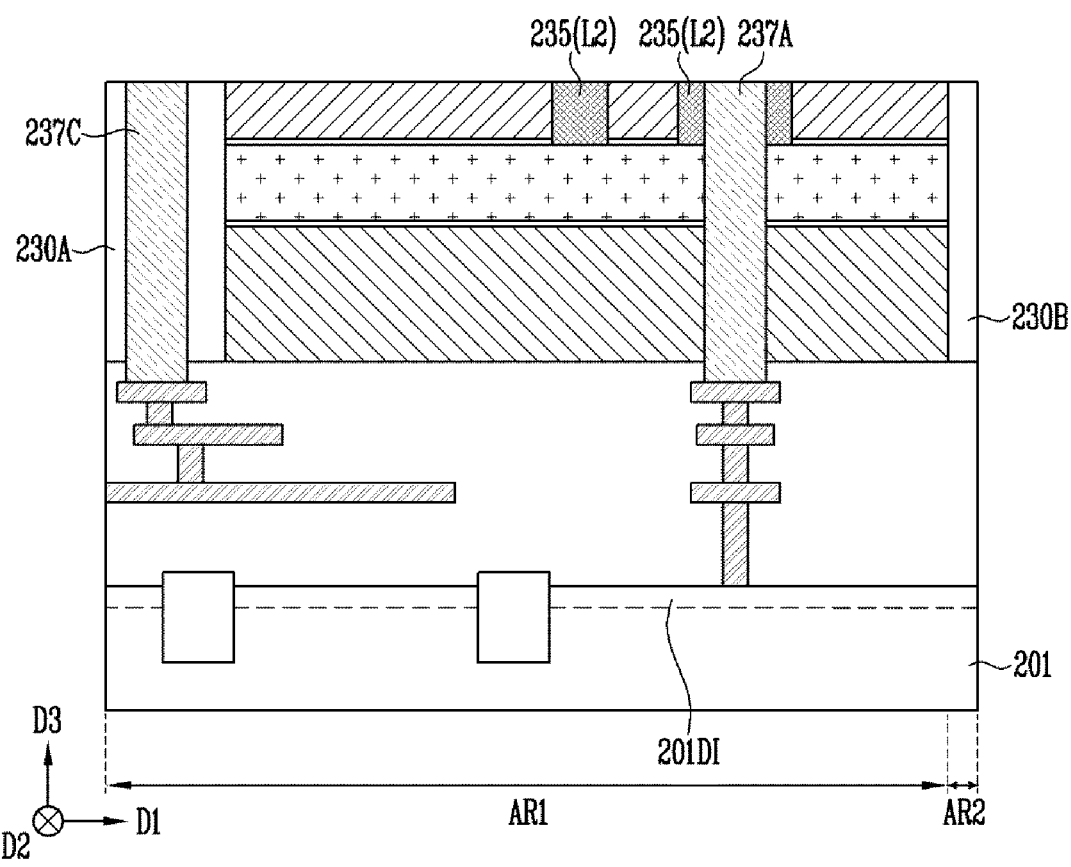
Figure 13D:
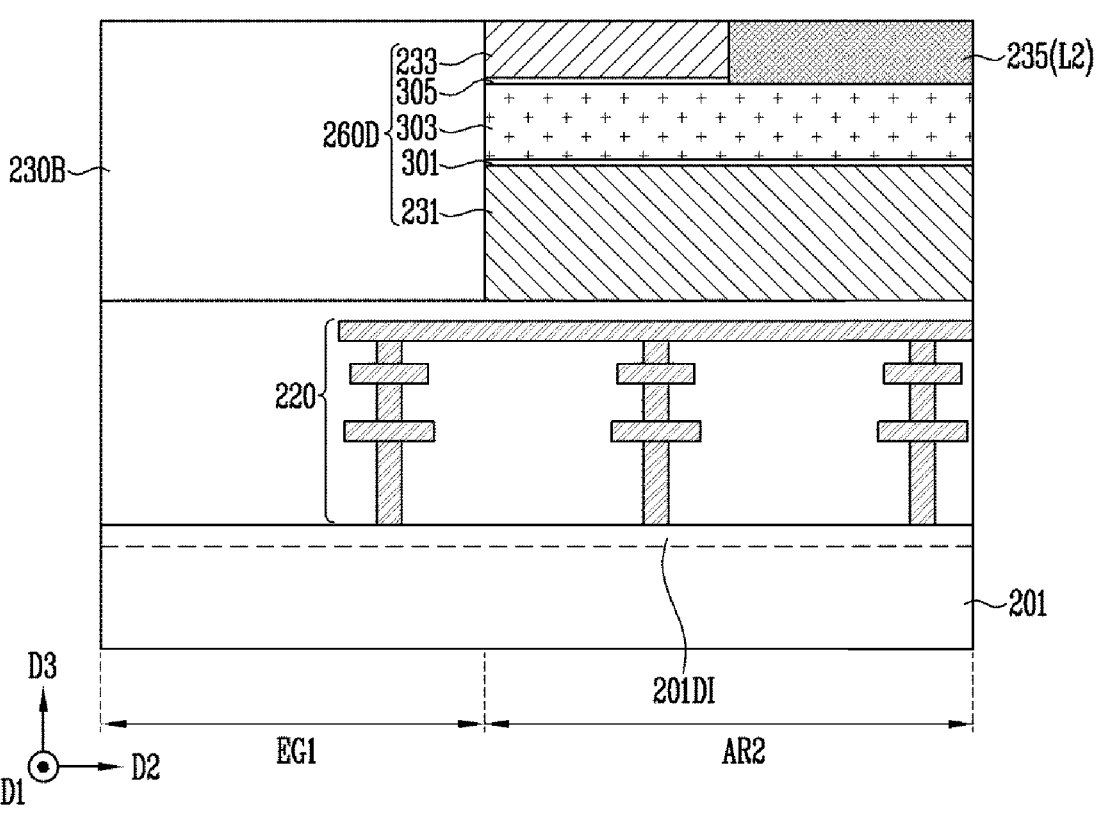

FIG. 12 is a plan view illustrating a process of forming a preliminary gate stack structure. FIGS. 13A, 13B, 13C, and 13D are process sectional views taken along lines Ib-Ib', Ic-Ic', Id-Id', and Ie-Ie', shown in FIG. 12.

Referring to FIGS. 12 and 13A to 13D, the plurality of first material layers 321 and the plurality of second material layers 323 may be etched, thereby forming a preliminary gate stack structure PST. The preliminary gate stack structure PST may be formed to open the second line part L1 and the second region AR2 and the chip edge region EG1 of the semiconductor substrate 201. An end portion of the preliminary gate stack structure PST may be disposed at a distance that is spaced apart from the second line part L2 in the opposite direction of the first direction D1. The preliminary gate stack structure PST may be formed to cover a plurality of first line parts L1 of the metal pattern 235. An end portion of each first line part L1, which is adjacent to the second line part L2, might not overlap with the preliminary gate stack structure PST, but may be exposed.

The preliminary gate stack structure PST may include a cell array region CAR that surrounds the preliminary cell plug CPL' and a contact region CTA that extends toward the second line part L2 from the cell array region CAR. The plurality of first material layers 321 and the plurality of second material layers 323 in the contact region CTA may be etched to form a stepped structure.

An edge of the source stack structure 300 may be exposed by the preliminary gate stack structure PST.

FIGS. 14A, 14B, 14C, and 14D are process sectional views illustrating a process of forming an upper insulating layer and a process of forming an internal insulating layer. The process sectional views, shown in FIGS. 14A to 14D, may correspond to the sectional views taken along the lines Ia-Ia', Ib-Ib', Ic-Ic', Id-Id', and Ie-Ie', shown in FIG. 4A.

Referring to FIGS. 14A to 14D, an upper insulating layer 253 may be formed, which covers the preliminary gate stack structure PST, the metal pattern 235, the internal source insulating pattern 230A, the outer source insulating pattern 230B, the lower contact 237C, and the first discharge contact 237A. Subsequently, an internal insulating layer 255 may be formed, which penetrates a portion of the preliminary gate stack structure PST, overlapping with the internal source insulating pattern 230A. The internal insulating layer 255 may extend to penetrate a portion of the upper insulating layer 253. The internal insulating layer 255 may overlap with the lower contact 237C.

Subsequently, an etching process for forming the drain isolation slit DSI, shown in FIG. 4A, and a process of forming an insulating layer in the drain isolation slit DSI may be performed.

FIGS. 15A, 15B, 15C, 16A, 16B, 16C, 16D, 16E, 17A, 17B, 17C, and 17D are process sectional views illustrating replacement processes and a process of forming a conductive source contact.

Figure 15A:
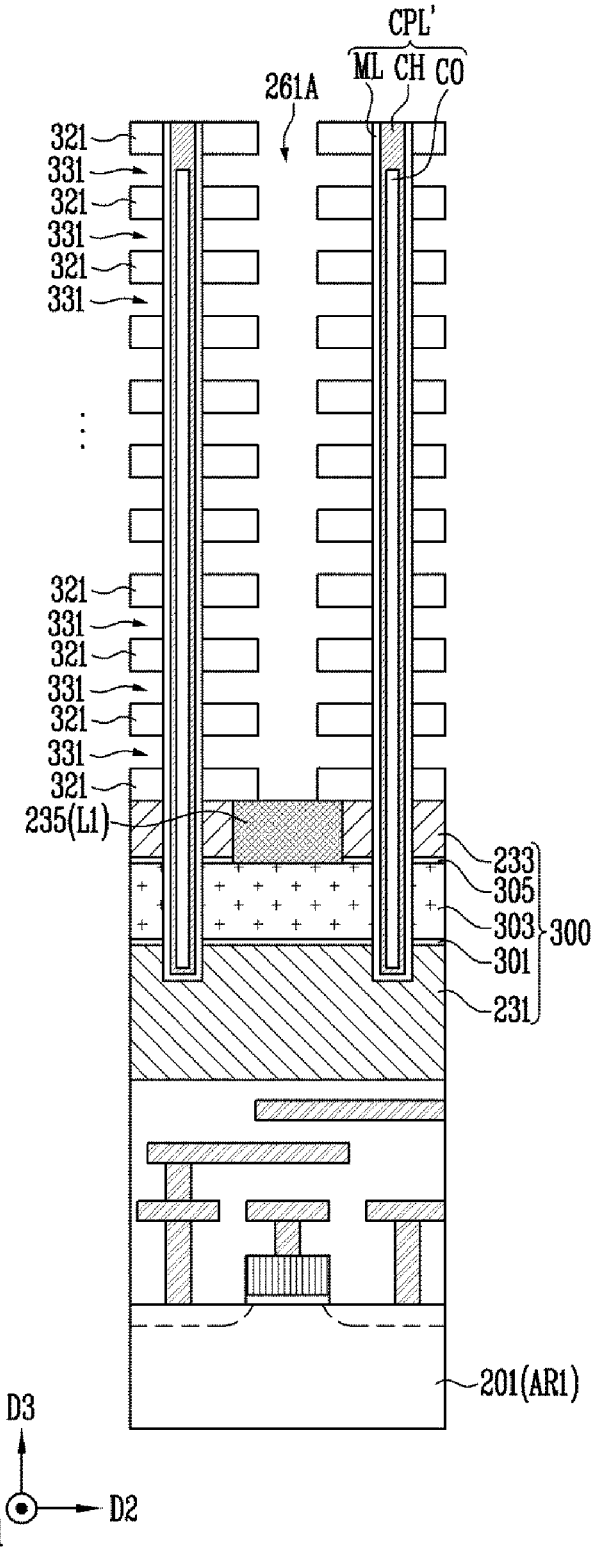
Figure 15B:
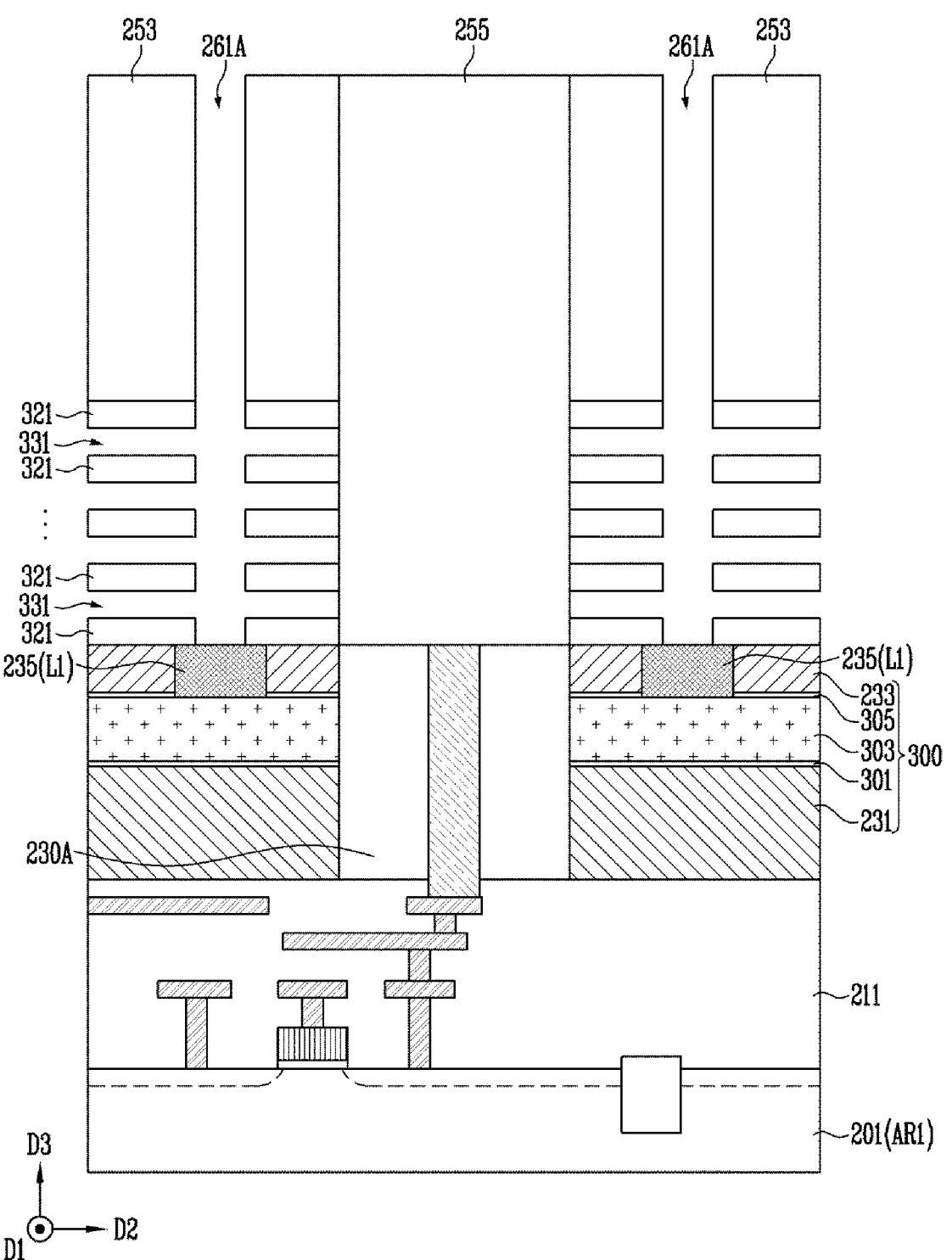
Figure 15C:
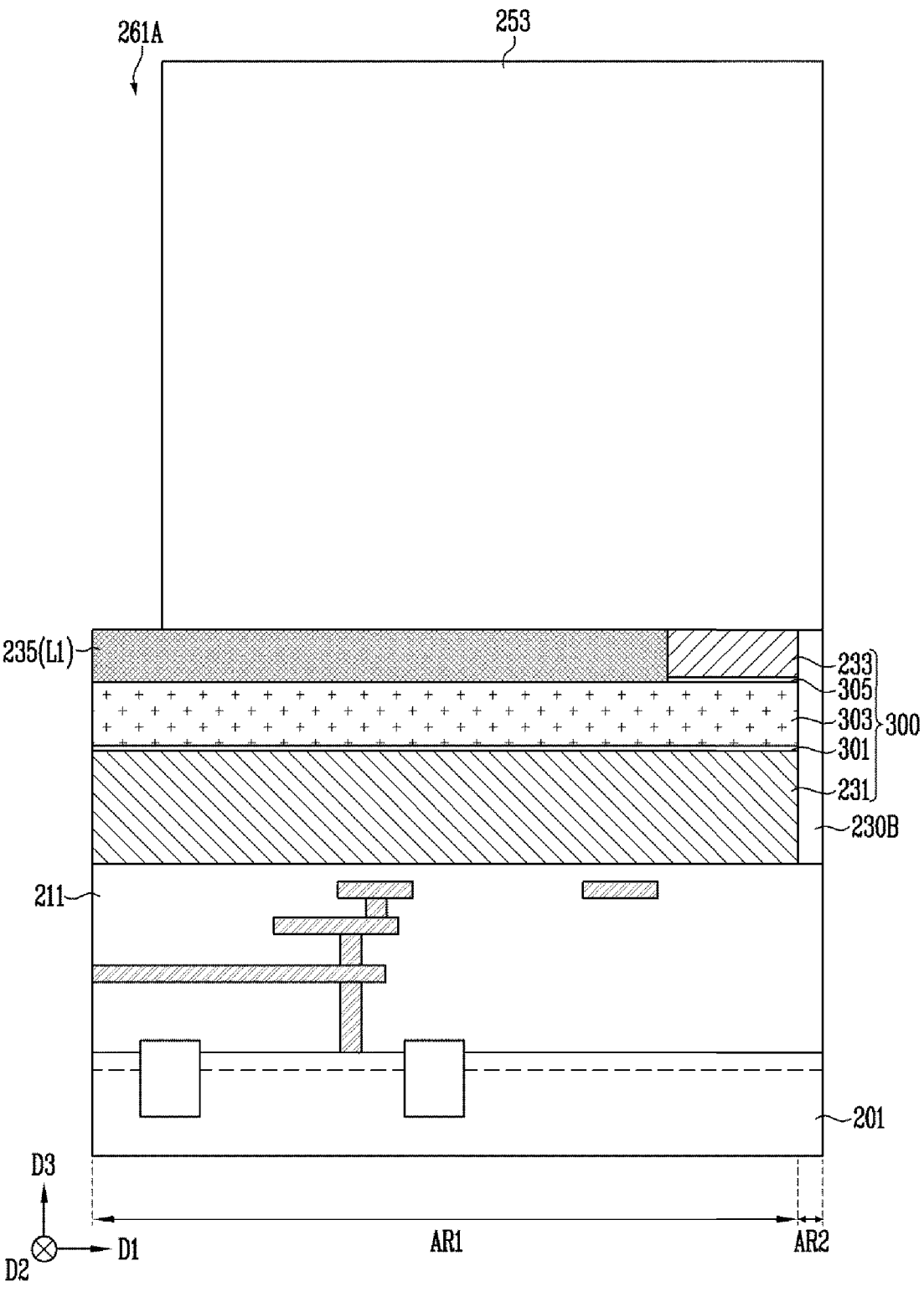

The process sectional views shown in FIGS. 15A, 15B, and 15C may respectively correspond to the sectional views taken along the lines Ia-Ia', Ib-Ib', and Ic-Ic', shown in FIG. 4A.

Figure 14A:
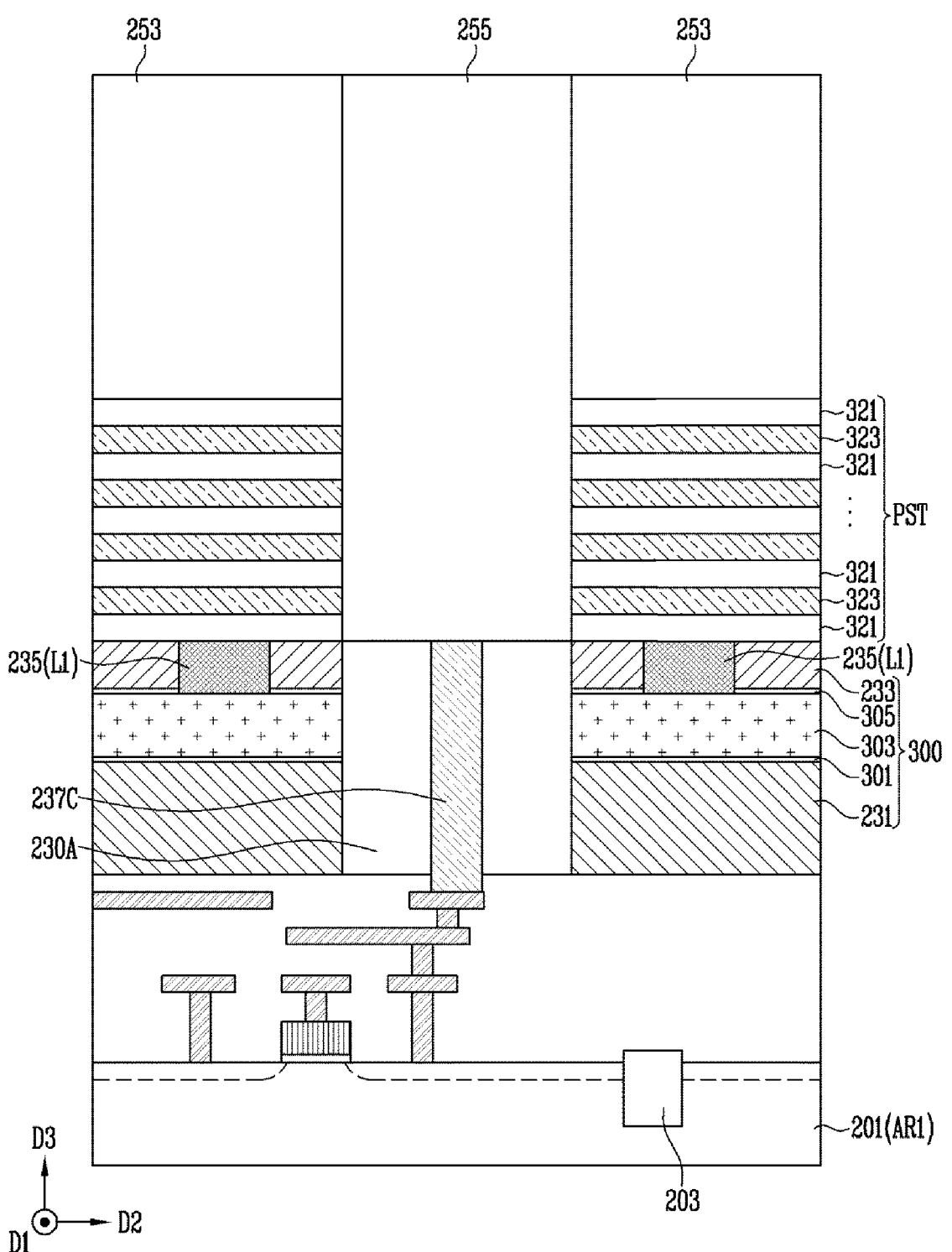
Figure 14B:
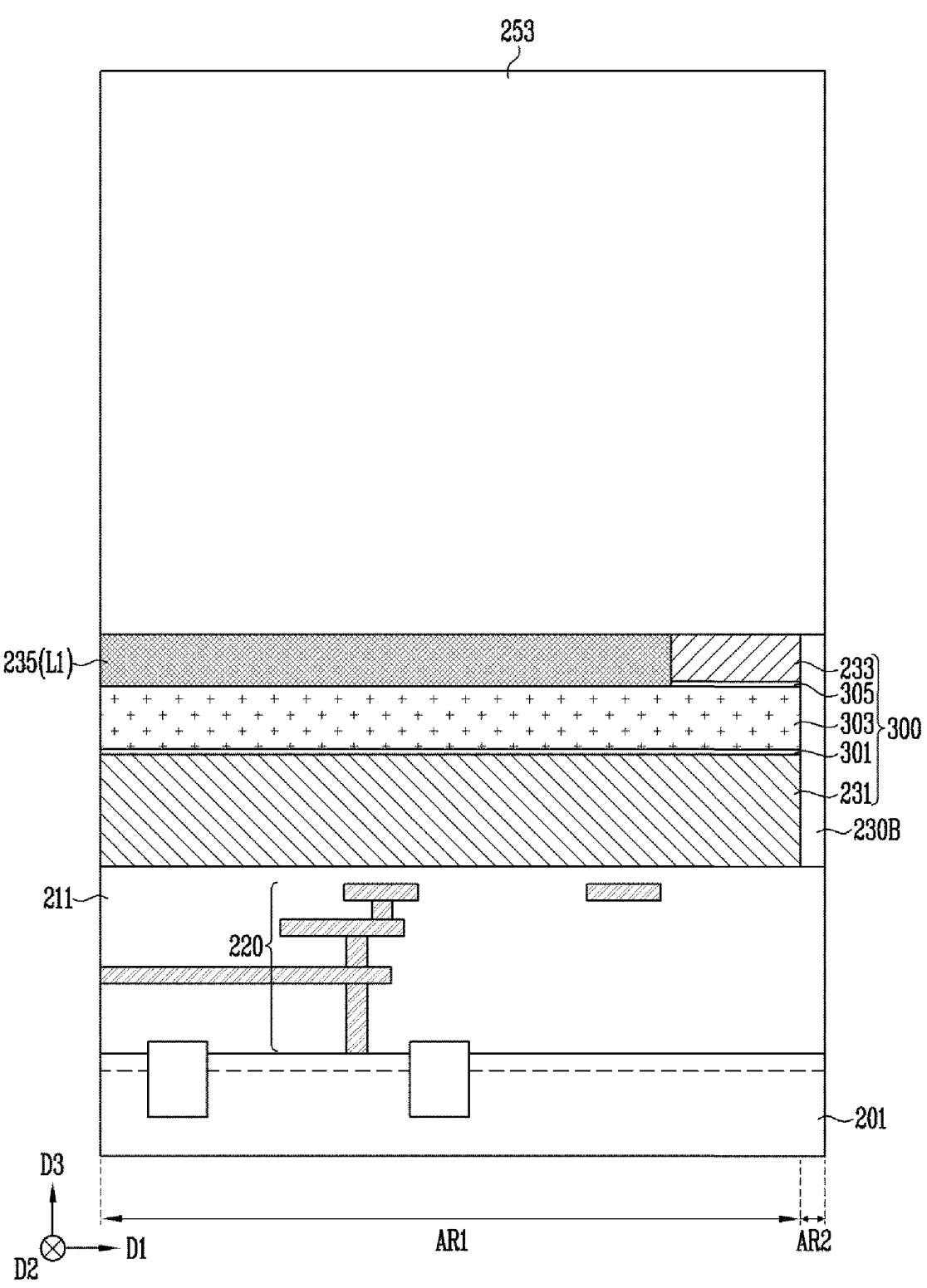
Figure 14C:
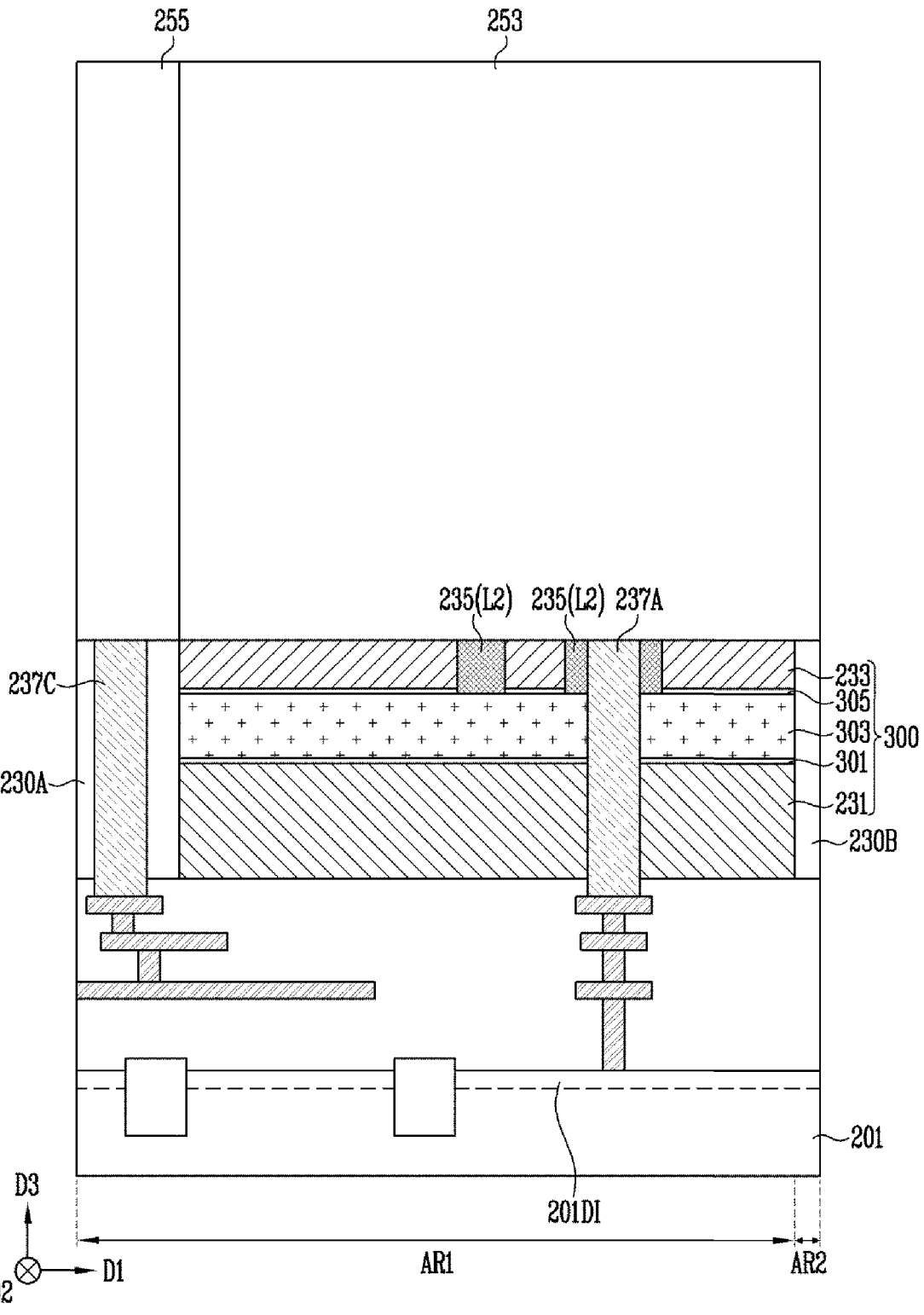
Figure 14D:
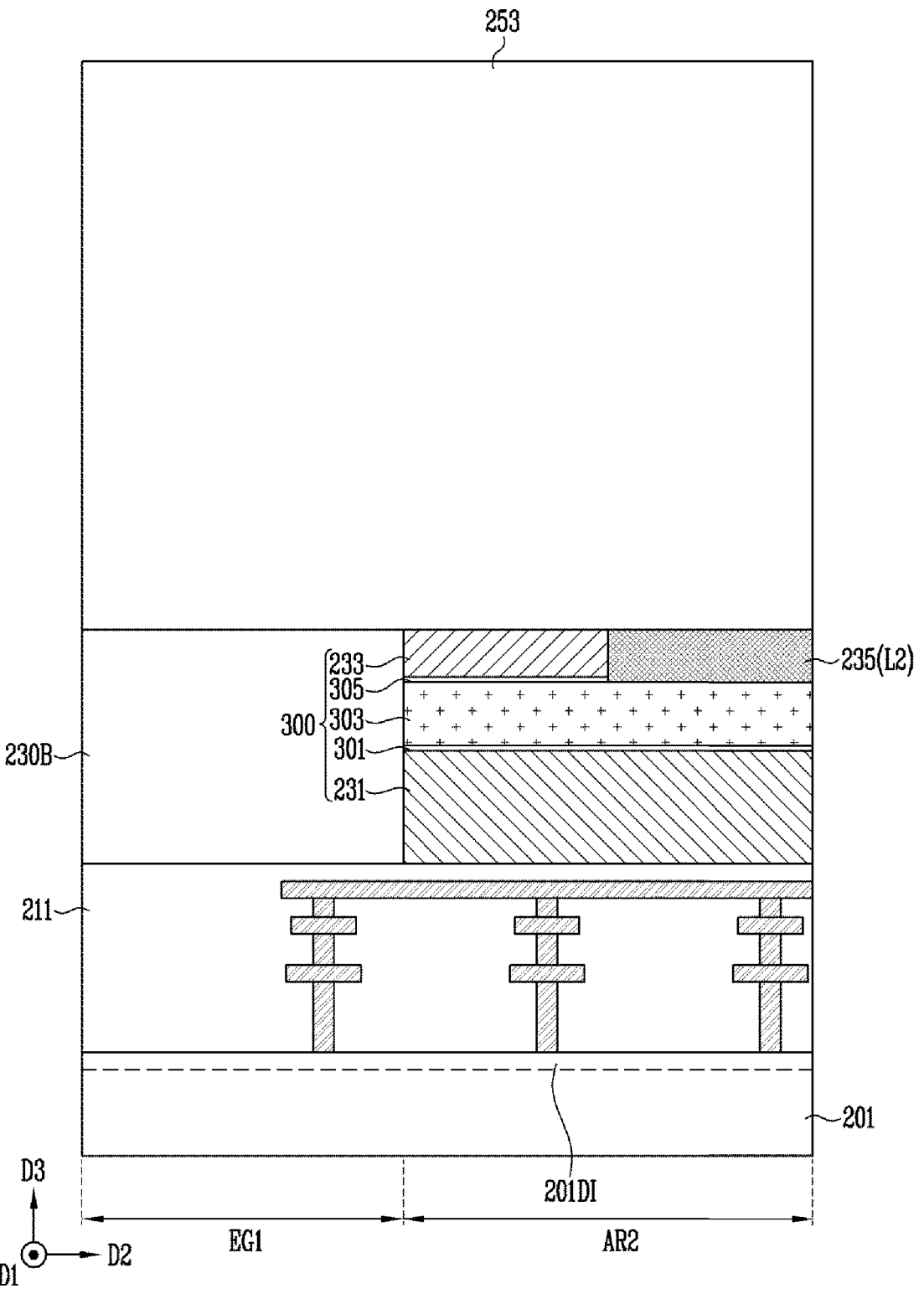

Referring to FIGS. 15A to 15C, a plurality of preliminary slits 261A may be formed, which penetrate the preliminary gate stack structure PST, shown in FIG. 14A. The plurality of preliminary slits 261A may overlap with the plurality of first line parts L1 of the metal pattern 235. Because the metal pattern 235 has a high etching selectivity with respect to the preliminary gate stack structure PST, the plurality of first line parts L1 may be used as an etch stop layer. Accordingly, a phenomenon in which each preliminary slit 261A is formed excessively deep may be reduced. The preliminary slit 261A may extend in the first direction D1 and may be formed to be shorter in the first direction D1 than the first line part L1.

Subsequently, the plurality of second material layers 323 of the preliminary gate stack structure PST, shown in FIG. 14A, may be selectively removed through the preliminary slit 261A. Accordingly, a plurality of gate regions 331 may be opened between the first material layers 321 that are adjacent to each other in the third direction D3.

The process sectional views shown in FIGS. 16A, 16B, 16C, 16D, and 16E may respectively correspond to the sectional views that are taken along the lines Ia-Ia', Ib-Ib', Ic-Ic', Id-Id', and Ie-Ie', shown in FIG. 4A.

Referring to FIGS. 16A to 16E, a plurality of conductive patterns CP may be respectively formed in the plurality of gate regions 331, shown in FIGS. 15A and 15B. The plurality of remaining first material layers may be defined as a plurality of interlayer insulating layers ILD.

As described with reference to FIGS. 15A to 15C and 16A to 16E, the plurality of second material layers 323 may be replaced with the plurality of conductive patterns CP through the preliminary slit 261A, thereby defining a gate stack structure GST. After the gate stack structure GST is formed, portions of the plurality of exposed first line parts L1 of the metal pattern 235 may be removed through the preliminary slit 261A shown in FIGS. 15A to 15C. Accordingly, a slit 261 may be defined, which penetrates the plurality of first line parts L1.

Subsequently, a spacer insulating layer 271 may be formed on a sidewall of the slit 261. Subsequently, an etch process, such as an etch-back process, may be performed such that the sacrificial layer 303 shown in FIGS. 15A to 15C is exposed. Subsequently, an etching process of selectively removing a partial region of the sacrificial layer 303, shown in FIGS. 15A to 15C, may be performed. Accordingly, a partial region of the first protective layer 301 and a partial region of the second protective layer 306, which are shown in FIGS. 15A to 15C, may be exposed. Also, the partial region of the sacrificial layer 301 may be removed to not remain under the gate stack structure GST. The partial region of the sacrificial layer 303 may be removed through an etching process, thereby exposing the memory layer ML shown in FIG. 15A.

The process of etching the partial region of the sacrificial layer 303 may be performed such that the first discharge contact 237A may be protected from the etch process. To this end, the process of etching the partial region of the sacrificial layer 303 may be controlled such that a portion of the sacrificial layer 303 may remain between the first doped semiconductor layer 231 and the second line part L2 of the metal pattern 235 and between a partial region of the first line part L1 that is adjacent to the second line part L2 and the first doped semiconductor layer 231.

Subsequently, a portion of the memory layer ML, which is exposed between the first doped semiconductor layer 231 and the upper semiconductor layer 233, may be removed. The first protective layer 301 and the second protective layer 305, which are shown in FIGS. 15A to 15C, may be removed while the portion of the memory layer ML is removed.

Through the above-described process, a horizontal space 341 may be defined between the first doped semiconductor layer 231 and the upper semiconductor layer 233, and a sidewall of the channel layer CH may be exposed by the horizontal space 341. In addition, the memory layer ML, shown in FIG. 15A, may be isolated into a first memory pattern ML1 and a second memory pattern ML2 by the horizontal space 341.

The process sectional views, shown in FIGS. 17A, 17B, 17C, and 17D, may respectively correspond to the sectional views taken along the lines Ia-Ia', Ib-Ib', Ic-Ic', and Id-Id', shown in FIG. 4A.

Figure 16A:
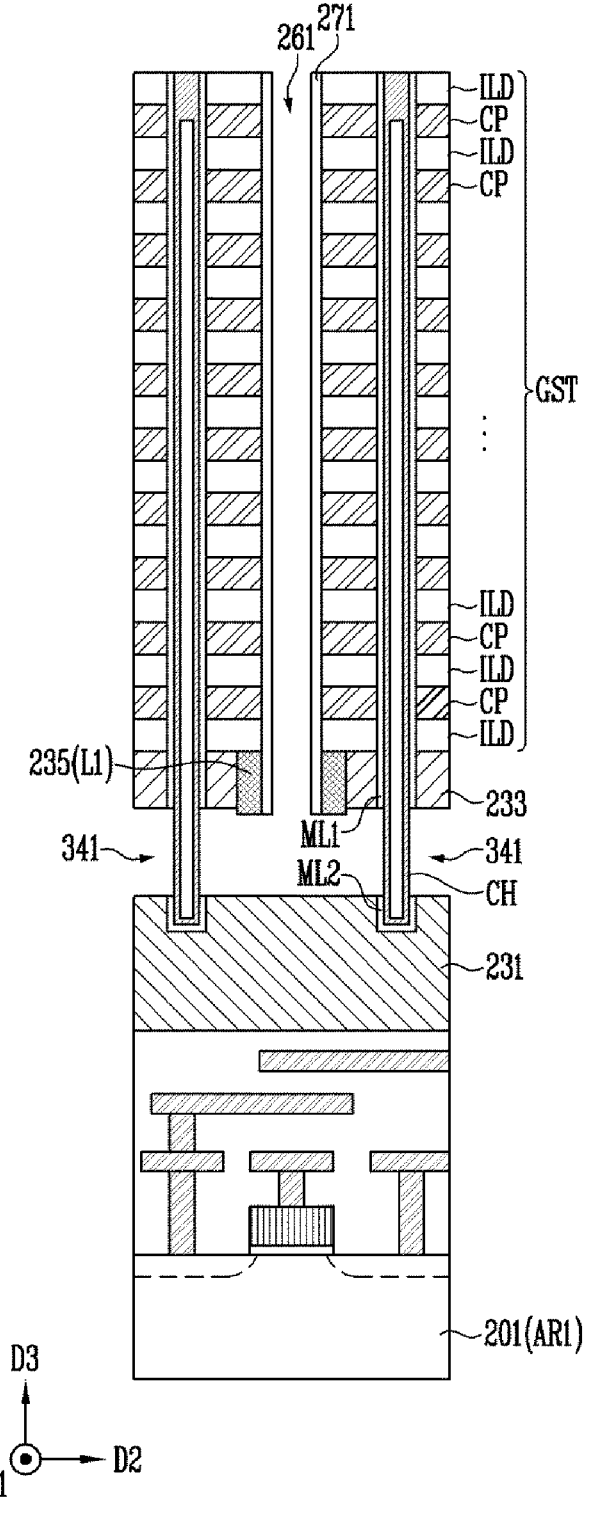
Figure 16B:
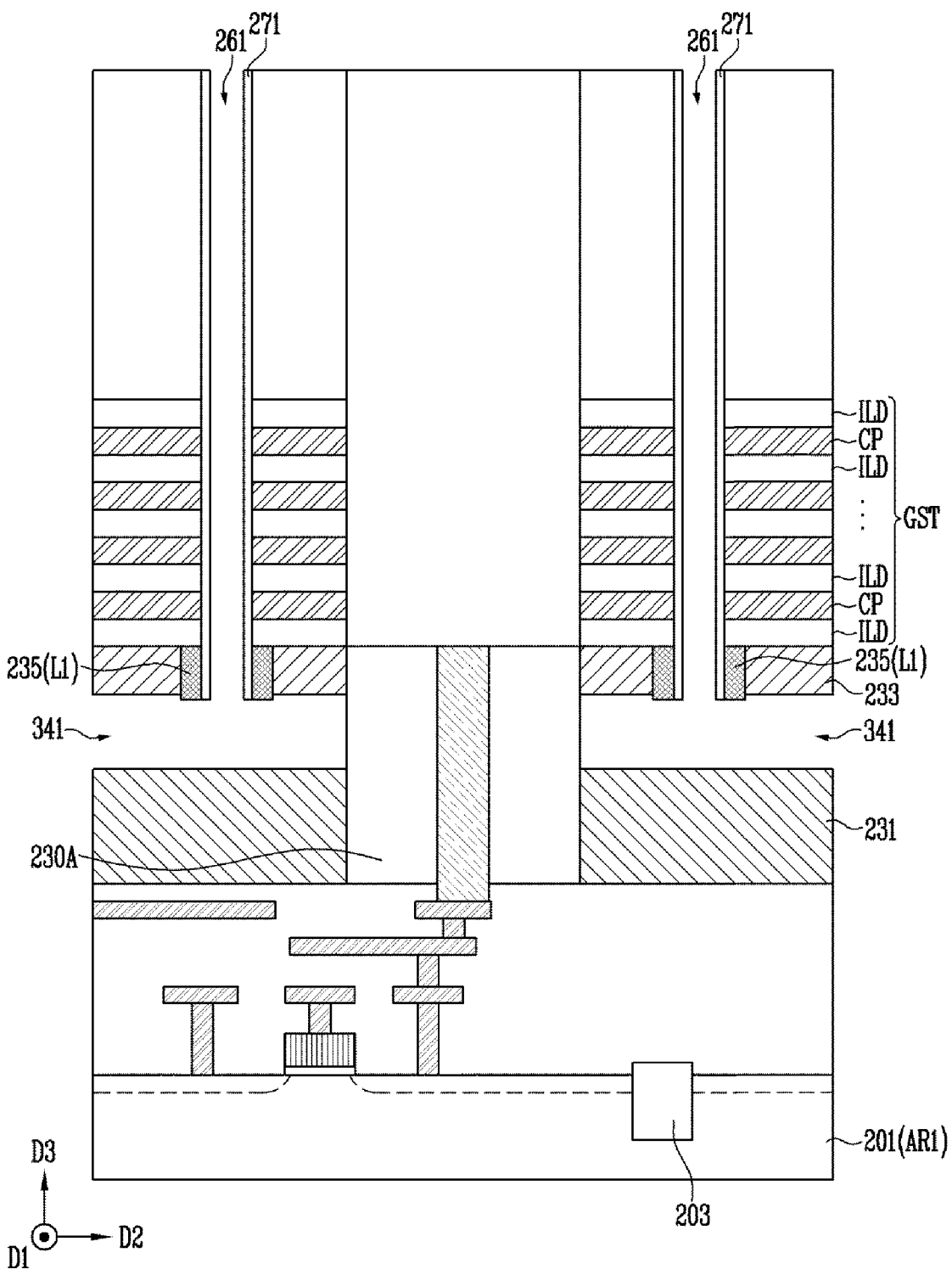
Figure 16C:
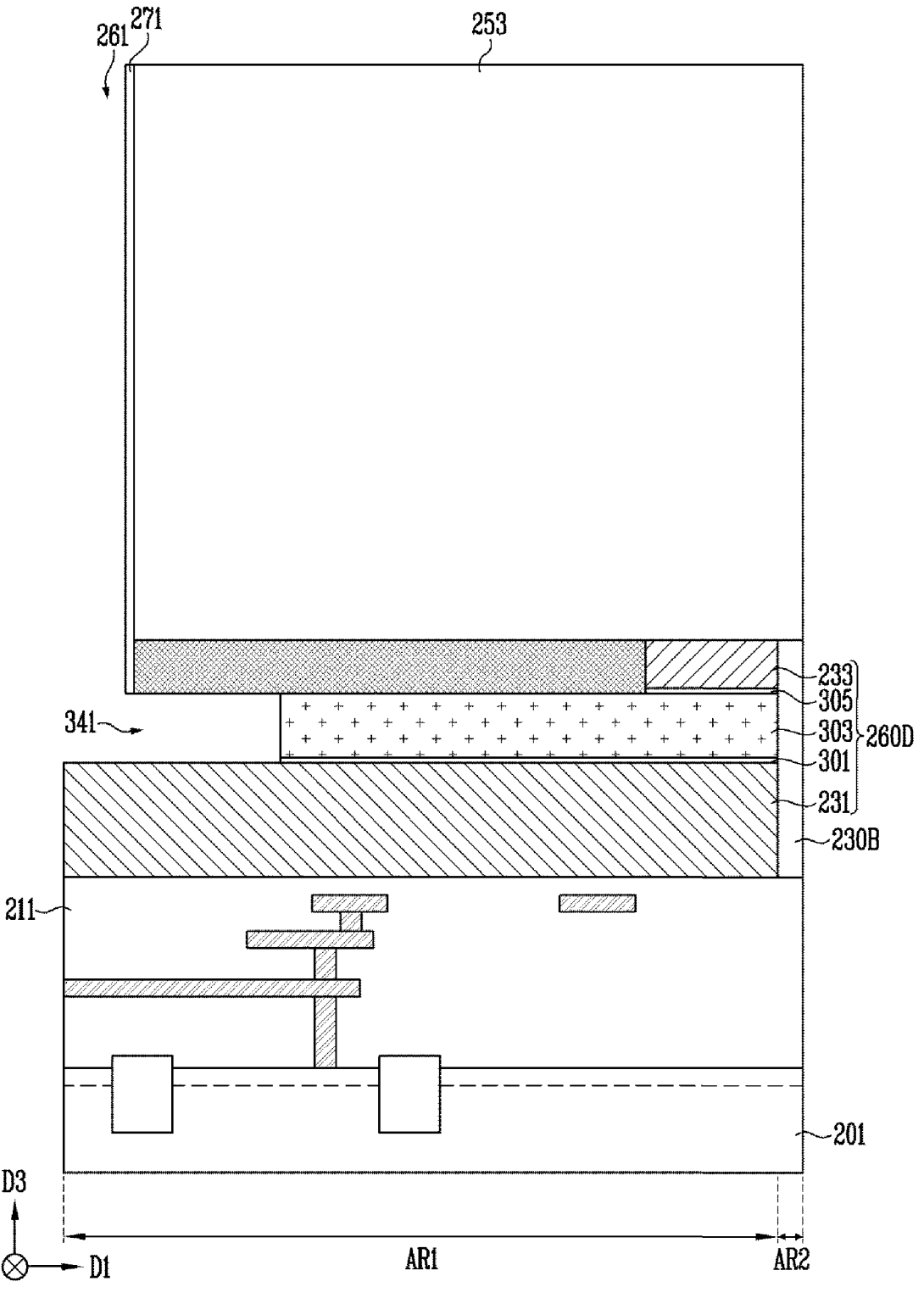
Figure 16D:
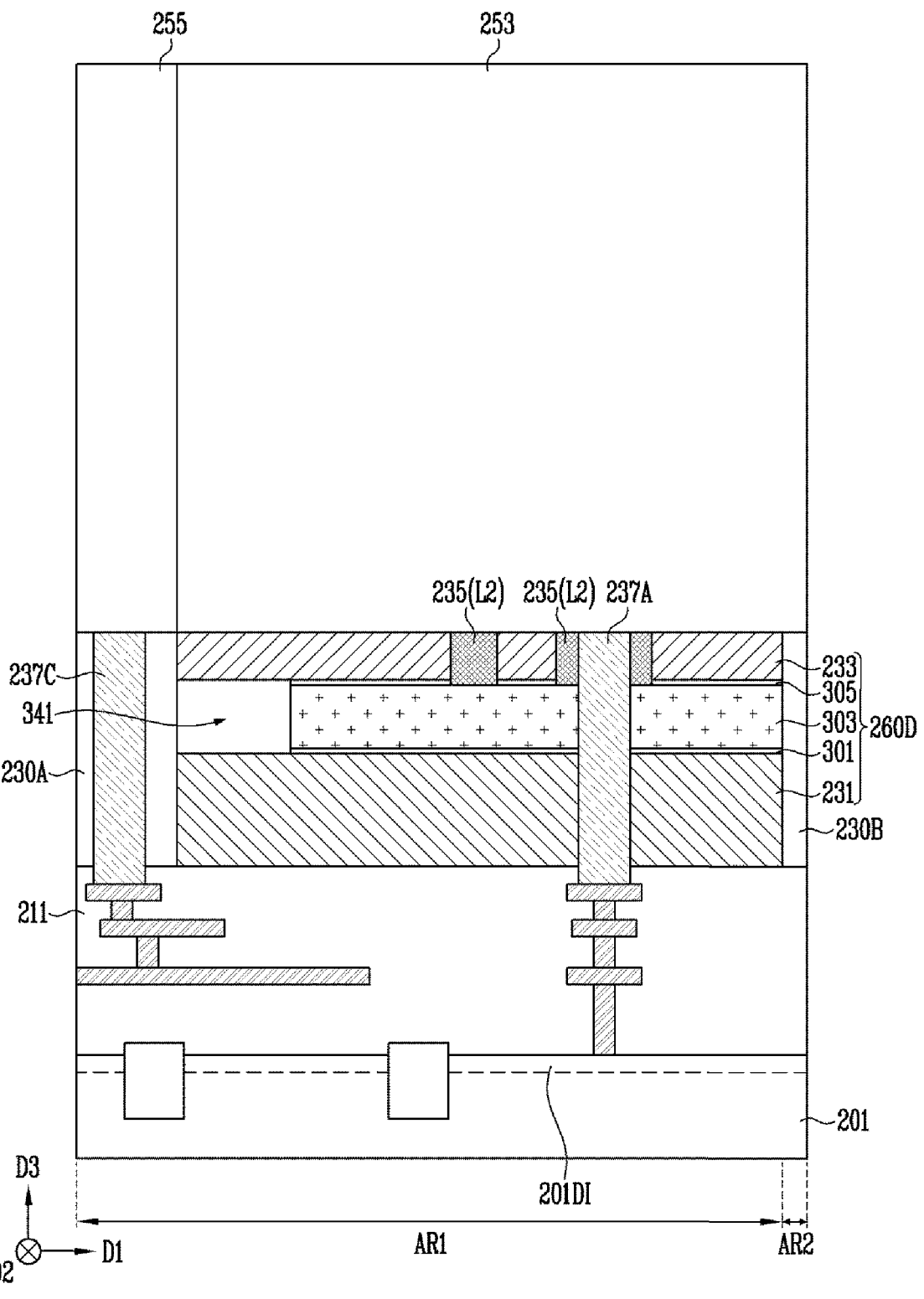
Figure 16E:
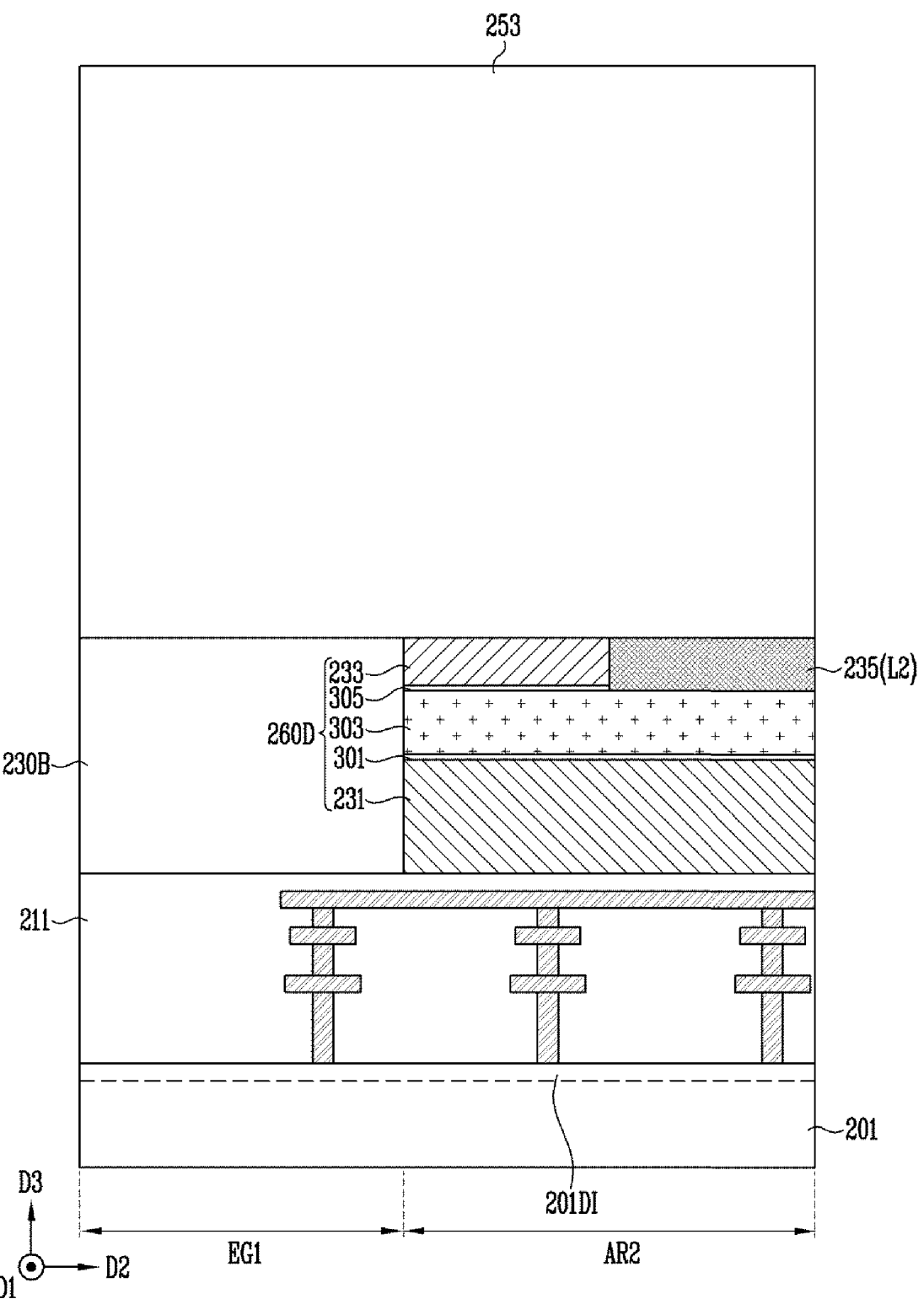
Figure 17A:
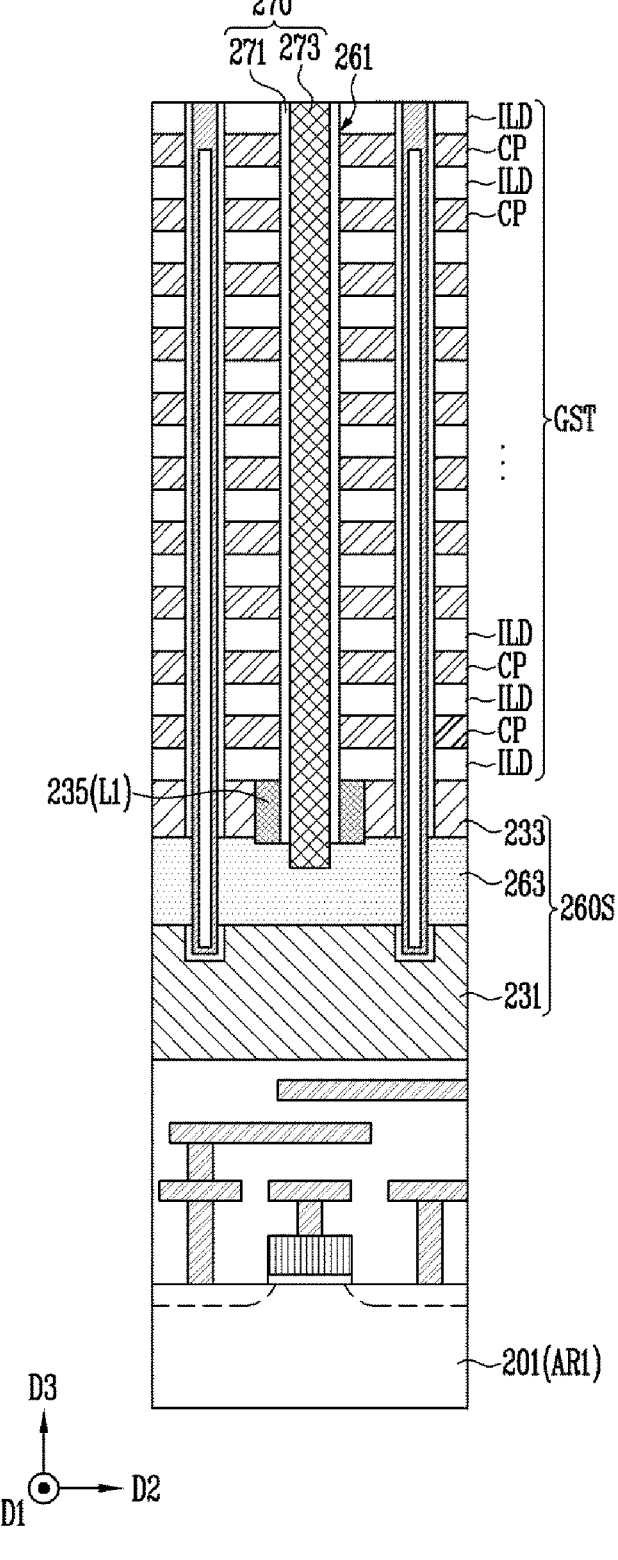
Figure 17B:
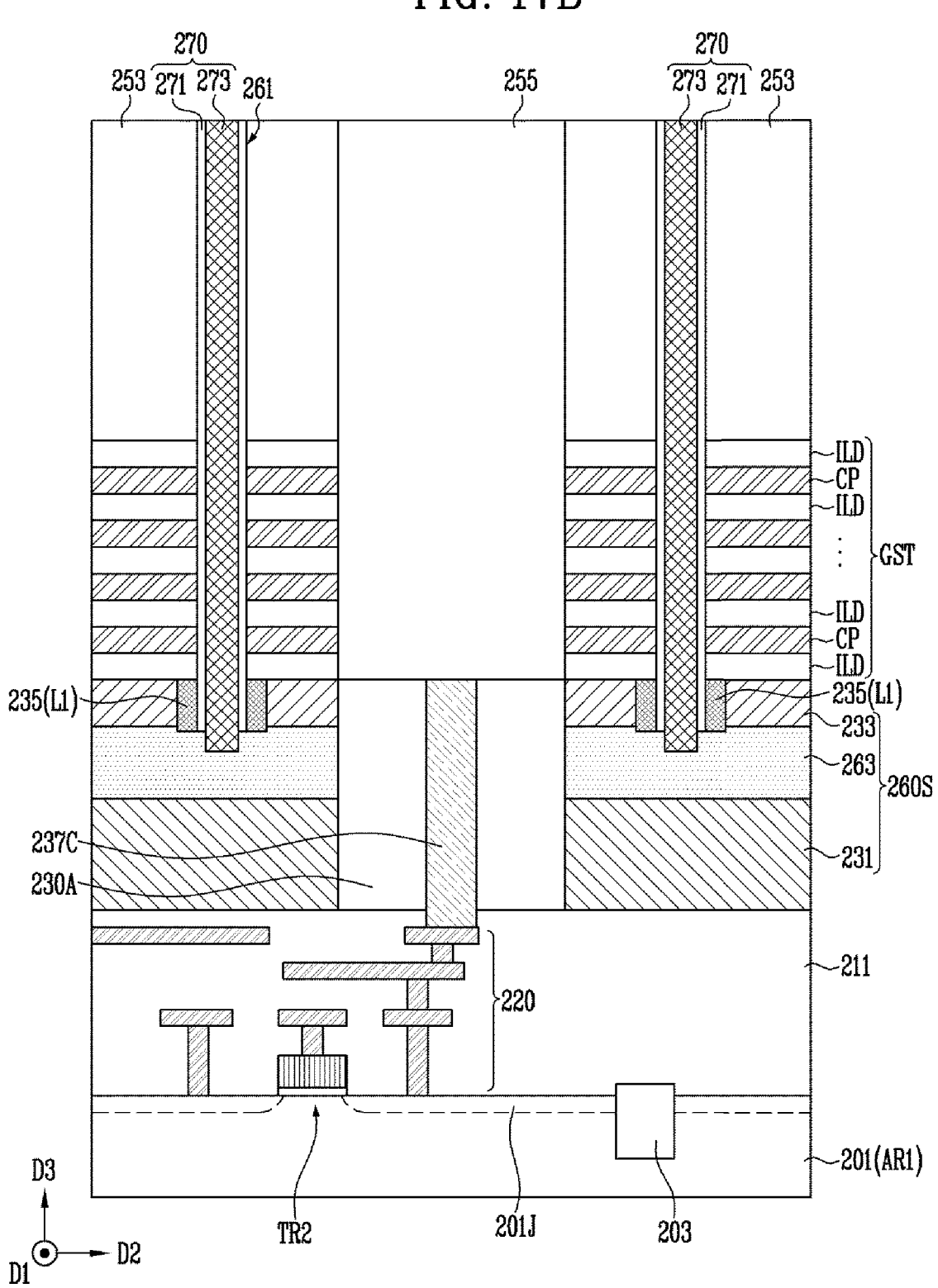
Figure 17C:
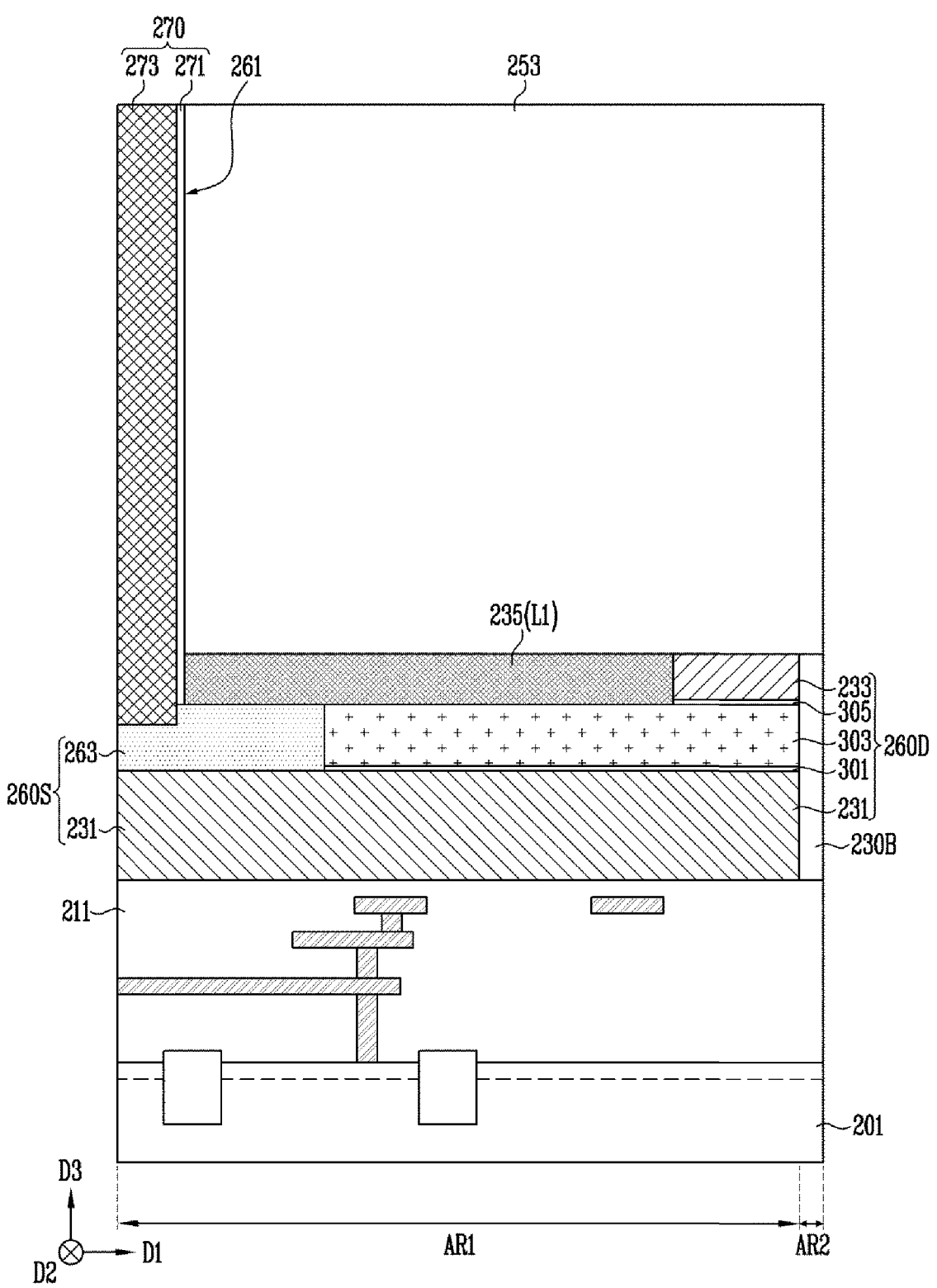
Figure 17D:
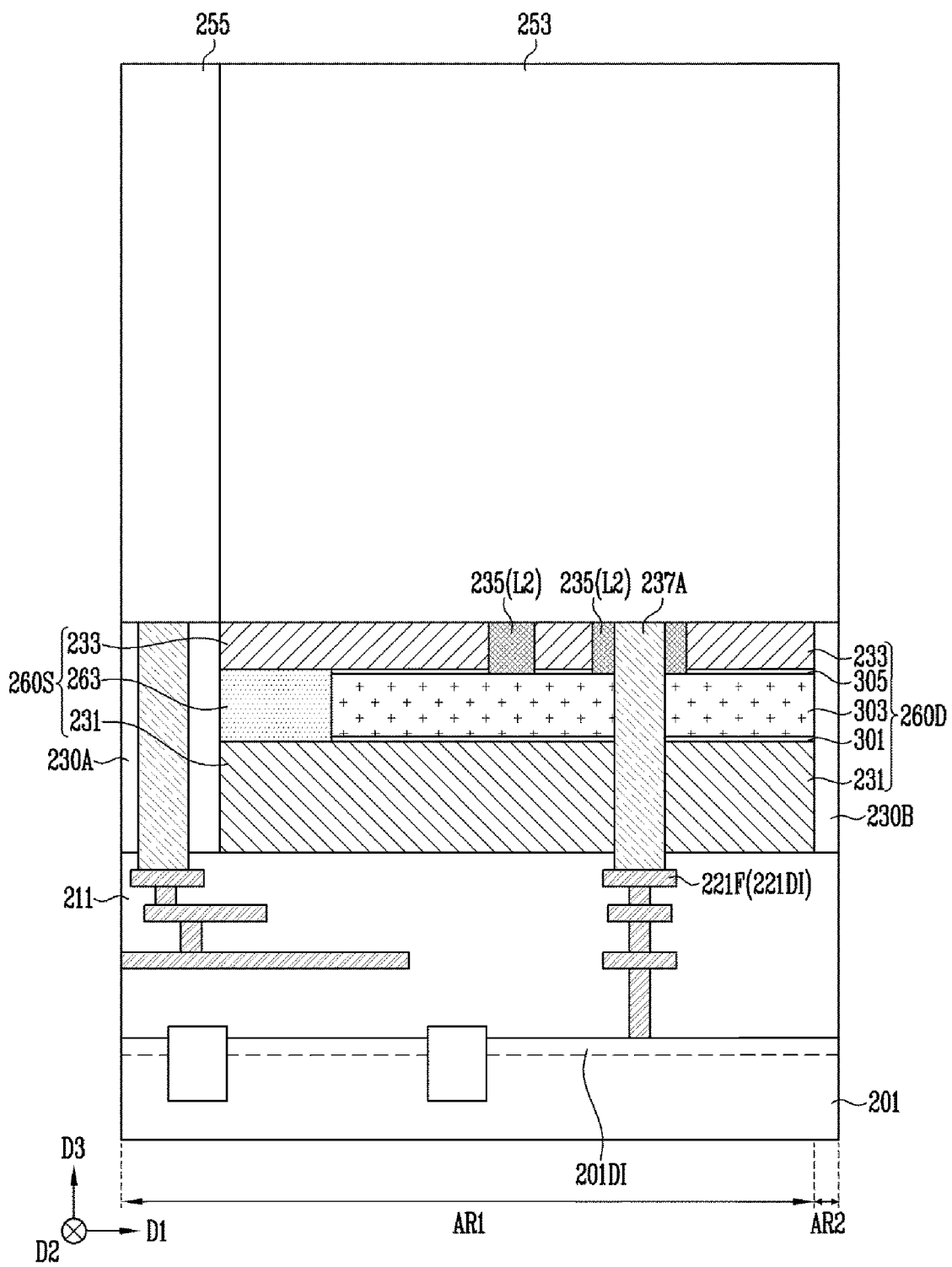

Referring to FIGS. 17A to 17D, a second doped semiconductor layer 263 may be formed in the horizontal space 341, shown in FIGS. 16A to 16D, through the slit 261, shown in FIGS. 16A to 16C. The second doped semiconductor layer 263 may include an impurity of a conductivity type that is different from that of the discharge impurity region 201DI. In an embodiment, the discharge impurity region 201DI may include a p-type impurity, and the second doped semiconductor layer 263 may include a p-type impurity.

As described with reference to FIGS. 16A to 16E and 17A to 17D, the first protective layer 301, the sacrificial layer 303, and the second protective layer 305, which are shown in FIGS. 15A to 15C, may be replaced with the second doped semiconductor layer 263 through the slit 261, thereby defining a source pattern 260S of the source structure, which is connected to the channel layer CH. The first protective layer 301, the sacrificial layer 303, and the second protective layer 305, which remain, may constitute a dummy pattern 260D of the source structure.

Subsequently, a vertical structure 270 may be formed in the slit 262 shown in FIGS. 16A to 16C. The process of forming the vertical structure 270 may include a process of forming the spacer insulating layer 271 on the sidewall of the slit 261 and a process of forming a conductive source contact 273 on the spacer insulating layer 271.

Subsequently, subsequent processes of forming the upper contact 277 shown in FIGS. 5B and 5D, and the like may be performed.

The semiconductor memory device shown in FIGS. 4B and 6 may be formed by using the above-described manufacturing method.

In an embodiment, the manufacturing method of the semiconductor memory device, shown in FIGS. 4B and 6, may include the same processes as described with reference to FIGS. 7A to 7E.

The manufacturing method of the semiconductor memory device shown in FIGS. 4B and 6 may include a process that is similar to that of forming the metal pattern 235, which is described with reference to FIGS. 8A to 8E. Referring to FIGS. 4B and 6, the metal pattern 235' may further include the third line part L3 that overlaps with the chip edge region EG1 of the semiconductor substrate 201, in addition to the plurality of first line parts L1 and the second line part L2. In addition, the second line part L2 may extend to be connected to the third line part L3. The trench 315T may be formed corresponding to the shape of the metal pattern 235'.

The manufacturing method of the semiconductor memory device shown in FIGS. 4B and 6 may include the processes of forming the lower contact and the first discharge contact, which are described with reference to FIGS. 9, 10A, and 10B. However, the second discharge contact 237B shown in FIGS. 4B and 6 may be formed while the lower contact and the first discharge contact are formed. As described with reference to FIG. 6, the second discharge contact 237B may penetrate the third line part L3 and may be connected to the discharge impurity region 201DI of the chip edge region EG1.

The manufacturing method of the semiconductor memory device shown in FIGS. 4B and 6 may include the processes described with reference to FIGS. 11A to 11E, 12, 13A to 13D, 14A to 14D, 15A to 15C, 16A to 16E, and 17A to 17D, after the second discharge contact 237B is formed.

FIG. 18 is a block diagram illustrating a configuration of a memory system in accordance with an embodiment of the present disclosure.

Referring to FIG. 18, the memory system 1100 includes a memory device 1120 and a memory controller 1110.

The memory device 1120 may be a multi-chip package configured with a plurality of flash memory chips. The memory device 1120 may include a metal pattern including a first line part extending in a first direction and a second line part which is connected to the first line part and extends in a second direction that intersects with the first line part, and a source structure that has a trench. The metal pattern may be formed in the trench and the source structure may be in contact with a sidewall of the metal pattern. The metal pattern may be connected to a discharge impurity region.

The memory controller 1110 may control the memory device 1120 and may include a Static Random Access Memory (SRAM) 1111, a Central Processing Unit (CPU) 1112, a host interface 1113, an error correction block 1114, and a memory interface 1115. The SRAM 1111 may be used as an operation memory of the CPU 1112, the CPU 1112 may perform overall control operations for data exchange of the memory controller 1110, and the host interface 1113 may include a data exchange protocol for a host connected with the memory system 1100. The error correction block 1114 may detect an error that is included in a data that is read from the memory device 1120 and may correct the detected error. The memory interface 1115 may interface with the memory device 1120. The memory controller 1110 may further include a Read Only Memory (ROM) for storing code data for interfacing with the host, and the like.

The memory system 1100 configured as described above may be a memory card or a Solid State Disk (SSD) in which the memory device 1120 is combined with the controller 1110. For example, when the memory system 1100 is an SSD, the memory controller 1110 may communicated with the outside (e.g., the host) through one of various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer System Interface (SCSI) protocol, an Enhanced Small Disk Interface (ESDI) protocol, and an Integrated Drive Electronics (IDE) protocol.

FIG. 19 is a block diagram illustrating a configuration of a computing system in accordance with an embodiment of the present disclosure.

Referring to FIG. 19, the computing system 1200 may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, an image processor, a mobile D-RAM, and the like may be further included.

The memory system 1210 may be configured with a memory device 1212 and a memory controller 1211.

The memory device 1212 may include a metal pattern with a first line part that extends in a first direction and a second line part that is connected to the first line part and extends in a second direction that intersects with the first line part, and a source structure that has a trench. The metal pattern may be formed in the trench and the source structure may be in contact with a sidewall of the metal pattern. The metal pattern may be connected to a discharge impurity region.

The memory controller 1211 may be configured identically to the memory controller 1110 described above with reference to FIG. 18.

In accordance with the present disclosure, a metal pattern including line parts that extend in directions that intersect with each other may be buried in a source structure. Accordingly, the area of the metal pattern in contact with the source structure may be widened, and the discharge path of charges that pass through the metal pattern may be dispersed.

In accordance with the present disclosure, charges accumulated during an etching process may be efficiently discharged through the line parts of the metal pattern, which intersect each other, and thus the stability of a manufacturing process of the semiconductor memory device may be improved.

What is claimed is:

1. A semiconductor memory device comprising:
a semiconductor substrate;
a source structure over the semiconductor substrate;
a memory cell array disposed over the source structure; and
a metal pattern connected to the source structure,
wherein the memory cell array includes a gate stack structure with a cell array region and a contact region extending from the cell array region, and
wherein the metal pattern includes:
a plurality of first line parts buried in the source structure, the plurality of first line parts extending parallel to each other in a first direction; and
a second line part extending in a second direction to intersect with the plurality of first line parts, the second line part connecting the plurality of first line parts to each other, and
wherein the plurality of first line parts is disposed between a side edge of the gate stack structure and the source structure and protrudes farther than the gate stack structure in the first direction, and
wherein the plurality of first line parts is penetrated by a slit and protrudes farther than the slit in the first direction.

2. The semiconductor memory device of claim 1, wherein the source structure has a trench in which the plurality of first line parts and the second line part are formed.

3. The semiconductor memory device of claim 1, wherein the metal pattern further includes a third line part extending parallel to the plurality of first line parts, on the same plane on which the plurality of first line parts are disposed, the third line part being spaced apart from the source structure.

4. The semiconductor memory device of claim 3, wherein the second line part of the metal pattern extends to be connected to the third line part.

5. The semiconductor memory device of claim 3, further comprising a discharge contact penetrating the third line part,
wherein the semiconductor substrate includes a discharge impurity region that is connected to the discharge contact.

6. The semiconductor memory device of claim 1, wherein the semiconductor substrate includes:
a first region overlapping with the source structure;
a second region adjacent to the first region in the first direction and extending from the first region without overlapping with the source structure; and
a first chip edge region and a second chip edge region adjacent to the first region in the second direction and extending from opposite sides of the first region without overlapping with the source structure.

7. The semiconductor memory device of claim 6, wherein the semiconductor substrate further includes a discharge impurity region formed in at least one of the first chip edge region and the second chip edge region.

8. The semiconductor memory device of claim 6, wherein the source structure includes:
a first doped semiconductor layer overlapping with the first region of the semiconductor substrate;
a sacrificial layer disposed on an edge region of the first doped semiconductor layer, which is adjacent to the second region;
a second doped semiconductor layer extending between the first doped semiconductor layer and the memory cell array from a sidewall of the sacrificial layer; and
an upper semiconductor layer disposed on the second doped semiconductor layer, the upper semiconductor layer extending to overlap with the sacrificial layer.

9. The semiconductor memory device of claim 8, wherein the source structure further includes:
a first protective layer disposed between the first doped semiconductor layer and the sacrificial layer; and
a second protective layer disposed between the sacrificial layer and the upper semiconductor layer.

10. The semiconductor memory device of claim 8, wherein each of the first line parts overlaps with the second doped semiconductor layer and the sacrificial layer and has a sidewall that is surrounded by the upper semiconductor layer.

11. The semiconductor memory device of claim 8, wherein the upper semiconductor layer has a trench in which the second line part is formed, and
wherein the second line part overlaps with the sacrificial layer.

12. The semiconductor memory device of claim 1, further comprising a discharge contact penetrating the second line part and the source structure,
wherein the semiconductor substrate includes a discharge impurity region that is connected to the discharge contact.

13. The semiconductor memory device of claim 1, further comprising a plurality of vertical structures disposed on the source structure, the plurality of vertical structures extending in the first direction,
wherein the memory cell array includes:
a plurality of conductive patterns spaced apart from each other in the second direction by each of the plurality of vertical structures, the plurality of conductive patterns stacked to be spaced apart from each other in a third direction that intersects with a top surface of the source structure and forming the gate stack structure;
a plurality of channel layers penetrating the plurality of conductive patterns in the cell array region of the gate stack structure, the plurality of channel layers being in contact with the source structure; and
a memory pattern disposed between each of the plurality of conductive patterns and each of the plurality of channel layers.

14. The semiconductor memory device of claim 13, wherein the plurality of vertical structures extend to the level at which the plurality of first line parts are disposed, and wherein at least one of the plurality of first line parts extends along a sidewall of at least one of the plurality of vertical structures.

15. The semiconductor memory device of claim 13, wherein the source structure includes a source edge region, wherein the source edge region extends in the second direction without overlapping with the plurality of conductive patterns, wherein the second line part is buried in the source structure in the source edge region, and wherein each of the plurality of first line parts includes a portion buried in the source structure in the source edge region.

16. A semiconductor memory device comprising:

a metal pattern including a first line part that extends in a first direction and a second line part that is connected to the first line part, the second line part extending in a second direction that intersects with the first line part;

a source structure with a trench in which the metal pattern is formed, the source structure being in contact with a sidewall of the metal pattern;

a slit defined in the first line part of the metal pattern, the slit extending in the first direction and the slit being spaced apart from the second line part of the metal pattern;

a plurality of conductive patterns stacked to be spaced apart from each other on the source structure at both sides of the slit;

a channel layer penetrating the plurality of conductive patterns, the channel layer being in contact with the source structure; and a memory pattern between each of the conductive patterns and the channel layer.

17. The semiconductor memory device of claim 16, wherein the first line part extends longer in the first direction than the slit.

18. The semiconductor memory device of claim 16, further comprising a discharge contact penetrating the second line part and the source structure, wherein the semiconductor substrate includes a discharge impurity region that is connected to the discharge contact.

19. The semiconductor memory device of claim 16, wherein the semiconductor substrate includes a chip edge region that does not overlap with the source structure, wherein the metal pattern further includes a third line part that overlaps with the chip edge region of the semiconductor substrate, wherein the third line part of the metal pattern extends parallel to the first line part, and wherein the second line part of the metal pattern extends to be connected to the third line part.

20. The semiconductor memory device of claim 19, further comprising a discharge contact penetrating the third line part of the metal pattern, wherein the chip edge region of the semiconductor substrate has a discharge impurity region that is connected to the discharge contact.

* * * * *